US006812623B2

(12) United States Patent
Takeda et al.

(10) Patent No.: US 6,812,623 B2
(45) Date of Patent: Nov. 2, 2004

(54) PIEZOELECTRIC TRANSFORMER

(75) Inventors: Katsu Takeda, Osaka (JP); Hiroshi Nakatsuka, Osaka (JP); Takeshi Yamaguchi, Kanagawa (JP); Kojiro Okuyama, Nara (JP); Katsunori Moritoki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/253,757

(22) Filed: Sep. 23, 2002

(65) Prior Publication Data
US 2003/0137222 A1 Jul. 24, 2003

(30) Foreign Application Priority Data

Sep. 28, 2001 (JP) ........................................ 2001-301093

(51) Int. Cl.[7] .......................... H01L 41/08; H01L 41/04; H01L 41/18; G05F 1/00
(52) U.S. Cl. ........................ 310/359; 310/364; 310/365; 310/366; 310/367; 310/368; 315/224; 315/291; 315/209 PZ; 345/74.1; 345/211; 252/62.9 PZ

(58) Field of Search ................................. 310/359, 364, 310/365, 366, 367, 368; 315/224, 291, 209 PZ, 307, 86; 345/74.1, 211, 87, 52; 252/62.9 PZ

(56) References Cited

U.S. PATENT DOCUMENTS

| | | | |
|---|---|---|---|
| 5,751,092 A | | 5/1998 | Abe ............................ 310/359 |
| 5,903,086 A | * | 5/1999 | Ogiso et al. ................. 310/359 |
| 6,051,915 A | * | 4/2000 | Katsuno et al. ............. 310/359 |
| 6,278,227 B1 | * | 8/2001 | Katsuno et al. ............. 310/359 |

FOREIGN PATENT DOCUMENTS

| | | | | |
|---|---|---|---|---|
| JP | 08046264 A | * | 2/1996 | ......... H01L/41/107 |
| JP | 2850216 | | 10/1996 | ......... H01L/41/107 |
| JP | 3119154 | | 3/1997 | ........... H01L/41/08 |

* cited by examiner

Primary Examiner—Thomas M. Dougherty
Assistant Examiner—J. Aguirrechea
(74) Attorney, Agent, or Firm—RatnerPrestia

(57) ABSTRACT

A compact and high-power piezoelectric transformer is realized by using higher order longitudinal extensional mode vibrations and increasing an effective electromechanical coupling factor by a primary electrode which consists of plural electrodes.

6 Claims, 38 Drawing Sheets

Fig. 3
(1)
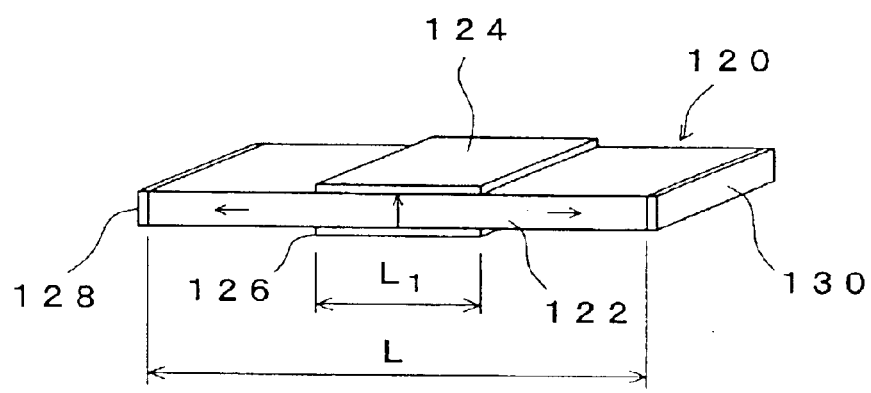
(2)
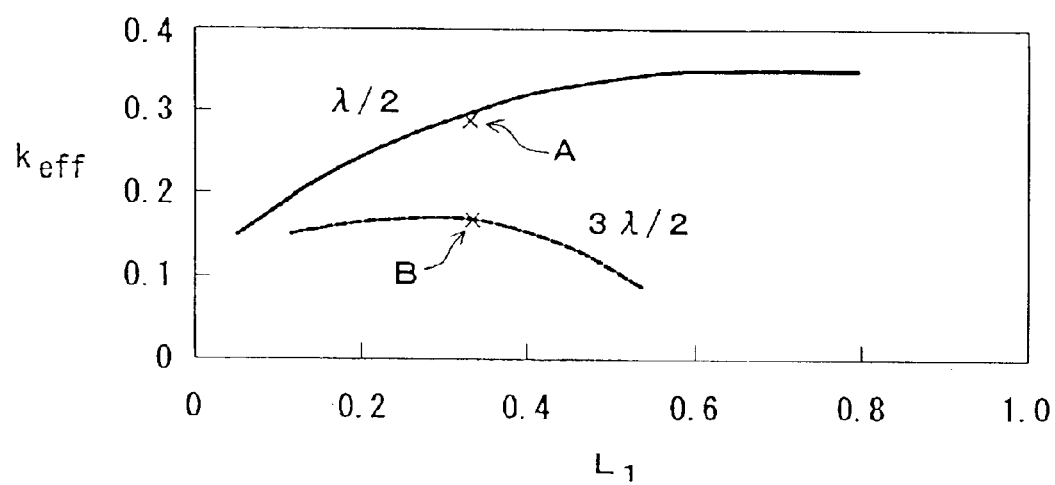

Fig. 4
(1)
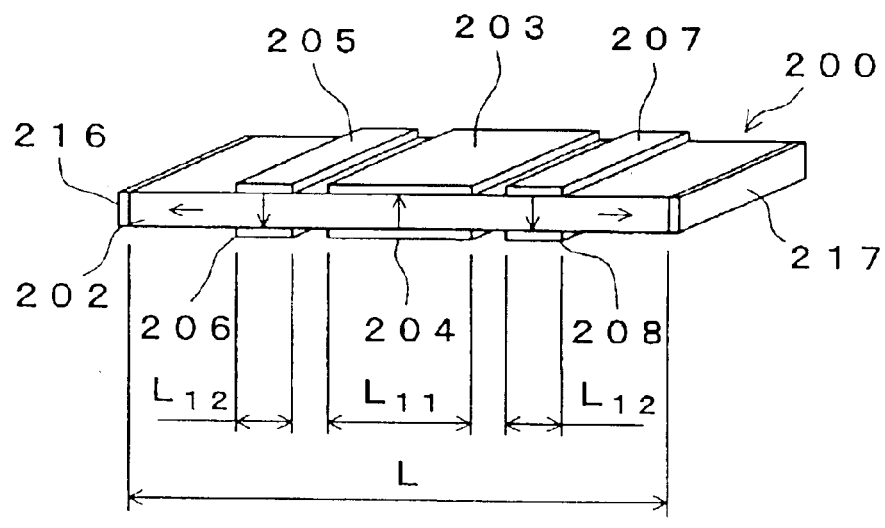
(2)
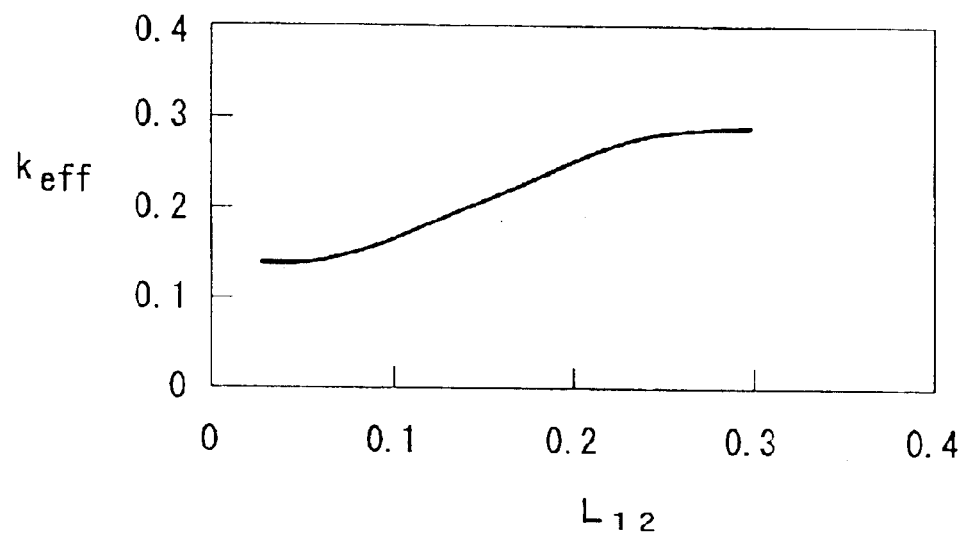

Fig. 5
(1)
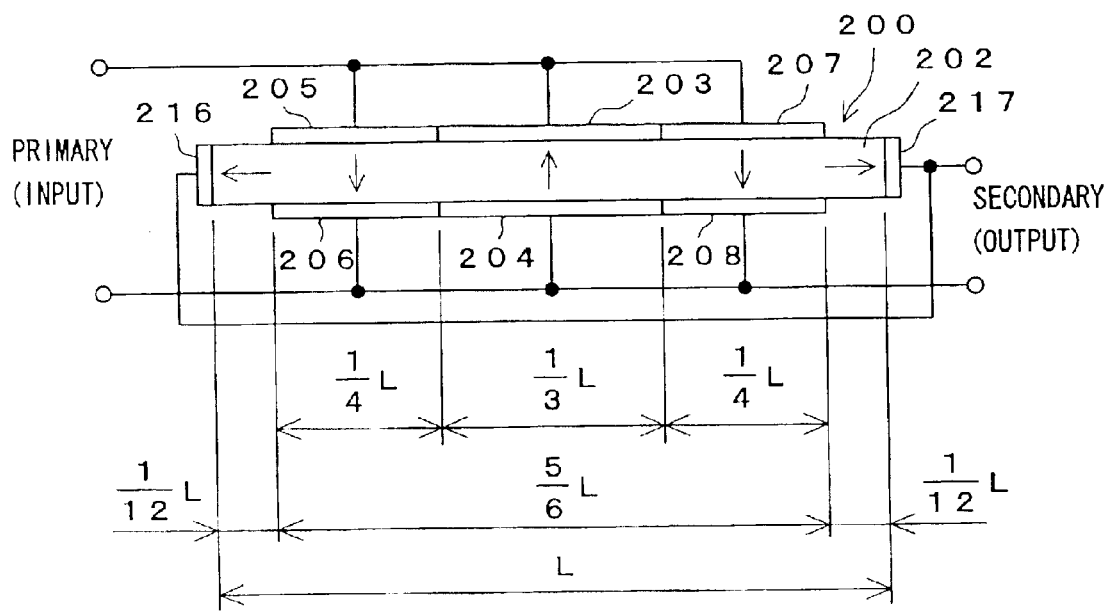
(2)
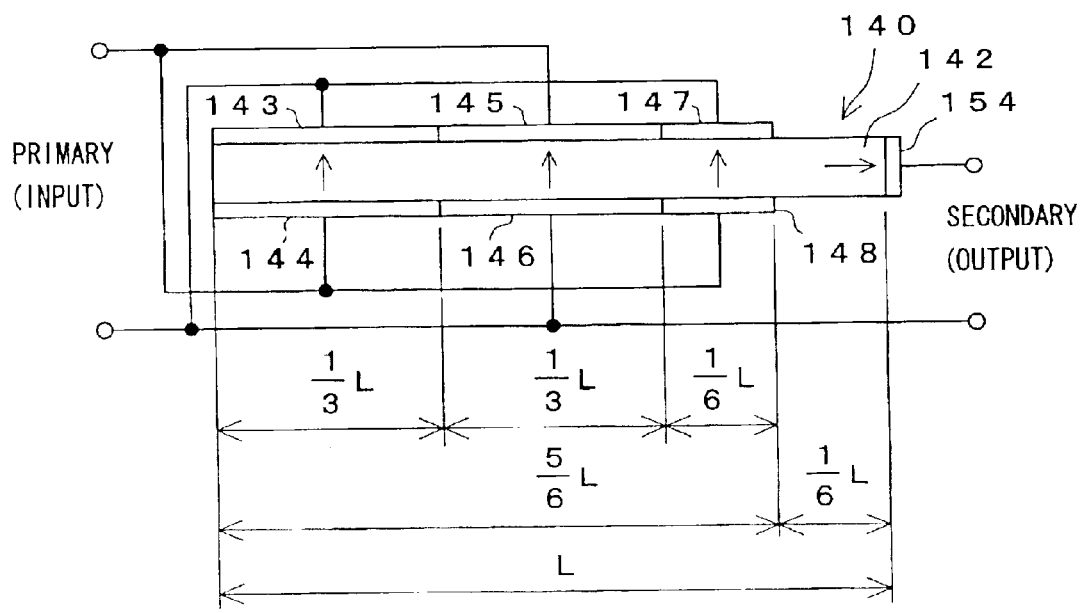

Fig. 12
(1)
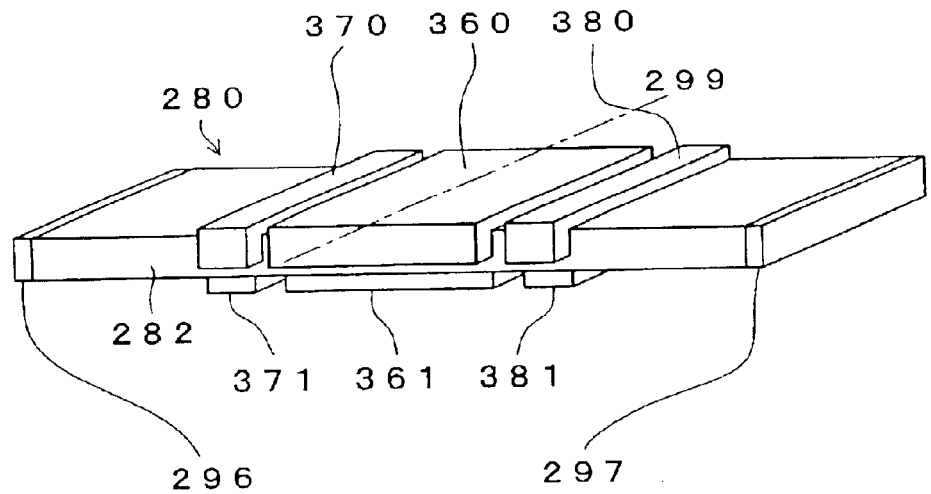
(2)
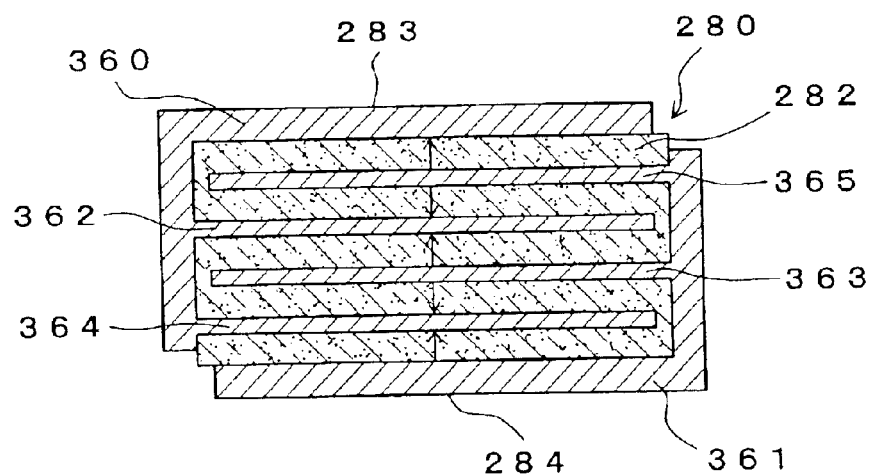
(3)
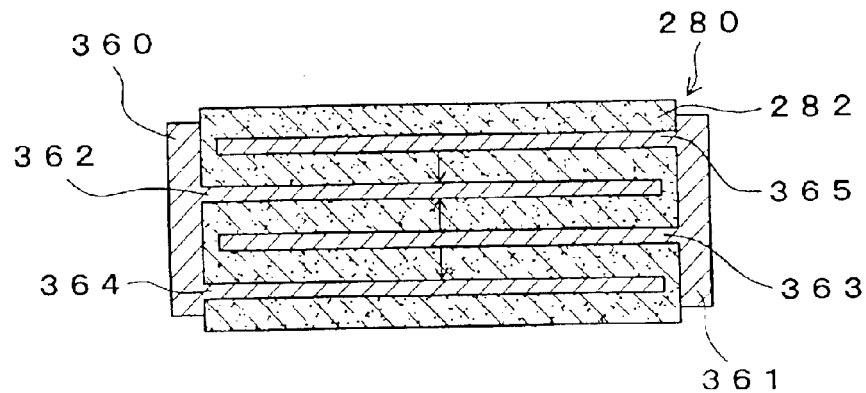

Fig. 32 PRIOR ART
(1)
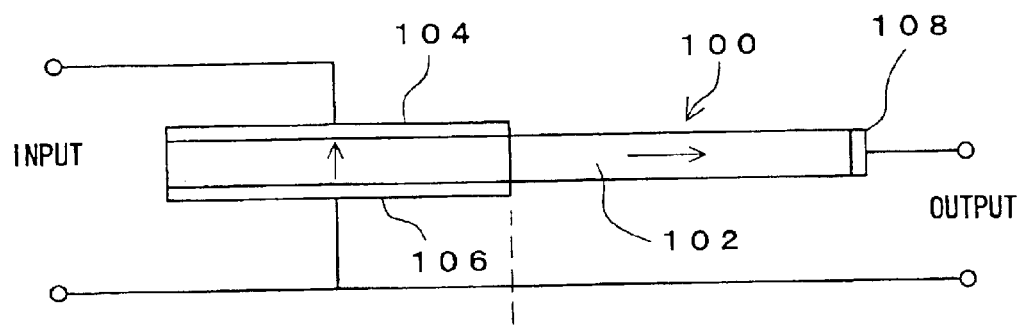
(2)
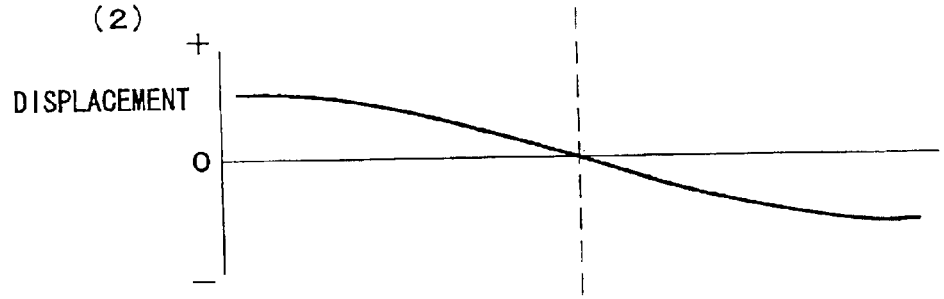
(3)
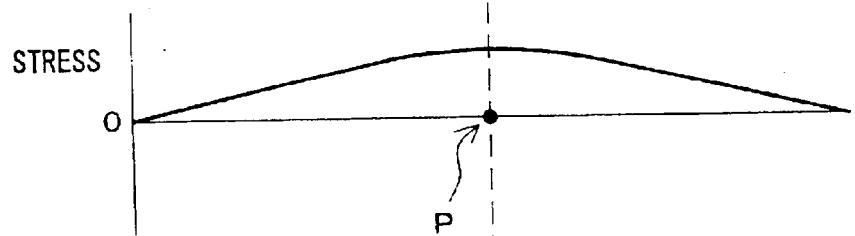
(4)
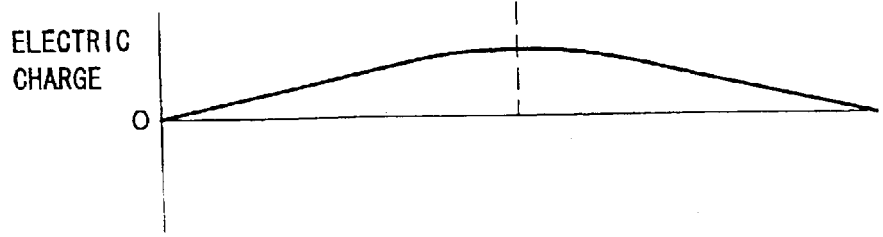

PIEZOELECTRIC TRANSFORMER

BACKGROUND OF THE INVENTION

1. Field of the Invention

The present invention relates to a piezoelectric transformer which transforms the amplitude of an alternating voltage by the piezoelectric effect of a piezoelectric material such as a piezoelectric ceramic.

2. Description of the Related Art

A piezoelectric transformer which was designed for a step-up transformer of a high voltage power supply has not been commercialized because of limited properties of a piezoelectric ceramic material such as breaking strength. However, with the advance of high strength piezoelectric ceramics, attention has been recently paid again to the piezoelectric transformer as the step-up transformer for an inverter of a backlight source of the liquid crystal display (LCD) panel installed on a portable information equipment, in the face of the increasing demand for the thin and compact equipment such as a notebook personal computer and a portable terminal.

In that information equipment, the inverter for the LCD is used, for example, as a power supply for lighting a cold cathode fluorescent lamp (CCFL) which is employed as a backlight source. This inverter must be a kind capable of converting a direct current voltage of about 3V to 12V from a battery or the like to a high frequency high voltage of 1 kVrms when starting lighting of the backlighting elements and about 500 Vrms when constantly lighting the backlighting elements and a frequency of about 60 to 80 kHz. An electromagnetic transformer which is used at present for the inverter for the backlight source satisfies the demand for making the equipment thin as a horizontal type transformer using a core of special shape. However, there is a limit to making the electromagnetic transformer small in size and thin because it needs to have a withstand voltage against the voltage as high as several kVrms. Further, winding loss disadvantageously increases and transform efficiency disadvantageously decreases because a thin copper wire is employed to increase the number of turns for stepping up voltage. Besides, the loss disadvantageously occurs which is caused by the material of the core.

The piezoelectric transformer is produced by forming primary (input) electrodes and secondary (output) electrodes on a piezoelectric ceramic material such as lead zirconate titanate (PZT) or piezoelectric crystal material such as lithium niobate. If an alternating voltage having a frequency near the resonance frequency of the piezoelectric transformer is applied to the primary electrodes to mechanically vibrate the piezoelectric transformer, the mechanical vibrations are transformed to a voltage by the piezoelectric effect, which makes it possible to obtain a high voltage from the secondary electrodes in accordance with the impedance ratio between the primary and secondary electrodes. Thus, the piezoelectric transformer can be made smaller in size and thinner than the electromagnetic transformer and can achieve high transform efficiency.

A conventional piezoelectric transformer will next be described with reference to the drawings.

FIG. 31 is a perspective view of a conventional piezoelectric transformer 100. The piezoelectric transformer 100 includes an electrode 104 and an electrode 106 serving as primary (input) electrodes which are formed opposed to each other on almost the left halves of main surfaces of a rectangular plate 102 made of a piezoelectric material perpendicular to the thickness direction thereof, and an electrode 108 serving as a secondary (output) electrode which is formed on one end face of the rectangular plate 102 in the longitudinal direction thereof. If the rectangular plate 102 is made of a piezoelectric ceramic such as lead zirconate titanate (PZT), as indicated by arrows in FIG. 31, the rectangular plate 102 is polarized in advance in the thickness direction thereof on the left half thereof by using the electrodes 104 and 106 and is polarized in advance in the longitudinal direction thereof on the right half thereof by using the electrodes 104, 106 and 108. If an alternating voltage having a frequency near the resonance frequency of the piezoelectric transformer 100 for exciting mechanical vibrations to expand and contract the rectangular plate 102 in the longitudinal direction thereof is applied between the electrodes 104 and 106 (the electrode 106 is a common electrode), the longitudinal extensional vibrations are excited in the piezoelectric transformer 100. These mechanical vibrations are transformed to a voltage by the piezoelectric effect. As a result, it is possible to fetch a high voltage between the electrodes 108 and 106 which serve as the secondary electrodes in accordance with the impedance ratio between the electrodes 104 and 106 serving as the primary electrodes, and the electrodes 108 and 106 serving as the secondary electrodes.

FIG. 32(1) is a side view of the piezoelectric transformer 100 shown in FIG. 31. In FIG. 32(1), arrows indicate the directions in which the rectangular plate 102 is polarized in advance. FIG. 32(2) shows the displacement distribution of the piezoelectric transformer 100 in the longitudinal direction thereof at a certain point of time while extensional vibrations of a half wavelength are generated in the piezoelectric transformer 100 in the longitudinal direction thereof. In FIG. 32(2), the horizontal axis indicates the position in the piezoelectric transformer 100 in the longitudinal direction thereof. The vertical axis indicates the displacement of the piezoelectric transformer 100 in the longitudinal direction thereof caused by the mechanical vibration at a certain instance. On the vertical axis, +direction indicates the right displacement of the piezoelectric transformer 100 in the longitudinal direction thereof and direction indicates the left displacement thereof in the longitudinal direction thereof. Further, FIG. 32(3) shows the internal stress distribution in the rectangular plate 102 when the piezoelectric transformer 100 has the displacement distribution shown in FIG. 32(2). FIG. 32(4) shows the vibration-induced electric charge distribution when the piezoelectric transformer 100 has the displacement distribution shown in FIG. 32(2). In FIG. 32(3), the horizontal axis indicates the position in the piezoelectric transformer 100 in the longitudinal direction thereof and the vertical axis indicates the magnitude of the internal stress in compression/expansion direction along the longitudinal direction thereof. In FIG. 32(4), the horizontal axis indicates the position in the piezoelectric transformer 100 in the longitudinal direction thereof and the vertical axis indicates the positive/negative polarity and quantity of the electric charges induced by the vibrations. As is obvious from FIGS. 32(3) and 32(4), in the central portion of the rectangular plate 102, that is, in the portion in which the rectangular plate 102 has a vibration displacement of 0, the rectangular plate 102 has the maximum internal stress and the largest quantity of the induced electric charges. Such a piezoelectric transformer in which the mechanical vibrations of a half wavelength are excited, for example, having the displacement distribution shown in FIG. 32(2) is normally referred to as a "piezoelectric transformer having a λ/2 longitudinal extensional vibration mode (where λ indicates one wavelength)".

Generally, when extremely large strains are caused by the mechanical vibrations in a piezoelectric transformer, the possibility that a piezoelectric transformer will break is high, which leads to a deterioration in reliability. It is, therefore, necessary to hold down the amplitudes of the mechanical vibrations of the piezoelectric transformer as much as possible. Even if the piezoelectric transformer handles high electric power, it is possible to decrease the amplitudes of the mechanical vibrations of the piezoelectric transformer by making the piezoelectric transformer thicker and wider. However, if a space in which the piezoelectric transformer can be arranged is restricted in a system or an equipment into which the piezoelectric transformer is introduced, there is a limit to holding down elastic strains only by its shape.

Furthermore, even if the power which the piezoelectric transformer handles is as low as several watts, the power handled by the piezoelectric transformer per unit volume is large when it is required to further make the piezoelectric transformer small in size, thin and small in height, introducing the piezoelectric transformer into a system such as a portable equipment. As a result, also in this case, as in the case where the piezoelectric transformer handles high power, the piezoelectric transformer which is high in reliability as well as small in size and thin cannot be realized in terms of the mechanical strength thereof.

Moreover, if the rectangular plate of the piezoelectric transformer is made of a piezoelectric ceramic, a part of the piezoelectric transformer in which polarization directions are discontinuous is lower in mechanical strength than a part thereof in which polarization directions are continuous due to the influence of a strain generated while polarizing. In the case of the conventional piezoelectric transformer 100 having a λ/2 longitudinal extensional vibration mode shown in FIG. 31 and FIG. 32(1), a part of the rectangular plate 102 in which a high stress is generated during normal operation (a point P in FIG. 32(3)) almost coincides with a part in which polarization directions are discontinuous (a part near an electrode 108-side end portion of a region of the rectangular plate 102 interposed between the electrodes 104 and 106). Thus, if the power handled by the piezoelectric transformer 100 increases and the amplitudes of the mechanical vibrations increase, then the high stress is generated in the part in which the polarization directions are discontinuous and cracks disadvantageously tend to occur.

Furthermore, even if the rectangular plate 102 is made of piezoelectric monocrystals which does not need the polarizing processing (in this case, arrows in FIGS. 31 and 32(1) indicate the directions of c axis orientations), it is required to change the directions of c axis orientations by laminating elements which are different in the direction of the c axis and conducting a method corresponding to polarization treatment in the case of a piezoelectric ceramic, realizing the piezoelectric transformer having the structure as shown in FIGS. 31 and 32(1). Thus, also in the case of rectangular plate 102 made of piezoelectric monocrystals, as in the case of the rectangular plate 102 made of a piezoelectric ceramic, a part of the rectangular plate 102 in which the directions of the c axis orientations are discontinuous is lower in mechanical strength than a part thereof in which the directions of the c axis orientations are continuous. As a result, if the power handled by the piezoelectric transformer 100 increases and the amplitudes of the mechanical vibrations increases, then the high stress is generated in the part in which the directions of the c axis orientations are discontinuous and cracks disadvantageously tend to occur.

Next, another conventional piezoelectric transformer disclosed in JP Laid-open Patent Publication No. 9-74236 etc. will be described. The piezoelectric transformer, different from the piezoelectric transformer 100 shown in FIG. 31, has a structure in which a part having the highest stress caused by the mechanical vibrations does not coincide with a part in which polarization directions are discontinuous.

FIG. 33 is a perspective view of the piezoelectric transformer 120 having a λ/2 longitudinal extensional vibration mode wherein a part having the maximum stress caused by the mechanical vibrations does not coincide with any part in which the polarization directions are discontinuous. Electrodes 124 and 126 which serve as primary (input) electrodes are formed opposed each other in the thickness direction of the rectangular plate 122 made of a piezoelectric ceramic material at the central portions of two main surfaces thereof perpendicular to the thickness direction thereof. Electrodes 128 and 130 which serve as secondary (output) electrodes are formed opposed each other on two end faces of the rectangular plate 122 in the longitudinal direction thereof. As indicated by arrows in FIG. 33, the rectangular plate 122 is polarized in the thickness direction thereof between the electrodes 124 and 126 serving as the primary electrodes and also is polarized in the longitudinal direction thereof between the primary and secondary electrodes.

FIG. 34(1) is a side view of the piezoelectric transformer 120 shown in FIG. 33. FIG. 34(2) shows the displacement distribution of the piezoelectric transformer 120 in the longitudinal direction thereof at a certain point of time while extensional vibrations of a half wavelength are generated in the piezoelectric transformer 120 in the longitudinal direction. FIG. 34(3) shows the internal stress distribution of the rectangular plate 122 when the piezoelectric transformer 120 has the displacement distribution shown in FIG. 34(2). FIG. 34(4) shows the electric charge distribution induced to the rectangular plate 122 by the vibrations when the piezoelectric transformer 120 has the displacement distribution shown in FIG. 34(2). Arrows shown in FIG. 34(1) indicate polarization directions as those shown in FIG. 33. In FIG. 34(2), the horizontal axis indicates the position in the piezoelectric transformer 120 in the longitudinal direction thereof and the vertical axis indicates the displacement of the piezoelectric transformer 120 in the longitudinal direction thereof caused by a mechanical vibration of the piezoelectric transformer 120 at a certain instance. On the vertical axis, +direction indicates the right displacement of the piezoelectric transformer 120 in the longitudinal direction thereof and −direction indicates the left displacement thereof in the longitudinal direction thereof. In FIG. 34(3), the horizontal axis indicates the position in the piezoelectric transformer 120 in the longitudinal direction thereof and the vertical axis indicates the magnitude of the internal stress in compression/expansion direction along the longitudinal direction thereof. In FIG. 34(4), the horizontal axis indicates the position in the piezoelectric transformer 120 in the longitudinal direction thereof and the vertical axis indicates the positive/negative polarity and quantity of the electric charges induced by the vibrations.

As in the piezoelectric transformer 100 shown in FIG. 31, the λ/2 longitudinal extensional vibration mode is excited in the piezoelectric transformer 120. If an alternating voltage having a frequency near the resonance frequency of the piezoelectric transformer 120 for exciting the mechanical vibrations to expand and contract the rectangular plate 122 in the longitudinal direction thereof is applied between the electrodes 124 and 126 serving as the primary electrodes, with the electrode 126 used as a common electrode, then the mechanical vibrations to expand and contract the rectangular plate 122 in the longitudinal direction thereof which has the displacement distribution shown in FIG. 34(2) was excited on the piezoelectric transformer 120. These mechanical vibrations are transformed to a voltage by the piezoelectric effect. The voltage can be fetched as a high voltage between the electrodes 126 and 128 and between the electrodes 126 and 130 in accordance with the impedance ratio between the primary and secondary electrodes.

As shown in FIGS. 34(1) to 34(4), a part having the highest stress caused by the mechanical vibration (a point P in FIG. 34(3)) does not coincide with any part in which polarization directions are discontinuous (a part near an electrode 128-side end portion of a region of the rectangular plate 122 interposed between the electrodes 124 and 126, and a part near an electrode 130-side end portion of a region of the rectangular plate 122 interposed between the electrodes 124 and 126). Therefore, the piezoelectric transformer 120 has an excellent structure for handling a high power.

However, as the power handled by the piezoelectric transformer 120 per unit volume increases, the amplitudes of the mechanical vibrations increase and the elastic strains increase because the piezoelectric transformer 120 shown in FIG. 34 uses the λ/2 longitudinal extensional vibration mode as in the case of the piezoelectric transformer 100 shown in FIG. 31. In addition, if a space in which the piezoelectric transformer can be arranged is restricted in a system or an equipment into which the piezoelectric transformer 120 is introduced, there is a limit to holding down the elastic strains by its shape.

Furthermore, a method for using the 3λ/2 longitudinal extensional vibration mode is proposed in Japanese Patent No. 2850216 etc. By using this method, the amplitudes of the mechanical vibrations can be decreased, which holds down elastic strains, and the driving frequency can be increased. Thus, the power handled by a piezoelectric transformer for one vibration is reduced and the number of vibrations is increased, which enables the piezoelectric transformer to handle the high power.

The piezoelectric transformer shown in the Japanese Patent No. 2850216 etc. will now be described. FIG. 35 is a perspective view of the piezoelectric transformer 140 having the 3λ/2 longitudinal extensional vibration mode. On a rectangular plate 142 made of piezoelectric ceramic or the like, electrodes 143, 144, 145, 146, 147 and 148 serving as primary (input) electrodes are formed on the two main surfaces of the rectangular plate 142 perpendicular to the thickness direction thereof on a rectangular plate 142 made of piezoelectric ceramic or the like, and an electrode 154 serving as a secondary (output) electrode is formed on one end face of the rectangular plate 142 in the longitudinal direction thereof. Two electrodes of the electrodes 143 and 144, those of the electrodes 145 and 146, and those of the electrodes 147 and 148 are respectively formed to be opposed each other in the thickness direction of the rectangular plate 142. As indicated by arrows shown in FIG. 35, the rectangular plate 142 is polarized in advance in the thickness direction thereof between the primary electrodes using the primary electrodes and is also polarized in advance in the longitudinal direction thereof between the electrodes 147 and 148 serving as the primary electrodes and the electrode 154 serving as the secondary electrode using the electrode 154.

FIG. 36(1) is a side view of the piezoelectric transformer 140 shown in FIG. 35. Arrows shown in FIG. 36(1) indicate polarization directions as those shown in FIG. 35. FIG. 36(2) shows the displacement distribution of the piezoelectric transformer 140 in the longitudinal direction thereof at a certain point of time while extensional vibrations of a 2/3 wavelength are generated in the piezoelectric transformer 140 in the longitudinal direction thereof. FIG. 36(3) shows the internal stress distribution of the rectangular plate 142 when the piezoelectric transformer 140 has the displacement distribution shown in FIG. 36(2). FIG. 36(4) shows the electric charge distribution induced to the rectangular plate 142 by the vibrations when the piezoelectric transformer 140 has the displacement distribution shown in FIG. 36(2). In FIG. 36(2), the horizontal axis indicates the position in the piezoelectric transformer 140 in the longitudinal direction thereof and the vertical axis indicates the displacement of the piezoelectric transformer 140 in the longitudinal direction thereof caused by a mechanical vibration thereof at a certain instance. On the vertical axis, +direction indicates the right displacement of the piezoelectric transformer 140 in the longitudinal direction thereof and −direction indicates the left displacement of the piezoelectric transformer 140 in the longitudinal direction thereof. In FIG. 36(3), the horizontal axis indicates the position in the piezoelectric transformer 140 in the longitudinal direction thereof and the vertical axis indicates the magnitude of internal stress in compression/expansion direction along the longitudinal direction thereof. In FIG. 36(4), the horizontal axis indicates the position in the piezoelectric transformer 140 in the longitudinal direction thereof and the vertical axis indicates the positive/negative polarity and quantity of the electric charges induced by the vibrations.

In the piezoelectric transformer 140, the electrodes 144, 145 and 148 are electrically connected to one another and serve as primary electrodes, and the electrodes 143, 146 and 147 are electrically connected to one another and serve as common electrodes. If an alternating voltage having a frequency near resonance frequency for exciting the mechanical vibrations to expand and contract the rectangular plate 142 in the longitudinal direction thereof is applied between the primary electrodes and the common electrodes of the piezoelectric transformer 140, then the piezoelectric transformer 140 excites the mechanical vibrations to expand and contract the rectangular plate 142 in the longitudinal direction thereof having the displacement distribution shown in FIG. 36(2). The excited mechanical vibrations are transformed to a voltage by the piezoelectric effect. The voltage can be fetched between the electrode 154 serving as the secondary electrode and the common electrodes as a high voltage in accordance with the impedance ratio between the primary and secondary electrodes.

This piezoelectric transformer 140 has the 3λ/2 longitudinal extensional vibration mode. Thus, the amplitudes of the mechanical vibrations can be decreased, which holds down elastic strains, and the driving frequency can be increased. Therefore, the power handled by a piezoelectric transformer for one vibration is reduced and the number of vibrations is increased, which enables the piezoelectric transformer to handle the high power.

However, as in the case of the piezoelectric transformer 100 having the λ/2 longitudinal extensional vibration mode, in the piezoelectric transformer 140 having the 3λ/2 longitudinal extensional vibration mode, a part having the highest stress caused by the mechanical vibrations (point P in FIG. 36(3)) almost coincides with a part in which polarization directions are discontinuous (a part near the electrode 154-side end portion of a region the rectangular plate 142 interposed between the electrodes 147 and 148). Thus, the high stress is generated in the part of the rectangular plate 142 in which the mechanical strength is low and the polarization directions are discontinuous, with the result that cracks disadvantageously tend to occur.

With a view of solving the above-described disadvantages, a piezoelectric transformer will be considered in which the vibrations of the 3λ/2 longitudinal extensional vibration mode are excited and which has the same structure as the piezoelectric transformer 120 (see FIG. 33) having the λ/2 longitudinal extensional vibration mode wherein the part having the highest stress caused by the mechanical vibrations does not coincide with the part in which the polarization directions are discontinuous. FIG. 37(1) is a side view of the piezoelectric transformer 120 shown in FIG. 33. FIG. 37(2) shows the electric charge distribution induced to the rectangular plate 122 at a certain point of time when the vibrations of the 3λ/2 longitudinal extensional vibration mode are excited. FIG. 37(3) shows the displacement distribution of the piezoelectric transformer 120 caused by the mechanical vibration in the longitudinal direction thereof when the electric charge distribution shown in FIG. 37(2) is induced to the rectangular plate 122. In FIG. 37(2), the horizontal axis indicates the position in the piezoelectric transformer 120 in the longitudinal direction thereof and the vertical axis indicates the positive/negative polarity and quantity of the electric charges induced by the vibration. In FIG. 37(3), the horizontal axis indicates the position in the piezoelectric transformer 120 in the longitudinal direction thereof and the vertical axis indicates the displacement of the piezoelectric transformer 120 caused by the mechanical vibrations thereof in the longitudinal direction thereof. On the vertical axis, +direction indicates the right displacement of the piezoelectric transformer 120 in the longitudinal direction thereof and –direction indicates the left displacement of the piezoelectric transformer 120 in the longitudinal direction thereof.

In this case, it is possible to decrease the amplitudes of the mechanical vibrations of the piezoelectric transformer 120 and to hold down elastic strains because the piezoelectric transformer 120 has the 3λ/2 longitudinal extensional vibration mode. Besides, for this piezoelectric transformer 120, the problem that cracks tend to occur can be solved because any part having the highest stress caused by the mechanical vibrations does not coincide with any part in which polarization directions are discontinuous.

However, this piezoelectric transformer also has the following disadvantages. Generally, a piezoelectric transformer transforms electrical energy input into primary electrodes to mechanical energy. The mechanical energy is fetched from a secondary electrode of the piezoelectric transformer as electrical energy. If an effective electromechanical coupling factor $k_{eff}$ which shows the rate at which the piezoelectric member can transform electrical energy applied to the primary electrodes to mechanical energy is high, then the electrical energy can be transformed to the mechanical energy at high rate and the piezoelectric transforms can handle high power per volume. In a λ/2 longitudinal extensional vibration mode, if the thickness and the width of the rectangular plate of the piezoelectric transformer are the same, the larger the sum of the lengths of the primary electrodes of the piezoelectric transformer on the main surface is, the higher the effective electromechanical coupling factor $k_{eff}$ is.

However, in the piezoelectric transformer 120 having the 3λ/2 longitudinal extensional vibration mode as shown in FIG. 37(1), as shown in FIG. 37(3), the maximum amplitude of the mechanical vibrations in the piezoelectric transformer 120 when each length of the electrodes 124 and 126 serving as the primary electrodes is set large enough to exceed the point at which the polarity of the induced electric charges changes as shown by solid line is lowered than that when each length of primary electrodes does not exceed the point at which the polarity of the induced electric charges changes (indicated by one-dot chain lines in FIG. 37(3)), by as much as electric charge cancellation quantities (indicated shaded portions shown in FIG. 37(2)). This means that the effective electromechanical coupling factor $k_{eff}$ which shows the rate of transforming the electrical energy to the mechanical energy at the primary electrodes decreases. As a result, there is the problem that the power handled by the piezoelectric transformer decreases.

Meanwhile, if each length of the electrodes 124 and 126 serving as the primary electrodes of the piezoelectric transformer 120 is set not to exceed the point at which the polarity of the electric charges induced by the vibrations changes as shown in FIG. 38(1) so that electric charges induced by the vibrations do not cancel one another, no electric charge cancellation occurs as shown in FIG. 38(2) and the maximum amplitude of the mechanical vibrations in the piezoelectric transformer 120 is higher than that indicated by a solid line in FIG. 37(3) as shown in FIG. 38(3). However, the lengths of the electrodes 124 and 126 serving as the primary electrodes are limited to the lengths of a half wavelength with respect to that of an elastic wave of 3/2 wavelength excited to the rectangular plate 122, which means that it is impossible to set the effective electromechanical coupling factor $k_{eff}$ high. As a result, the power handled by the piezoelectric transformer 120 is disadvantageously limited.

Moreover, a piezoelectric transformer having a low output impedance is desired. For such a piezoelectric transformer, the current supply ability is high for supplying current to a load such as a cold cathode fluorescent lamp connected to the piezoelectric transformer. A piezoelectric transformer capable of setting a step-up ratio high is also desired. Further, it is desired to realize a piezoelectric transformer having a high driving efficiency. A piezoelectric transformer capable of handling the large power with small strains is also desired. It is further desired to be able to decrease the number of manufacturing steps of manufacturing a piezoelectric transformer and time required to manufacture the piezoelectric transformer. it is also desired to be able to provide a supporter capable of supporting and fixing a piezoelectric transformer without obstructing the vibrations of the piezoelectric transformer and capable of ensuring to connect electrically the Input and output electrodes of the piezoelectric transformer to exterior through one's terminals or the like.

SUMMARY OF THE INVENTION

It is a first object of the present invention to provide a reliable piezoelectric transformer capable of handling high power.

It is a second object of the present invention to provide a piezoelectric transformer having the high electromechanical coupling factor $k_{eff}$.

It is a third object of the present invention to provide a piezoelectric transformer capable of setting a step-up ratio high.

It is a fourth object of the present invention to provide a piezoelectric transformer capable of decreasing the number of manufacturing steps of manufacturing the piezoelectric transformer and reducing time required for the manufacturing.

To attain the above-stated objects, a first piezoelectric transformer according to the present invention comprising: a rectangular plate made of a piezoelectric material; and primary electrodes and secondary electrodes formed on said rectangular plate, wherein a voltage is output from said secondary electrodes by applying an alternating voltage to said primary electrodes to excite mechanical vibrations of a 3/2 wavelength to expand and contract said rectangular plate in a longitudinal direction thereof in said rectangular plate, and wherein said primary electrodes comprise a plurality of electrode pairs, two electrodes of said one of electrode pairs are formed opposed each other on two main surfaces of said rectangular plate perpendicular to a thickness direction of said rectangular plate to interpose said rectangular plate therebetween; and said secondary electrodes comprises a plurality of electrodes.

It is preferable that in the piezoelectric transformer, said primary electrodes comprise:

a first electrode pair formed on a central portion in the longitudinal direction of said rectangular plate; and a second electrode pair and a third electrode pair respectively formed adjacent to said first electrode pair and on one side and on the other side of said first electrode pair in the longitudinal direction of said rectangular plate.

It is preferable that in the piezoelectric transformer, said rectangular plate is made of a piezoelectric ceramic or piezoelectric monocrystals, and polarization directions of the piezoelectric ceramic or c-axis directions of the piezoelectric monocrystals are different between in regions of said rectangular plate interposed between electrodes of said second electrode pair and between those of said third electrode pair and in a region of said rectangular plate interposed between those of said first electrode pair.

It is preferable that in the piezoelectric transformer, said rectangular plate is made of a piezoelectric ceramic or piezoelectric monocrystals, and polarization directions of the piezoelectric ceramic or c-axis directions of the piezoelectric monocrystals are the same among in regions of said rectangular plate interposed between electrodes of said first electrode pair, between those of said second electrode pair, and between those of said third electrode pair.

It is preferable that in the piezoelectric transformer, said secondary electrodes are formed near two end portions in the longitudinal direction of said rectangular plate.

A second piezoelectric transformer according to the present invention comprising:

a rectangular plate made of a piezoelectric material; and primary electrodes and secondary electrodes formed on said rectangular plate, wherein a voltage is output from said secondary electrodes by applying an alternating voltage to said primary electrodes to excite mechanical vibrations of a 3/2 wavelength to expand and contract said rectangular plate in a longitudinal direction thereof in said rectangular plate, and wherein said rectangular plate comprises a plurality of piezoelectric layers layered successively in a thickness direction of said rectangular;

said primary electrodes are provided by layering said plurality of piezoelectric layers and a plurality of electrode layers in the thickness direction of said rectangular plate, said plurality of electrode layers comprising electrodes to provide a plurality of electrode groups in the longitudinal direction of said rectangular plate; and said secondary electrodes are formed near two end portions in the longitudinal direction of said rectangular plate.

It is preferable that in the piezoelectric transformer, said primary electrodes comprise:

a first electrode group formed in a central portion in the longitudinal direction of said rectangular plate; and a second electrode group and a third electrode group respectively formed adjacent to said first electrode group and on one side and on the other side of said first electrode group in the longitudinal direction of said rectangular plate.

It is preferable that in the piezoelectric transformer, end portions of the electrode layers in said rectangular plate are exposed at end faces of said rectangular plate in a width direction of said rectangular plate, and the electrode layers are electrically connected to one another at said end faces.

It is preferable that in the piezoelectric transformer, end portions of the electrode layers in said rectangular plate are exposed at only one end face of said rectangular plate in a width direction of said rectangular plate, and the electrode layers are electrically connected to one another at only said one end face.

It is preferable that in the piezoelectric transformer, each electrode of said primary electrodes formed on a main surface of said rectangular plate perpendicular to the thickness direction of said rectangular plate extends from said main surface to one end face of said rectangular plate in the width direction of said rectangular plate.

It is preferable that in the piezoelectric transformer, said secondary electrodes are formed near two end portions in the longitudinal direction of said rectangular plate, and a length of each electrode of said first electrode pair or group is not less than a third of a length of said rectangular plate in the longitudinal direction of said rectangular plate.

It is preferable that in the piezoelectric transformer, said first, second and third electrode pairs or groups are formed symmetrically with respect to a center line perpendicular to the longitudinal direction of said rectangular plate and equally dividing said rectangular plate in the longitudinal direction of said rectangular plate.

It is preferable that in the piezoelectric transformer, an area of each electrode of said second and third electrode pairs is smaller than an area of each electrode of said first electrode pair. It is preferable that in the piezoelectric transformer, an area of each electrode of said second and third electrode groups is smaller than an area of each electrode of said first electrode group.

It is preferable that in the piezoelectric transformer, a length of each electrode of said second and third electrode pairs is equal to a length of each electrode of said first electrode pair in the width direction of said rectangular plate. It is preferable that in the piezoelectric transformer, and a length of each electrode of said second and third electrode groups is equal to a length of each electrode of said first electrode group in the width direction of said rectangular plate. And it is preferable that in the piezoelectric transformer, the length of each electrode of said second and third electrode pairs is longer than 10% and shorter than 100% of the length of each electrode of said first electrode pair in the longitudinal direction of said rectangular plate. It is preferable that in the piezoelectric transformer, the length of each electrode of said second and third electrode groups is longer than 10% and shorter than 100% of the length of each electrode of said first electrode group in the longitudinal direction of said rectangular plate.

It is preferable that in the piezoelectric transformer, said secondary electrodes are formed near two end portions in the longitudinal direction of said rectangular plate, said rectangular plate is made of a piezoelectric ceramic or piezoelectric monocrystals, and polarization directions of the piezoelectric ceramic or c-axis directions of the piezoelectric monocrystals are the same as the longitudinal direction of said rectangular plate near said secondary electrodes.

It is preferable that in the piezoelectric transformer, said secondary electrodes are formed on a plane on which said primary electrodes are formed.

It is preferable that in the piezoelectric transformer, said secondary electrodes are formed near two end portions in the longitudinal direction of said rectangular plate. It is preferable that the piezoelectric transformer further comprising:

a supporter to fix said piezoelectric transformer at mechanical vibration nodes of said piezoelectric transformer and be made of an electrically conductive material contacting with the electrodes.

A step-up circuit according to the present invention comprising:

the above piezoelectric transformer, an input circuit supplying the alternating voltage to said piezoelectric transformer; and an output circuit providing the output voltage of said piezoelectric transformer.

A light emitting apparatus using a cold cathode fluorescent lamp according to the present invention comprising:

the above piezoelectric transformer, an input circuit supplying the alternating voltage to said piezoelectric transformer; and an output circuit providing the output voltage of said piezoelectric transformer, wherein said output circuit includes said cold cathode fluorescent lamp.

It is preferable that in the step-up circuit and the light emitting apparatus using the cold cathode fluorescent lamp, phases of alternating voltages applied to said plurality of primary electrode pairs, two electrodes of one of said primary electrode pairs are formed opposed each other on two main surfaces of said rectangular plate perpendicular to the thickness direction thereof to interpose said rectangular plate therebetween, differ among said primary electrode pairs.

It is preferable that in the step-up circuit and the light emitting apparatus using the cold cathode fluorescent lamp, said primary electrode pairs comprise:

a first electrode pair formed in a central portion in the longitudinal direction of said rectangular plate; and a second electrode pair and a third electrode pair respectively formed adjacent to said first electrode pair and on one side and on the other side of said first electrode pair in the longitudinal direction of said rectangular plate, the phase of the alternating voltage applied to said first electrode pair differs by 180 degrees from the phases of the alternating voltages applied to said second and third electrode pairs.

A liquid crystal display panel according to the present invention incorporates therein the light emitting apparatus using a cold cathode fluorescent lamp.

An equipment according to the present invention incorporates therein the liquid crystal display panel.

According to the piezoelectric transformer of the present invention, any part in which high internal stresses or strains are generated by the vibrations excited in the piezoelectric transformer does not coincide with any part in which polarization directions are discontinuous in the piezoelectric transformer. Thus, in normal operation, the high stresses or strains are not generated on any part of the piezoelectric transformer in which mechanical strength is low, which enables the piezoelectric transformer to handle a high power. In addition, the piezoelectric transformer having the $3\lambda/2$ longitudinal extensional vibration mode, the amplitudes of the mechanical vibrations can be decreased to hold down elastic strains, and the driving frequency can be increased. Thus, the power handled by the piezoelectric transformer for one vibration can be decreased and the number of vibrations can be increased, which enables the piezoelectric transformer to handle a high power. Besides, the piezoelectric transformer of the present invention is low in secondary impedance. Therefore, the structure of the piezoelectric transformer enables more current to flow in the secondary electrodes.

According to the piezoelectric transformer of the present invention, there are few parts in which the polarization directions are discontinuous. Thus, it is possible to realize a piezoelectric transformer having high mechanical strength and having high reliability. As a result, the piezoelectric transformer of the present invention can handle a high power.

According to the piezoelectric transformer of the present invention, the primary electrodes have multilayer structures in which piezoelectric layers and electrode layers are alternately layered. Thus, the capacity of the primary electrodes can be set large, making it possible to obtain a high step-up ratio.

According to the piezoelectric transformer of the present invention, it can be facilitated to connect the electrodes formed on two main surfaces of the rectangular plate perpendicular to the thickness direction thereof to the electrodes inside of the rectangular plate only on one surface by exposing the electrodes inside of the rectangular plate consisting the primary electrodes to one end face of the rectangular plate in the width direction thereof.

According to the piezoelectric transformer of the present invention, the primary electrodes of the piezoelectric transformer can be electrically connected to exterior terminals on only one end face of the rectangular plate in the width direction thereof, making it possible to reduce the number of the piezoelectric transformer manufacturing steps and reduce manufacturing time.

According to the piezoelectric transformer of the present invention, the electrodes, which sandwich the electrodes formed in the central portions in the longitudinal direction of the rectangular plate are set equal in length. Thus, it is possible to set the impedances of the primary electrodes symmetrically with respect to the center of the rectangular plate and set each impedance of the secondary electrodes equal. Therefore, the loads are provided on two secondary electrodes at the same proportion, making it possible to stably drive the piezoelectric transformer and to suppress the deterioration of the driving efficiency of the piezoelectric transformer.

According to the piezoelectric transformer of the present invention, by forming the secondary electrodes and the primary electrode on the main surface of the rectangular plate perpendicular to the thickness direction thereof, it is possible to decrease the number of manufacturing steps and to reduce manufacturing time.

According to the piezoelectric transformer of the present invention, the piezoelectric transformer is supported and fixed on the nodes of the $3\lambda/2$ longitudinal extensional vibration mode excited in it. At the same time, the electrical connection with the primary electrodes and exterior terminals are also recognized. Thus, the piezoelectric transformer of the present invention is supported and fixed without obstructing the vibrations. In addition, the primary electrodes of the piezoelectric transformer can be ensured to be electrically connected to the exterior terminals.

According to the piezoelectric transformer of the present invention, voltages equal in amplitude and different by 180 degrees in phase can be output from the two secondary electrodes by setting the polarization directions near the secondary electrodes equal in the longitudinal direction of the rectangular plate.

According to the present invention, a flat and compact step-up circuit which is high in circuit efficiency can be recognized compared with the conventional step-up circuit using an conventional electromagnetic transformer.

According to the present invention, a liquid crystal display panel in which other circuit systems are less adversely influenced and which has fewer unnecessary frequency components which do not contribute to the lightening of the cold cathode fluorescent lamp and an equipment incorporating therein the liquid crystal display panel can be recognized.

BRIEF DESCRIPTION OF THE DRAWINGS

Various objects, features and advantages of the present invention will become apparent from preferred embodiments to be described hereinafter with reference to the accompanying drawings, wherein

FIG. 3(1) is a perspective view of a conventional piezoelectric transformer, and FIG. 3(2) is a graph showing a change in an effective electromechanical coupling factor of the piezoelectric transformer of FIG. 3(1) relative to length of one of the primary electrodes thereof, FIG. 4(1) is a perspective view of the piezoelectric transformer of the first embodiment according to the present invention, and FIG. 4(2) is a graph showing a change in an effective electromechanical coupling factor of the piezoelectric transformer of FIG. 4(1) relative to lengths of electrodes out of the primary electrodes thereof;

FIG. 5(1) is a side view of the piezoelectric transformer of the first embodiment according to the present invention, and FIG. 5(2) is a side view of the conventional piezoelectric transformer, which depict the comparison in impedance between the two piezoelectric transformer;

FIG. 12(1) is a perspective view of the piezoelectric transformer of the fifth embodiment according to the present invention, and FIG. 12(2) is a cross-sectional view thereof in the width direction thereof, and FIG. 12(3) is a cross-sectional view of a modified piezoelectric transformer of the fifth embodiment according to the present invention;

FIG. 32(1) is a side view of the piezoelectric transformer of FIG. 31, and FIGS. 32(2), 32(3) and 32(4) show a displacement distribution, a stress distribution and an electric charge distribution of the piezoelectric transformer of FIG. 31, respectively;

DESCRIPTION OF THE PREFERRED EMBODIMENTS

Preferred embodiments according to the present invention will be described hereinafter with reference to the drawings. It is noted that the same reference symbols denote the same elements throughout the drawings.

First Embodiment

Figure 1:
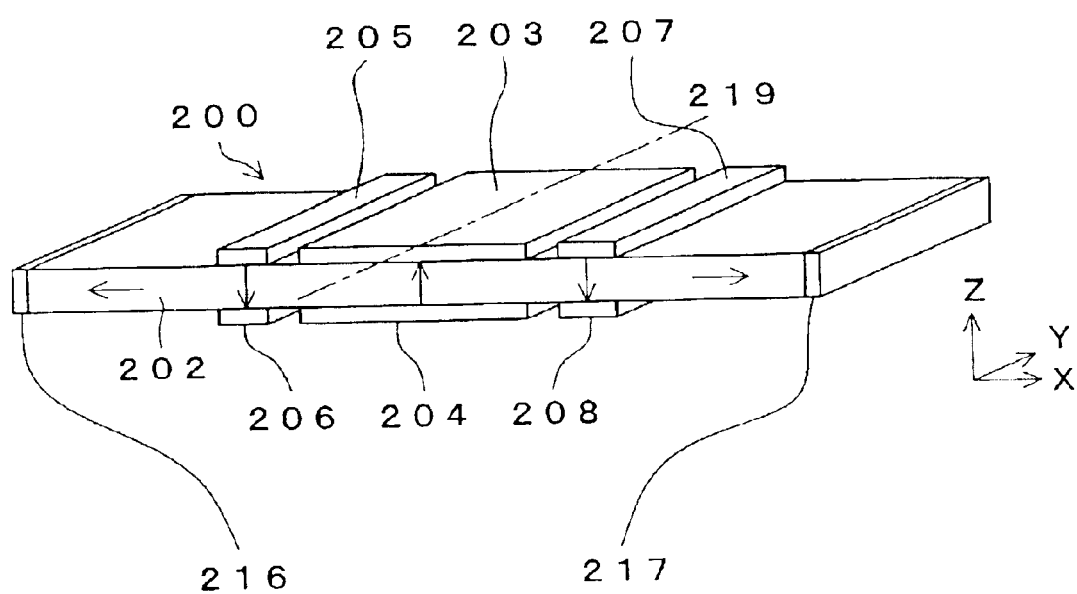
FIG. 1 is a perspective view of a piezoelectric transform of the first embodiment according to the present invention.
Figure 2:
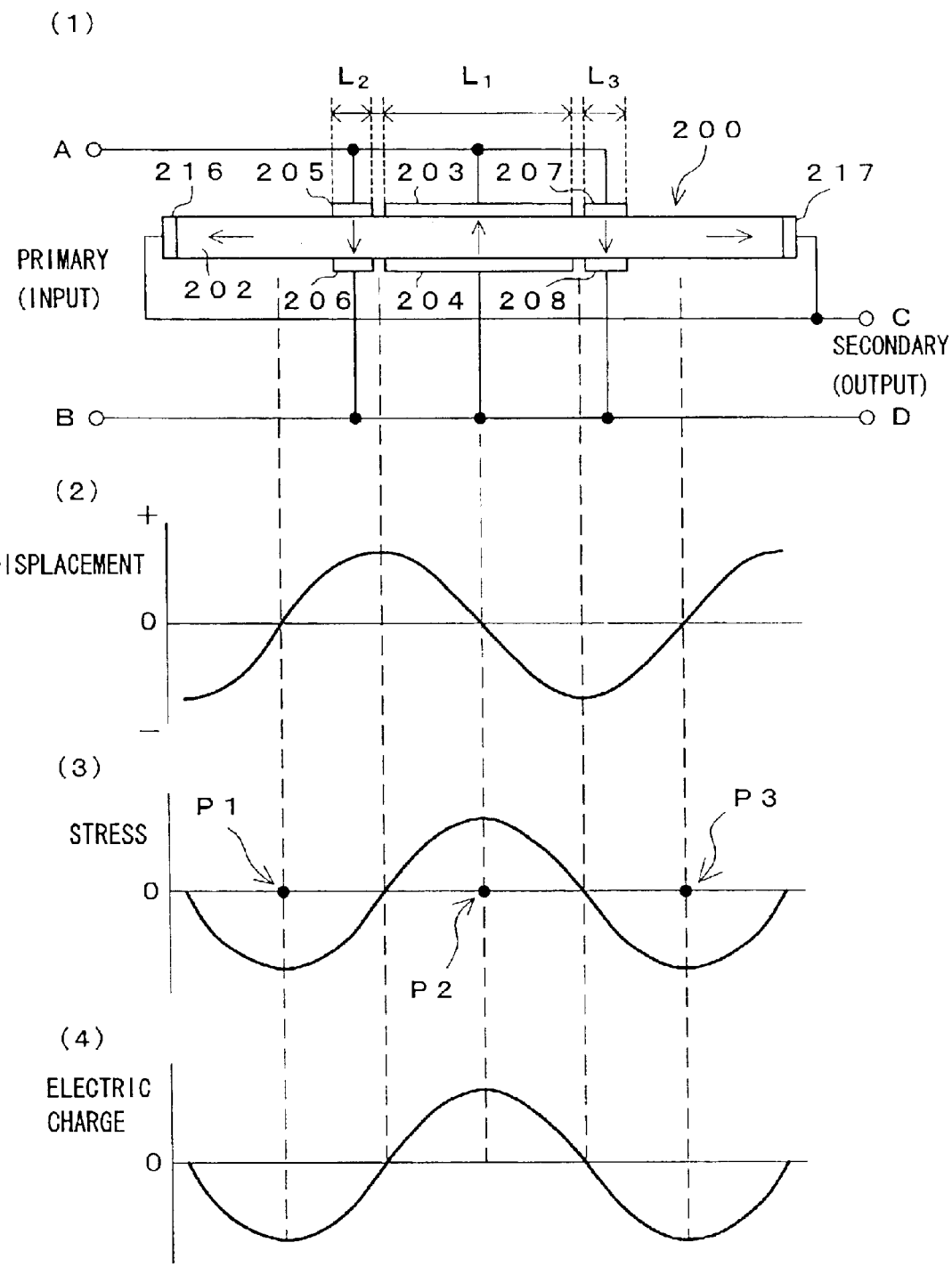
FIG. 2(1) is a side view of the piezoelectric transformer of FIG. 1, and FIGS. 2(2), 2(3) and 2(4) show a displacement distribution, a stress distribution and an electric charge distribution of the piezoelectric transformer of FIG. 1, respectively.

FIG. 1 is a perspective view of a piezoelectric transformer having the 3λ/2 longitudinal extensional vibration mode according to the first embodiment of the present invention. FIG. 2(1) is a side view of the piezoelectric transformer shown in FIG. 1. In FIGS. 1 and 2(1), the piezoelectric transformer 200 includes a rectangular plate 202 made of a piezoelectric material. First, the directions of the rectangular plate 202 will be defined using an orthogonal coordinate system shown in FIG. 1. It is defined that the longitudinal direction, width direction and thickness direction of the rectangular plate 202 indicate respectively an x axis direction, a y axis direction and a z axis direction in the orthogonal coordinate system shown in FIG. 1. This definition applies to all piezoelectric transformers to be described later. Further, in the following description, a length simply means the length of a rectangular plate in the longitudinal direction thereof. A length in the width direction of a rectangular plate and that in the thickness direction thereof mean the width and thickness of the rectangular plate, respectively. In FIGS. 1 and 2(1), primary (input) electrodes are formed on two main surfaces of the rectangular plate 202 perpendicular to the thickness direction thereof. Primary electrodes consisting of electrodes 203, 205 and 207 is formed on one of the two main surfaces and the other primary electrodes consisting of electrodes 204, 206 and 208 are formed on the other main surface. The distances between the electrodes which constitute the primary electrodes formed on the same main surface are preferably in a range of, for example, 1.0 to 1.5 times as large as thickness of the rectangular plate. In addition, the center line of each of the electrodes 203 and 204 substantially coincides with the center line 219 of the rectangular plate 202. Two electrodes of the electrodes 203 and 204, those of the electrodes 205 and 206 and those of the electrodes 207 and 208 are formed to be opposed each other in the thickness direction of the rectangular plate 202, respectively. Each of electrodes 216 and 217 is respectively formed on each of two end faces of the rectangular plate 202 in the longitudinal direction thereof as secondary (output) electrodes. The electrodes 203, 204, 205, 206, 207, 208, 216 and 217 are made of metal such as silver, nickel or gold and formed by a method such as evaporation, sputtering, printing or plating.

In FIGS. 1 and 2(1), arrows indicated on the rectangular plate 202 show polarization directions if the rectangular plate 202 is made of a piezoelectric ceramic such as lead zirconate titanate (PZT), and show the directions of c axis orientations if the rectangular plate 202 is made of piezoelectric crystal materials. If the rectangular plate 202 is made of a piezoelectric ceramic, appropriate high direct current voltages are applied between the electrodes 203 and 204, between the electrodes 205 and 206 and between the electrodes 207 and 208 to perform polarization treatment, respectively. Further, appropriate high direct current voltages are applied between the electrodes 205, 206 and electrode 216 and between the electrodes 207, 208 and electrode 217 to perform polarization treatment, respectively.

The operation of the piezoelectric transformer 200 will next be described. In FIG. 2(1), the electrodes 203, 205 and 207 serving as the primary electrodes are electrically connected to one another and connected to a terminal A. The electrodes 204, 206 and 208 serving as the other primary electrodes and common electrodes are electrically connected to one another and connected to terminal B and D. Further, the electrodes 216 and 217 serving as the secondary electrodes are electrically connected to each other and connected to a terminal C. If an alternating voltage (input voltage) having a frequency near a resonance frequency for generating mechanical vibrations to expand and contract the rectangular plate 202 in the longitudinal direction thereof is applied between the terminals A and B, the mechanical vibrations to expand and contract the rectangular plate 202 in the longitudinal direction thereof are excited on the piezoelectric transformer 200. The excited mechanical vibrations are converted to a voltage by the piezoelectric effect. Thus a high voltage can be fetched as an output voltage between the terminals C and D in accordance with the impedance ratio between the primary electrodes and the secondary electrodes.

FIG. 2(2) shows the displacement distribution of the piezoelectric transformer 200 in the longitudinal direction thereof at a certain point of time while extensional vibrations of the 3/2 wavelength are generated in the piezoelectric transformer 200 in the longitudinal direction thereof. In FIG. 2(2), the horizontal axis indicates the position in the piezoelectric transformer 200 in the longitudinal direction thereof and the vertical axis indicates the displacement of the piezoelectric transformer 200 in the longitudinal direction thereof caused by the mechanical vibration of the piezoelectric transformer 200 at a certain instance. On the vertical axis, +direction indicates the right displacement of the piezoelectric transformer 200 in the longitudinal direction thereof and −direction indicates the left displacement of the piezoelectric transformer 200 in the longitudinal direction thereof. FIGS. 2(3) and 2(4) show the internal stress distribution of the rectangular plate 202 and the electric charge distribution induced by the vibration when the piezoelectric transformer 200 has the displacement distribution shown in FIG. 2(2), respectively. In FIG. 2(3), the horizontal axis indicates the position in the piezoelectric transformer 200 in the longitudinal direction thereof and the vertical axis indicates the magnitude of the internal stress generated in the piezoelectric transformer 200 in the expansion/contraction direction along the longitudinal direction thereof. In FIG. 2(4), the horizontal axis indicates the position in the piezoelectric transformer 200 in the longitudinal direction thereof and the vertical axis indicates the positive/negative polarity and quantity of the electric charges induced by the vibration.

Because the piezoelectric transformer 200 according to this embodiment has the $3\lambda/2$ longitudinal extensional vibration mode, the amplitudes of the mechanical vibrations can be decreased to hold down elastic strains, and the driving frequency can be increased. Thus, the power handled by the piezoelectric transformer 200 for one vibration can be decreased and the number of vibrations can be increased, which enables the piezoelectric transformer 200 to handle a high power.

In addition, in the piezoelectric transformer 200 according to this embodiment, which has the $3\lambda/2$ longitudinal extensional vibration mode as shown in FIG. 2(2), parts of the piezoelectric transformer 200 in which high stresses are generated (points P1, P2 and P3) do not coincide with parts in which polarization directions are discontinuous (a part of the rectangular plate 202 between a region thereof interposed between the electrodes 203 and 204 and a region thereof interposed between the electrode 205 and 206; a part of the rectangular plate 202 between a region thereof interposed between the electrodes 203 and 204 and a region thereof interposed the electrodes 207 and 208; a part of the rectangular plate 202 near an electrode 216-side end of the region thereof interposed between the electrodes 205 and 206; and a part of the rectangular plate 202 near an electrode 217-side end of the region thereof interposed between the electrodes 207 and 208). That is, in normal operation, high stresses or strains are not generated on the parts in which the polarization directions are discontinuous and mechanical strengths are low. Consequently, the piezoelectric transformer 200 in this embodiment can handle a high power and can realize a piezoelectric transformer having high reliability.

Moreover, as shown in FIGS. 1 and 2(1), in the piezoelectric transformer 200 in this embodiment, the polarization direction between the electrodes 203 and 204 in the thickness direction of the rectangular plate 202 is different from that between the electrodes 205 and 206 in the thickness direction thereof and that between the electrodes 207 and 208 in the thickness direction thereof. Thus, even if alternating voltages equal in phases are applied between the electrodes 203 and 204, between the electrodes 205 and 206 and between the electrodes 207 and 208, the electric charges induced by the vibrations are equal in polarity and do not cancel one another. Besides, the length of the primary electrodes can be regarded as almost a sum of lengths of the three electrodes on each main surface of the rectangular plate 202. Therefore, in this embodiment, it is possible to set the length of the primary electrodes longer than that of the primary electrodes of the conventional piezoelectric transformer without causing the electric charges to cancel one another. Accordingly, it is possible to set the effective electromechanical coupling factor $k_{eff}$ of the piezoelectric transformer 200 higher than that of the conventional piezoelectric transformer when an electrical energy is applied to the primary electrodes and to increase the power which can be handled by the piezoelectric transformer per unit volume. Preferably, the length of each of the electrodes 205, 206, 207 and 208 is not less than 1/10 of the length of the electrode 203 or 204 so as to obtain an desired effective electromechanical coupling factor $k_{eff}$. Generally, the length of the electrode 203 and the length of the electrode 204 are equal, that of the electrode 205 and that of electrode 206 are equal, and that of the electrode 207 and that of electrode 208 are equal, respectively. If the length of the electrode 203 and that of the electrode 204 are respectively $L_1$, the length of the electrode 205 and that of the electrode 206 are respectively $L_2$, and the length of the electrode 207 and that of the electrode 208 are respectively $L_3$, (see FIG. 2(1)), the relationships of $L_2<L_1/10$ and $L_3<L_1/10$ are satisfied. If so, it is necessary to set the lengths (arrangement) of the electrodes 205, 206, 207 and 208 so that the parts in which the polarization directions are discontinuous (a part of the rectangular plate 202 near the electrode 216-side end of the region thereof interposed between the electrodes 205 and 206 and a part of the rectangular plate 202 near the electrode 217-side end of the region thereof interposed between the electrodes 207 and 208) do not coincide with the parts in which high stresses are generated (e.g. the points P1 and P3 in FIG. 2(3)).

Figure 33:
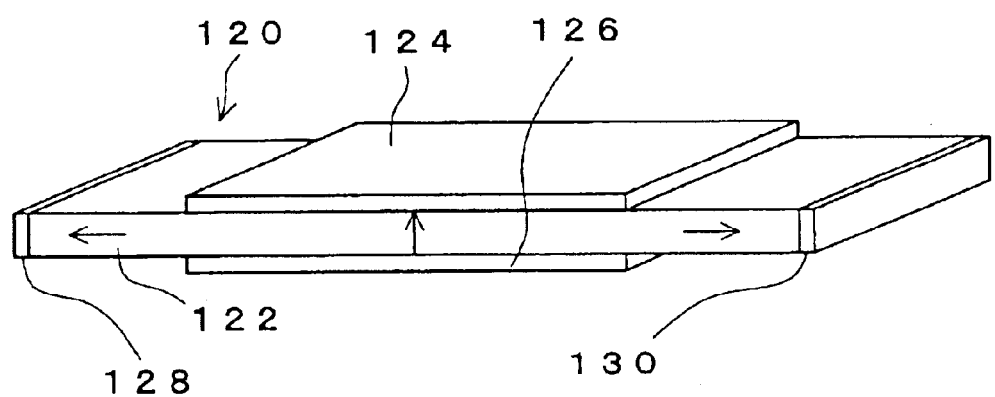
FIG. 33 is a perspective view of a conventional piezoelectric transformer having a λ/2 longitudinal extensional vibration mode with two outputs.
Figure 34:
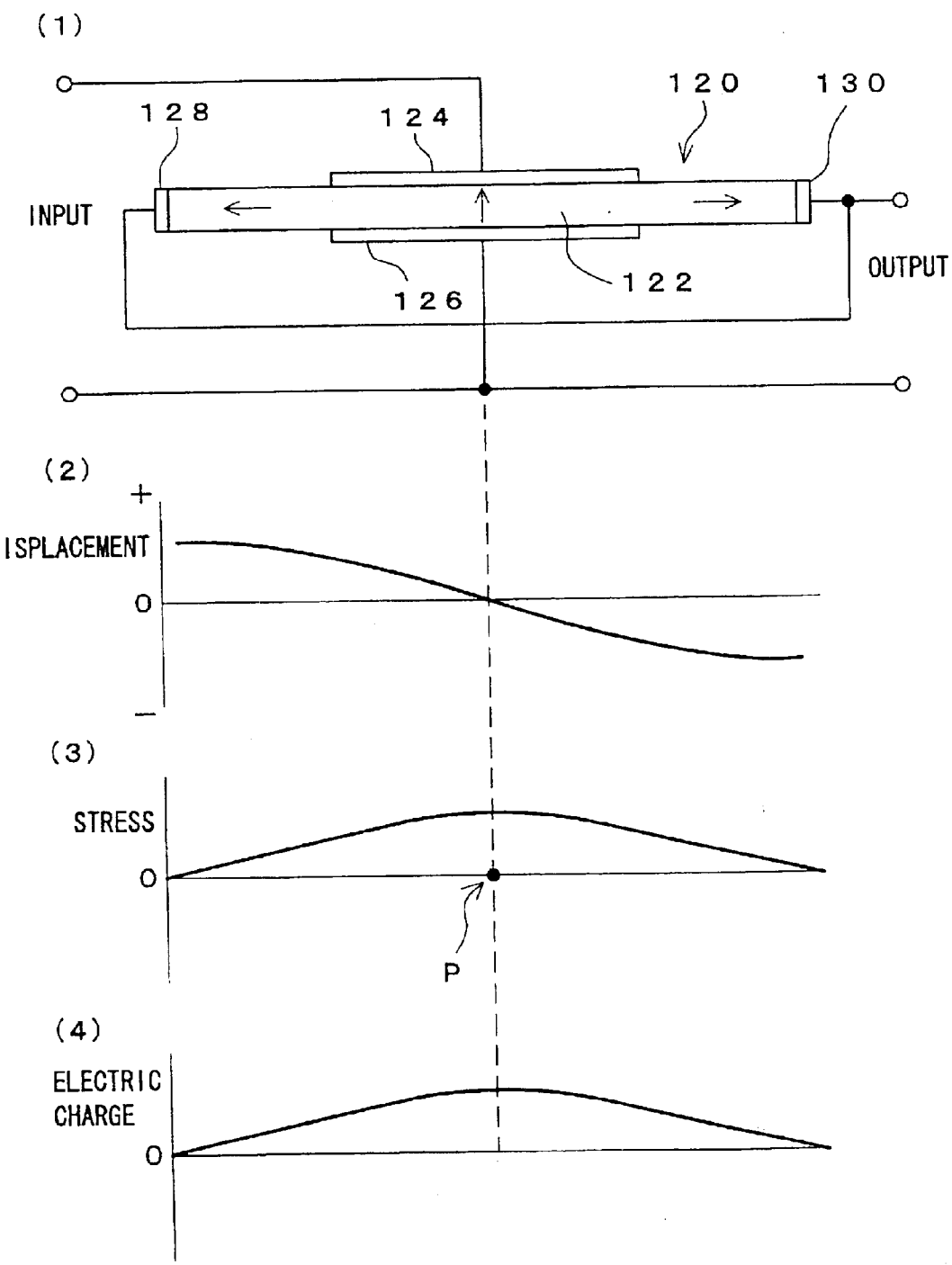
FIG. 34(1) is a side view of the piezoelectric transformer of FIG. 33, and FIGS. 34(2), 34(3) and 34(4) show a displacement distribution, a stress distribution, and an electric charge distribution of the piezoelectric transformer of FIG. 33, respectively.

Now, the effective electromechanical coupling factor $k_{eff}$ of the piezoelectric transformer 200 in this embodiment and that of the conventional piezoelectric transformer 120 shown in FIG. 33 will be compared. Generally, the piezoelectric transformer having the $\lambda/2$ longitudinal extensional vibration mode is higher than that having the $3\lambda/2$ longitudinal extensional vibration mode in the effective electromechanical coupling factor $k_{eff}$ thereof. However, in spite of the piezoelectric transformer 200 in this embodiment having the $3\lambda/2$ longitudinal extensional vibration mode, the effective electromechanical coupling factor $k_{eff}$ can be set high almost as equal as that of the piezoelectric transformer having the $\lambda/2$ longitudinal extensional vibration mode. This will be described concretely with reference to FIGS. 3 and 4.

FIG. 3(1) is a perspective view of the piezoelectric transformer 120 shown in FIG. 33. As already described with reference to FIG. 33, the piezoelectric transformer 120 includes the rectangular plate 122 made of a piezoelectric material, the electrodes 124 and 126 serving as primary (input) electrodes and the electrodes 128 and 130 serving as secondary (output) electrodes. It is supposed herein that the length of the rectangular plate 122 is L, and each length of the electrodes 124 and 126 serving as the primary electrodes is $L_1$, respectively. The each thickness of the electrodes 124, 126, 128, and 130 is sufficiently smaller than the thickness of the rectangular plate 120. Arrows shown in FIG. 3(1) indicate the polarization directions of the rectangular plate 122 (if the rectangular plate 122 is made of a piezoelectric ceramic).

FIG. 3(2) shows the effective electromechanical coupling factors $k_{eff}$ of the piezoelectric transformer 120 relative to the length $L_1$ of each of the electrodes 124 and 126 serving as the primary electrodes if the width and thickness of the rectangular plate 122 are respectively 0.15L and 0.02L with standardized by the length L of the rectangular plate 122 and if the electromechanical coupling factor $k_{31}$ of the piezoelectric ceramic is 0.36 in which extensional vibrations in the longitudinal direction of the rectangular plate 122 are generated. In FIG. 3(2), the horizontal axis indicates the length $L_1$ of each of the electrodes 124 and 126 serving as the primary electrodes with standardized by the length L of the rectangular plate 122, and the vertical axis indicates effective electromechanical coupling factor $k_{eff}$. Further, in FIG. 3(2), a solid line indicates the effective electromechanical coupling factor $k_{eff}$ if the piezoelectric transformer 120 vibrates in the λ/2 longitudinal extensional vibration mode, a broken line indicates the effective electromechanical coupling factor $k_{eff}$ if the piezoelectric transformer 120 vibrates in the 3λ/2 longitudinal extensional vibration mode. For the solid line in FIG. 3(2), the effective electromechanical coupling factor $k_{eff}$ is asymptotic to 0.36 as the length $L_1$ of each of the electrodes 124 and 126 serving as the primary electrodes approaches to 1.0. This corresponds to the electromechanical coupling factor $k_{31}$ if electrodes are formed on the entire two main surfaces of the rectangular plate 122 perpendicular to the thickness direction thereof and the vibrations in the longitudinal direction of the rectangular plate 122 are excited. Further, points A and B in FIG. 3(2) respectively indicate the effective electromechanical coupling factors $k_{eff}$ if the length $L_1$ of each of the electrodes 124 and 126 serving as the primary electrodes is 0.32L. The effective electromechanical coupling factor $k_{eff}$ is 0.29 in the λ/2 longitudinal extensional vibration mode (point A), and $k_{eff}$ is 0.17 in the 3λ/2 longitudinal extensional vibration mode (point B).

Meanwhile, FIG. 4(1) is a perspective view of the piezoelectric transformer 200 in this embodiment. It is supposed herein that the length of the rectangular plate 202 is L, that of each of the electrodes 203 and 204 serving as the primary-electrodes is $L_{11}$, respectively, and that of each of the electrodes 205, 206, 207 and 208 is $L_{12}$, respectively. Distances sufficiently smaller than the length $L_{11}$ are kept between the electrodes 203 and 205, between the electrodes 203 and 207, between the electrodes 204 and 206, and between the electrodes 204 and 208, respectively. The each thickness of the electrodes 203, 204, 205, 206, 207, 208, 216 and 217 is sufficiently smaller than the thickness of the rectangular plate 202. Arrows shown in FIG. 4(1) indicate polarization directions of the rectangular plate 202 (if the rectangular plate 202 is made of a piezoelectric ceramic), respectively.

FIG. 4(2) shows the effective electromechanical coupling factor $k_{eff}$ of the piezoelectric transformer 200 relative to the length $L_{12}$ of each of the electrodes 205, 206, 207 and 208 serving as the primary electrodes if the width and thickness of the rectangular plate 202 are respectively 0.15L and 0.02L with standardized by the length L of the rectangular plate 202 and if the electromechanical coupling factor $k_{31}$ of the piezoelectric ceramic in which extensional vibrations in the longitudinal direction of the rectangular plate 202 are generated is 0.36. In FIG. 4(2), the horizontal axis indicates the length $L_{12}$ of each of the electrodes 205, 206, 207 and 208 serving as the primary electrodes with standardized by the length L of the rectangular plate 202, and the vertical axis indicates the effective electromechanical coupling factor $k_{eff}$. It is supposed herein that the length $L_{11}$ of each of the electrodes 203 and 204 serving as the primary electrodes is 0.24L.

As is obvious from FIG. 4(2), if the length $L_{12}$ of each of the electrodes 205, 206, 207 and 208 serving as the primary electrodes is 0.3L, the effective electromechanical coupling factor $k_{eff}$ is approximately 0.3. This almost equals to the effective electromechanical coupling factor $k_{eff}$ at the point A shown in FIG. 3(2). Accordingly, this follows that the effective electromechanical coupling factor $k_{eff}$ of the piezoelectric transformer 200 having the 3λ/2 longitudinal extensional vibration mode according to the first embodiment of the present invention can be the same as that of the piezoelectric transformer 120 having the λ/2 longitudinal extensional vibration mode.

Figure 35:
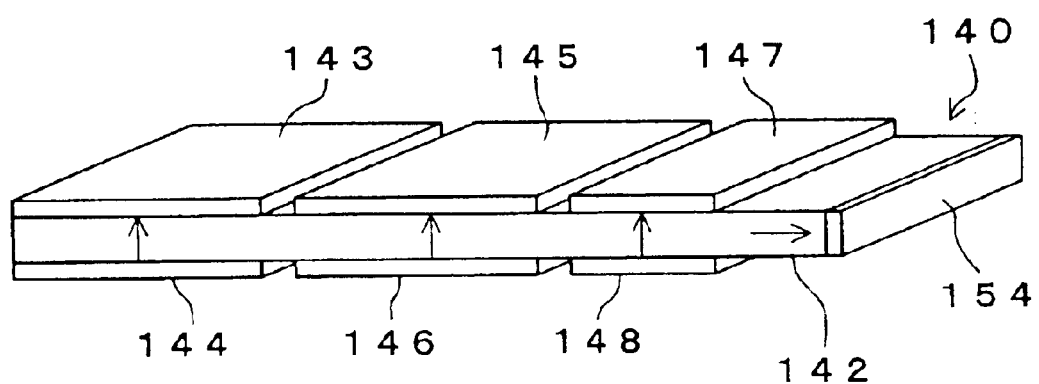
FIG. 35 is a perspective view of a conventional piezoelectric transformer having the 3λ/2 longitudinal extensional vibration mode with one output.
Figure 36:
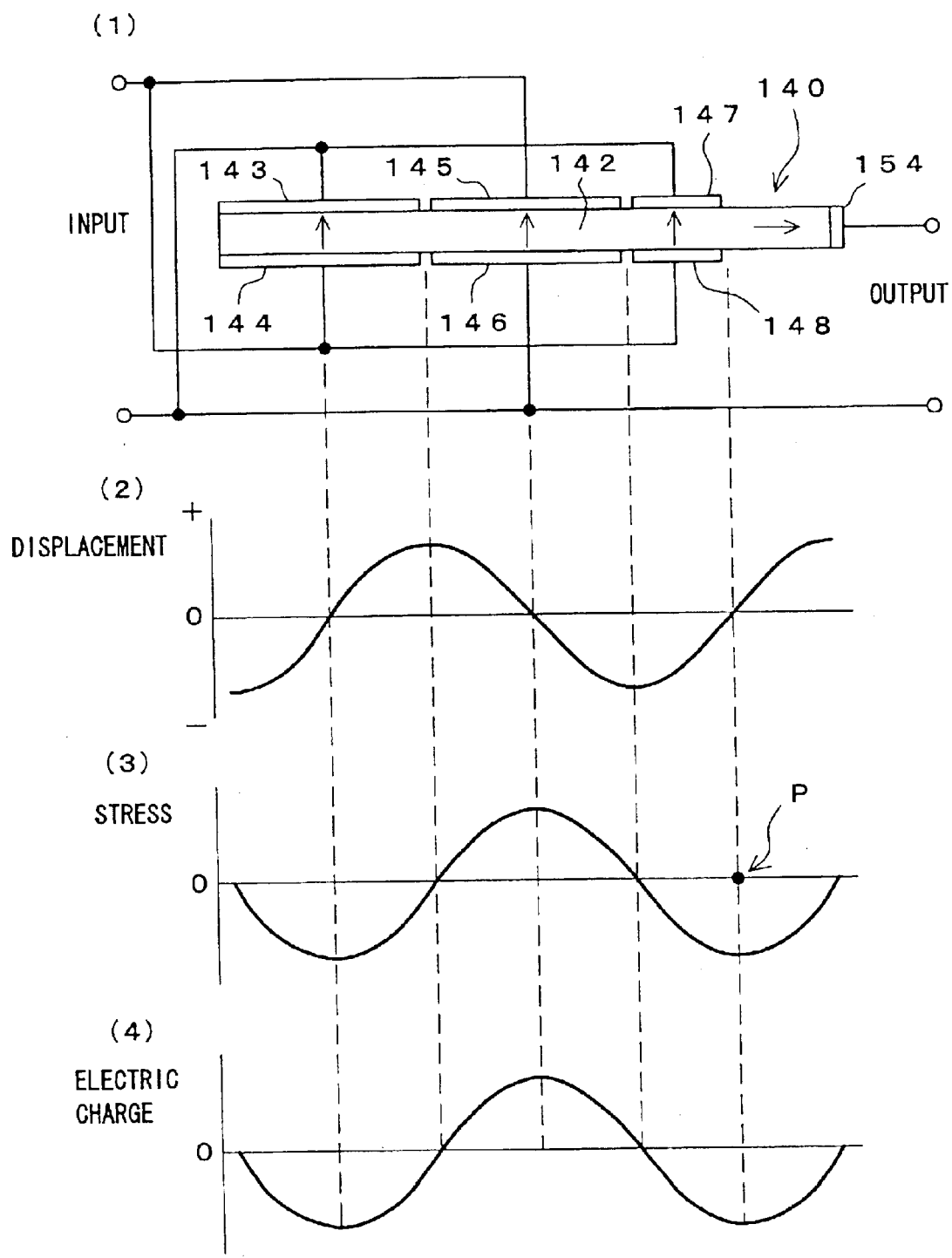
FIG. 36(1) is a side view of the piezoelectric transformer of FIG. 35, and FIGS. 36(2), 36(3) and 36(4) show a displacement distribution, a stress distribution, and an electric charge distribution of the piezoelectric transformer of FIG. 35, respectively.
Figure 37:
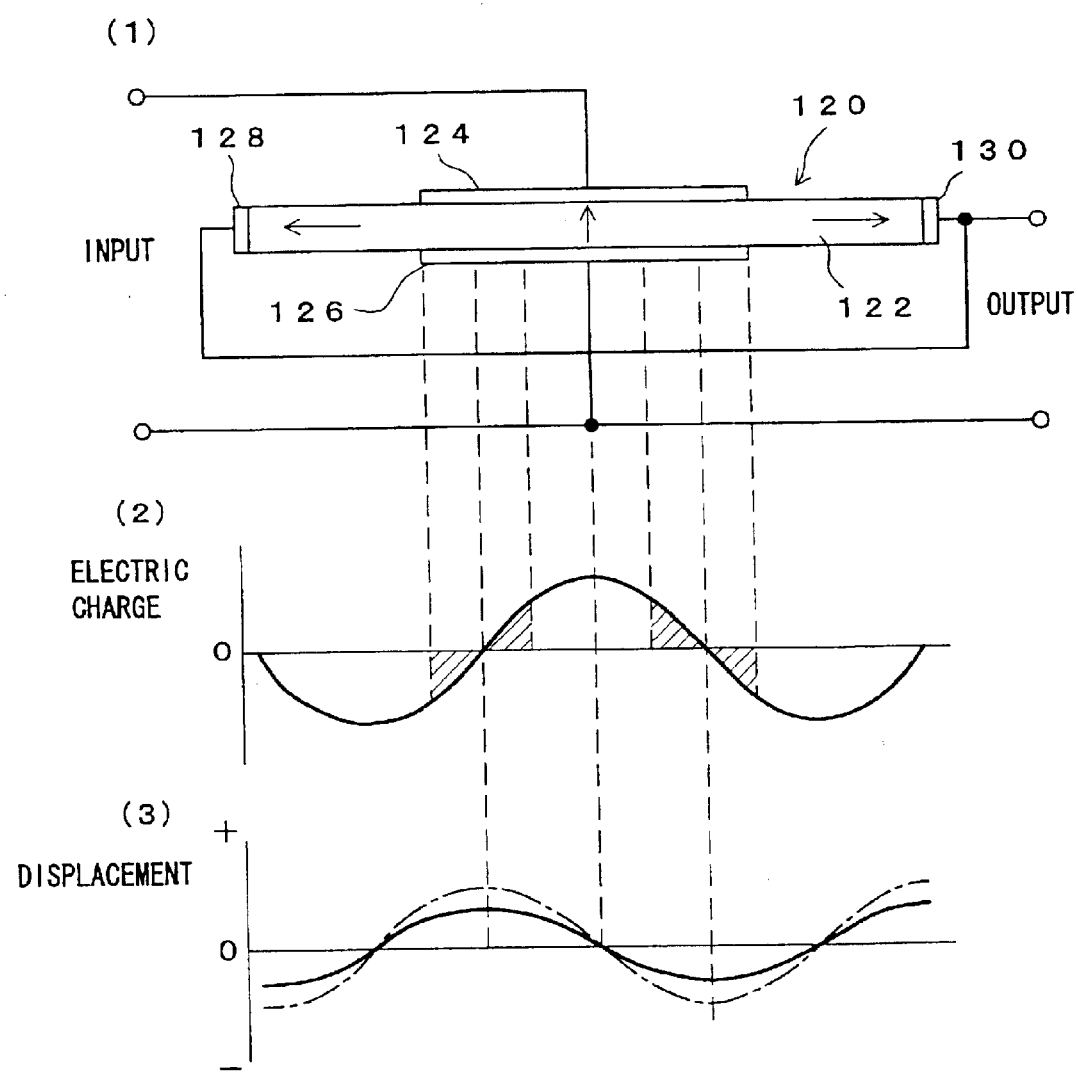
FIG. 37(1) is a side view of the piezoelectric transformer of FIG. 33, and FIGS. 37(2) and 37(3) show an electric charge distribution and a displacement distribution of the piezoelectric transformer of FIG. 33 if the transformer has the 3λ/2 longitudinal extensional vibration mode, respectively.
Figure 38:
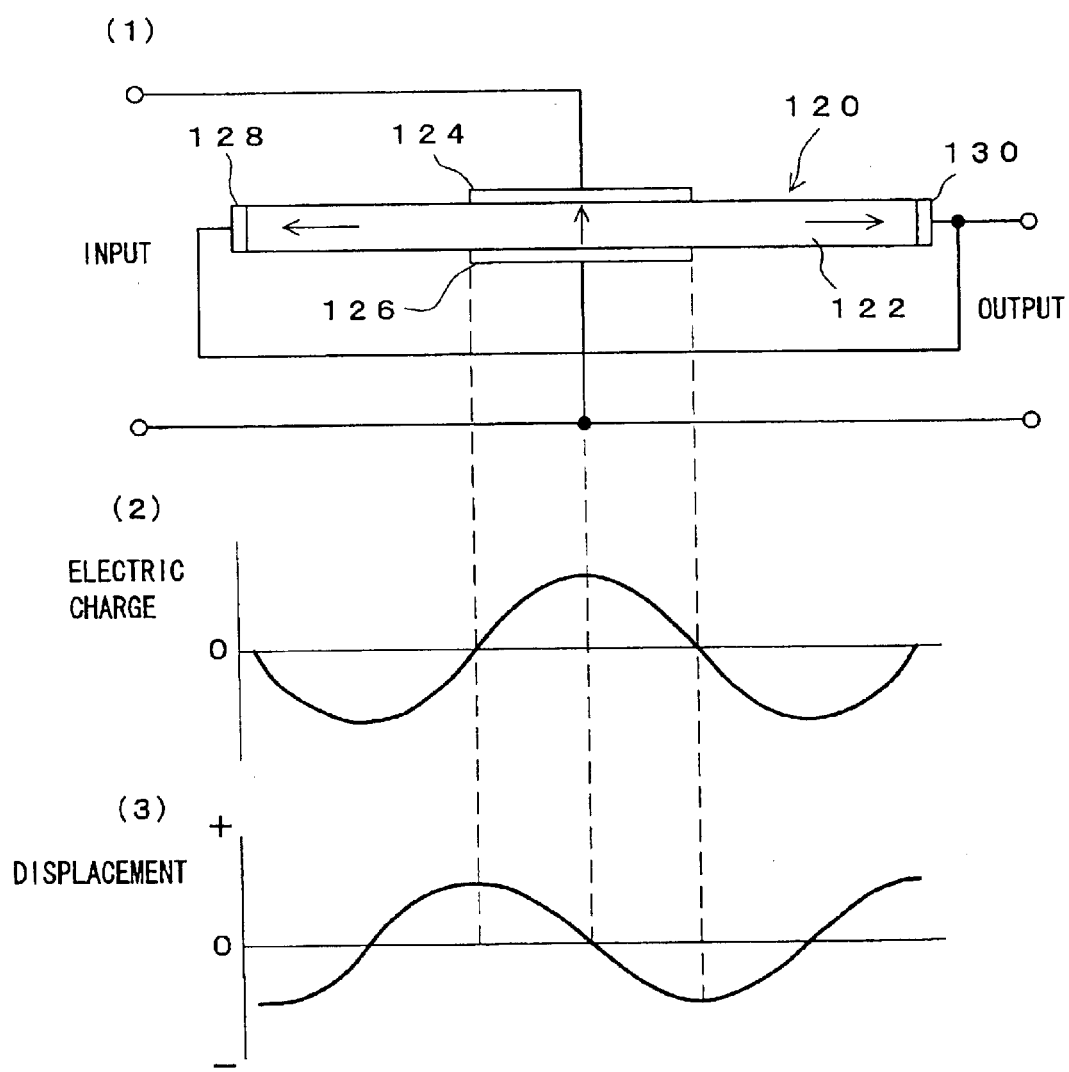
FIG. 38(1) is a side view of the piezoelectric transformer of FIG. 37 if the central electrode of the piezoelectric transformer is shorter, and FIGS. 38(2) and 38(3) show an electric charge distribution and a displacement distribution of the piezoelectric transformer of FIG. 37 if the central electrode of the piezoelectric transformer is shorter, respectively.

Moreover, according to the piezoelectric transformer in this embodiment, it is possible to realize a piezoelectric transformer which is large in the capacity of the secondary electrodes, low in output impedance and capable of fetching more current from the secondary electrodes than the conventional piezoelectric transformer. The piezoelectric transformer 200 in this embodiment will be described below compared with the conventional piezoelectric transformer 140 having the 3λ/2 longitudinal extensional vibration mode (see FIGS. 35 and 36).

FIGS. 5(1) and 5(2) are a side view of the piezoelectric transformer 200 in this embodiment and that of the conventional piezoelectric transformer 140, respectively. In the piezoelectric transformer 200 shown in FIG. 5(1) and the piezoelectric transformer 140 shown in FIG. 5(2), the primary electrodes are electrically connected to the secondary electrodes to constitute an input and an output, respectively, similarly to the piezoelectric transformers shown in FIG. 2(1) and that shown in FIG. 36(1). Further, for brevity, the gaps between the electrodes constituting the primary electrodes of the piezoelectric transformer 200 in the longitudinal directions thereof and those between the electrodes constituting the primary electrodes of the piezoelectric transformer 140 in the longitudinal directions thereof are not shown.

If the rectangular plate 202 which is a component of the piezoelectric transformer 200 and the rectangular plate 142 which is a component the piezoelectric transformer 140 are equal in material, volume, width and thickness, then the difference in the capacity $C_{O1}$ of the primary electrodes between the piezoelectric transformers 200 and 140 is determined by the length of the primary electrodes and the difference in the capacity $C_{O2}$ of the secondary electrodes between the piezoelectric transformers 200 and 140 is determined by the lengths from the primary electrodes to the secondary electrodes. In the piezoelectric transformer 200, if the lengths of the rectangular plates 202 and 142 are both L, the length of each of the electrodes 203 and 204 is L/3 and that of each of the electrodes 205, 206, 207 and 208 is L/4 so as to coincide the capacity $C_{O1}$ of the primary electrodes of the piezoelectric transformer 200 with that of the primary electrodes of the piezoelectric transformer 140. In addition, in the piezoelectric transformer 140, the length of each of the electrodes 143, 144, 145 and 146 is L/3 and that of each of the electrodes 147 and 148 is L/6. In this case, the piezoelectric transformers 200 and 140 coincide with each other in the length of the primary electrodes of 5L/6. That is, the capacity $C_{01}$ of the piezoelectric transformer 200 is equal to that of the piezoelectric transformer 140.

Next, the capacity $C_{02}$ of the secondary electrodes in the above case will be described. In the piezoelectric transformer 140, the length from the electrode 154 serving as the secondary electrode to the electrodes 147 and 148 is L/6. The length from the electrode 216 serving as the secondary electrode to the electrodes 205 and 206 and that from the electrode 217 serving as the secondary electrode to the electrodes 207 and 208 are both L/12. Therefore, the capacity $C_{02}$ of each of the two secondary electrodes of the piezoelectric transformer 200 is twice as large as that of the secondary electrode of the piezoelectric transformer 140. Further, the total capacitance $C_{02}$ of the secondary electrodes of the piezoelectric transformer 200 is four times as large as that of the piezoelectric transformer 140 because the two capacities of the secondary electrodes are connected in parallel.

As can be understood from the above, the piezoelectric transformer 200 in this embodiment can be higher in the capacity of the secondary electrodes and lower in secondary impedance (output impedance) than the conventional piezoelectric transformer 140 if rectangular plates of two piezoelectric transformers are equal in material and shape and the primary electrodes of them are equal in capacity. Therefore, the structure of the piezoelectric transformer 200 in this embodiment enables more current to flow in the secondary electrodes.

It is noted that the polarization directions of the rectangular plate 202 shown in FIGS. 1 and 2(1) are not limited to those shown therein. It suffices if the polarization direction between the electrodes 205 and 206 and that between the electrodes 207 and 208 are equal in the thickness direction of the rectangular plate 202, and those polarization directions are different from the polarization direction between the electrodes 203 and 204. Also, the polarization directions near the electrodes 216 and 217 serving as the secondary electrodes suffices if they differ in the longitudinal direction of the rectangular plate 202. Even in those cases, the same advantages as those described above can be attained.

Furthermore, in FIG. 2(1), a case where the electrodes 204, 206 and 208 serving as the primary electrodes are common electrodes has been described. However, even if the electrodes 203, 205 and 207 serving as the primary electrodes are common electrodes, the same advantages as those described above can be attained.

Furthermore, in the piezoelectric transformer 200 shown in FIGS. 1 and 2(1), the electrodes 203, 205 and 207 are electrically connected to one another by added means, as well as the electrodes 204, 206 and 208. However, even if the electrodes 203, 205 and 207 and the electrodes 204, 206 and 208 are constituted as one electrode, respectively, the same advantages as those described above can be attained as long as the polarization directions of the rectangular plate 202 satisfy the relationships described in this embodiment.

Besides, in this embodiment, a case where the rectangular plate 202 is made of a piezoelectric ceramic has been described. However, even if the rectangular plate 202 is made of piezoelectric crystals such as lithium niobate, the same advantages as those described above can be attained by setting the polarization directions as c axis directions.

Second Embodiment

Figure 6:
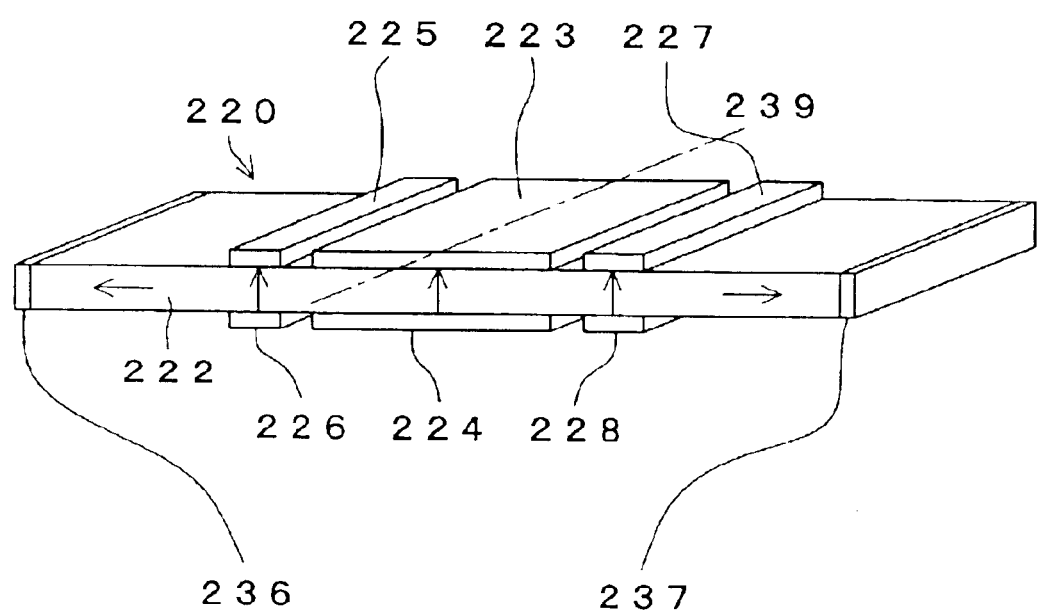
FIG. 6 is a perspective view of a piezoelectric transformer of the second embodiment according to the present invention.
Figure 7:
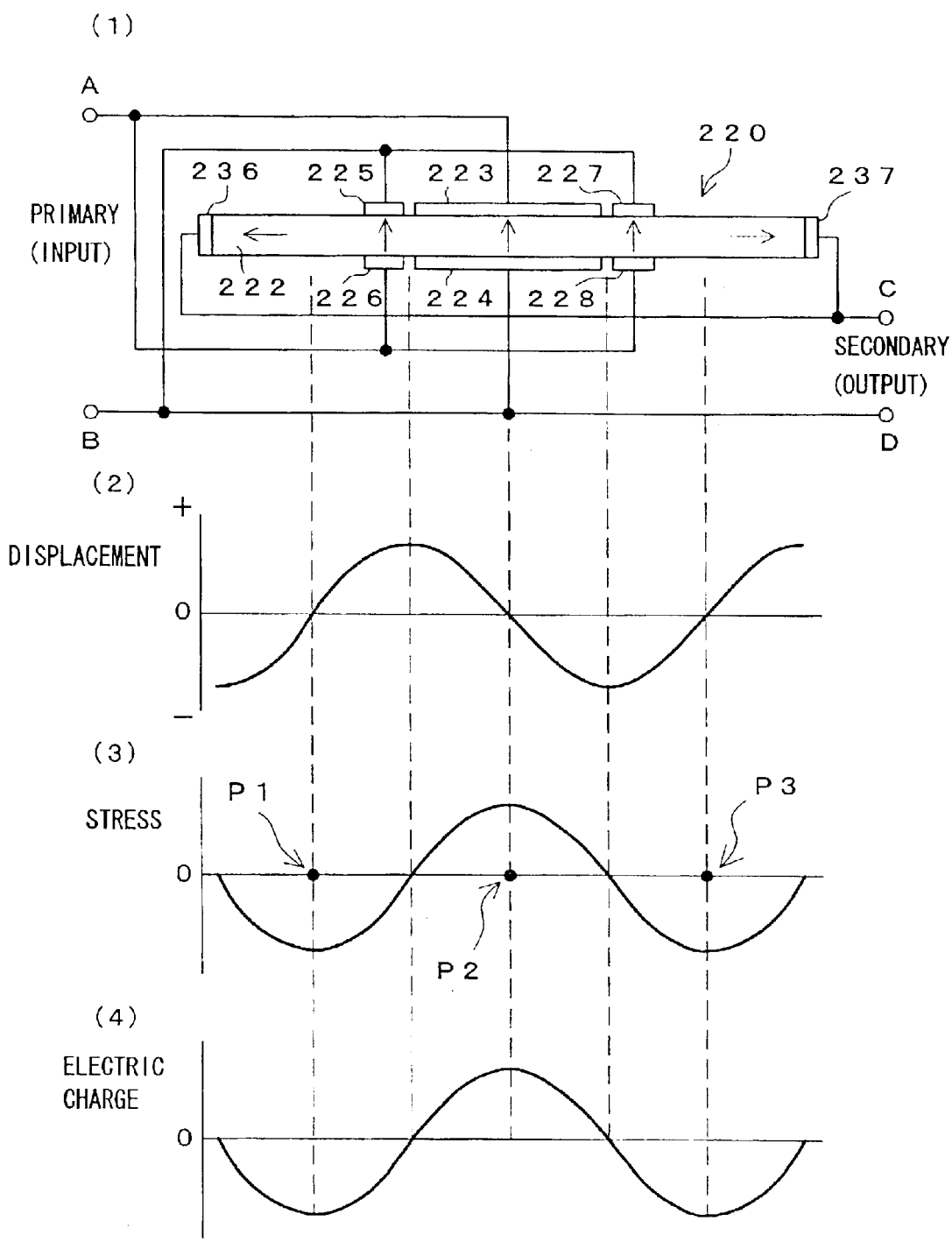
FIG. 7(1) is a side view of the piezoelectric transformer of FIG. 6, FIGS. 7(2), 7(3) and 7(4) show a displacement distribution, a stress distribution and an electric charge distribution of the piezoelectric transformer of FIG. 6, respectively.

FIG. 6 is a perspective view of a piezoelectric transformer having the 3λ/2 longitudinal extensional vibration mode according to the second embodiment of the present invention. FIG. 7(1) is a side view of the piezoelectric transformer shown in FIG. 6. In FIGS. 6 and 7(1), the piezoelectric transformer 220 includes a rectangular plate 222 made of a piezoelectric material. Primary (input) electrodes are formed on two main surfaces of the rectangular plate 222 perpendicular to the thickness direction thereof. The primary electrodes consisting of electrodes 223, 225 and 227 are formed on one of the two main surfaces and the other primary electrodes consisting of electrodes 224, 226 and 228 are formed on the other main surface. In addition, the center line of each of the electrodes 223 and 224 substantially coincides with the center line 239 of the rectangular plate 222. The electrodes 223 and 224, the electrodes 225 and 226 and the electrodes 227 and 228 are formed to be opposed each other in the thickness direction of the rectangular plate 222, respectively. Each of electrodes 236 and 237 is formed on each of two end faces of the rectangular plate 222 in the longitudinal direction thereof as secondary (output) electrodes. The electrodes 223, 224, 225, 226, 227, 228, 236 and 237 are made of metal such as silver, nickel or gold and formed by a method such as evaporation, sputtering, printing or plating.

In FIGS. 6 and 7(1), arrows indicated on the rectangular plate 222 show polarization directions, respectively if the rectangular plate 222 is made of a piezoelectric ceramic such as lead zirconate titanate (PZT), and show the directions of c axis orientations, respectively if the rectangular plate 222 is made of piezoelectric crystals. If the rectangular plate 222 is made of a piezoelectric ceramic, appropriate high direct current voltages are applied in the thickness direction of the rectangular plate 222 between the electrodes 223 and 224, between the electrodes 225 and 226 and between the electrodes 227 and 228 to perform polarization treatment, respectively. Further, appropriate high direct current voltages are applied in the longitudinal direction of the rectangular plate 222 between the electrodes 225 and 226 and the electrode 236 and between the electrodes 227 and 228 and the electrode 237 to perform polarization treatment, respectively.

The operation of the piezoelectric transformer 220 will next be described. In FIG. 7(1), the electrodes 223, 226 and 228 serving as the primary electrodes are electrically connected to one another and connected to a terminal A. The electrodes 224, 225 and 227 serving as the other primary electrodes are electrically connected to one another and connected to terminal B and D as common electrodes. Further, the electrodes 236 and 237 serving as the secondary electrodes are electrically connected to each other and connected to a terminal C. If an alternating voltage (input voltage) having a frequency near a resonance frequency for generating mechanical vibrations to expand and contract the rectangular plate 222 in the longitudinal direction thereof is applied between the terminals A and B, the mechanical vibrations to expand and contract the rectangular plate 222 in the longitudinal direction thereof are excited on the piezoelectric transformer 220. The excited mechanical vibrations are converted to a voltage by the piezoelectric effect. Thus, a high voltage can be fetched as an output voltage between the terminals C and D in accordance with the impedance ratio between the primary and secondary electrodes.

FIG. 7(2) shows the displacement distribution of the piezoelectric transformer 220 in the longitudinal direction thereof at a certain point of time while extensional vibrations of the 3/2 wavelength are generated in the piezoelectric transformer 220 in the longitudinal direction of thereof. In FIG. 7(2), the horizontal axis indicates the position in the piezoelectric transformer 220 in the longitudinal direction thereof and the vertical axis indicates the displacement of the piezoelectric transformer 220 in the longitudinal direction thereof caused by the mechanical vibration thereof at a certain instance. On the vertical axis, +direction indicates the right displacement of the piezoelectric transformer 220 in the longitudinal direction thereof and –direction indicates the left displacement thereof in the longitudinal direction thereof. FIGS. 7(3) and 7(4) show the internal stress distribution of the rectangular plate 222 and the electric charge distribution induced by the vibration when the piezoelectric transformer 220 has the displacement distribution shown in FIG. 7(2), respectively. In FIG. 7(3), the horizontal axis indicates the position in the piezoelectric transformer 220 in the longitudinal direction thereof and the vertical axis indicates the magnitude of the internal stress generated in the piezoelectric transformer 220 in compression/expansion direction along the length direction thereof. In FIG. 7(4), the horizontal axis indicates the position in the piezoelectric transformer 220 in the longitudinal direction thereof and the vertical axis indicates the positive/negative polarity and quantity of the electric charges induced by the vibration.

In the piezoelectric transformer 220 in this second embodiment, the polarization directions in the regions of the rectangular plate 222 interposed between electrodes of the primary electrodes are equal in the thickness direction of the rectangular plate 222. Thus, clacks can be prevented from generating in the rectangular plate 222. The clacks are caused by internal strains which are generated at the gaps between the electrodes of the primary electrodes in the longitudinal direction of the rectangular plate 222 by applying opposite high electric fields in the thickness direction of the rectangular plate 222 to adjacent regions of the rectangular plate 222 interposed between the electrodes of the primary electrodes during the polarization treatment, as in the case of the piezoelectric transformer 200 in the first embodiment. The gaps are a part of rectangular plate 222 between a region thereof interposed between the electrodes 223 and 224 and a region thereof interposed between the electrodes 225 and 226, and a part thereof between a region thereof interposed between the electrodes 223 and 224 and a region thereof interposed between the electrodes 227 and 228. Besides, in the piezoelectric transformer 220, residual strains after the polarization treatment are smaller than the gaps above described and there are fewer parts in which the polarization directions are discontinuous than the piezoelectric transformer 220 in the first embodiment. Thus, it is possible to realize a piezoelectric transformer having high mechanical strength.

Moreover, the matter has no effect on the piezoelectric transformer in this embodiment that the effective electromechanical coupling factor $k_{eff}$ may possibly be lower if the polarization treatments are performed by applying opposite electric fields to the adjacent regions interposed between electrodes and therefore the polarization is sometimes insufficient near the boundary of the electrodes.

In addition, in the piezoelectric transformer 220 in this second embodiment, which has the $3\lambda/2$ longitudinal extensional vibration mode shown in FIG. 7(2), parts of the piezoelectric transformer 220 in which high stresses are generated (points P1, P2 and P3) do not coincide with parts in which polarization directions are discontinuous (a part of the rectangular plate 222 near an electrode 236-side end of the region thereon interposed between the electrodes 225 and 226, and a part of the rectangular plate 222 near an electrode 237-side end of the region thereof interposed between the electrodes 225 and 226). That is, in the piezoelectric transformer in this embodiment, as in that in the first embodiment of the present invention, in normal operation, high stresses or strains are not generated on the parts in which the polarization directions are discontinuous and the mechanical strengths are low. Consequently, the piezoelectric transformer in this embodiment can handle a high power and can realize a piezoelectric transformer having high reliability.

Moreover, as shown in FIGS. 6 and 7(1), for the piezoelectric transformer 220 in this embodiment, the polarization directions between the electrodes 223 and 224, those between the electrodes 225 and 226 and those between the electrodes 227 and 228 in the thickness direction of the rectangular plate 222 are equal to one another. However, a part of the primary electrodes is constituted of the electrodes 223, 226 and 228, the other is constituted of the electrodes 224, 225 and 227, and the phase of the alternating voltage applied between the electrodes 223 and 224 differs by 180 degrees from the phases of the alternating voltages applied between the electrodes 225 and 226, and between the electrodes 227 and 228. Thus, as shown in FIG. 7(4), the electric charges induced by the vibrations are equal in polarity and do not cancel one another. Besides, the length of the primary electrodes can be regarded as almost a sum of lengths of the three electrodes on each main surface of the rectangular plate 222. Therefore, in this embodiment, it is possible to set the length of the primary electrodes relatively longer than that of the primary electrodes of the conventional piezoelectric transformer. Accordingly, it is possible to set the effective electromechanical coupling factor $k_{eff}$ of the piezoelectric transformer in this embodiment higher than that of the conventional piezoelectric transformer and to increase the power which can be handled by the piezoelectric transformer per unit volume.

Further, because the piezoelectric transformer 220 having the $3\lambda/2$ longitudinal extensional vibration mode, the amplitudes of the mechanical vibrations can be decreased to hold down elastic strains, and driving frequency can be increased. Thus, the power handled by the piezoelectric transformer 220 for one vibration can be decreased and the number of times of-vibrations can be increased, which enables the piezoelectric transformer 220 to handle high power.

Moreover, the primary electrodes and the secondary electrodes of the piezoelectric transformer 220 in the second embodiment are formed in the same manner as those of the piezoelectric transformer 200 in the first embodiment. Thus, according to the structure of the piezoelectric transformer 220, secondary impedance (output impedance) is low and more current can flow in the secondary electrodes.

It is noted that the polarization directions of the piezoelectric transformer 220 shown in FIGS. 6 and 7(1) are not limited to those shown therein. If the polarization directions between the electrodes 223 and 224, between the electrodes 225 and 226 and between the electrodes 227 and 228 are equal to one another in the thickness direction of the rectangular plate 222, the same advantages as those described above can be attained. And the polarization directions near the electrodes 236 and 237 serving as the secondary electrodes shown in FIGS. 6 and 7(1) are also not limited to those shown therein. If the polarization directions near the electrodes 236 and 237 differ from each other in the longitudinal direction of the rectangular plate 222, the same advantages as those described above can be attained.

In addition, in FIG. 7(1), a case where the electrodes 224, 225 and 227 serving as the primary electrodes are common electrodes has been described. However, even if the electrodes 223, 226 and 228 serving as the other primary electrodes are common electrodes, the same advantages as those described above can be attained.

Besides, in this embodiment, a case where the rectangular plate 222 is made of a piezoelectric ceramic has been described. However, even if the rectangular plate 222 is made of piezoelectric crystals such as lithium niobate, the same advantages as those described above can be attained by setting the polarization directions as c axis directions.

Third Embodiment

Figure 8:
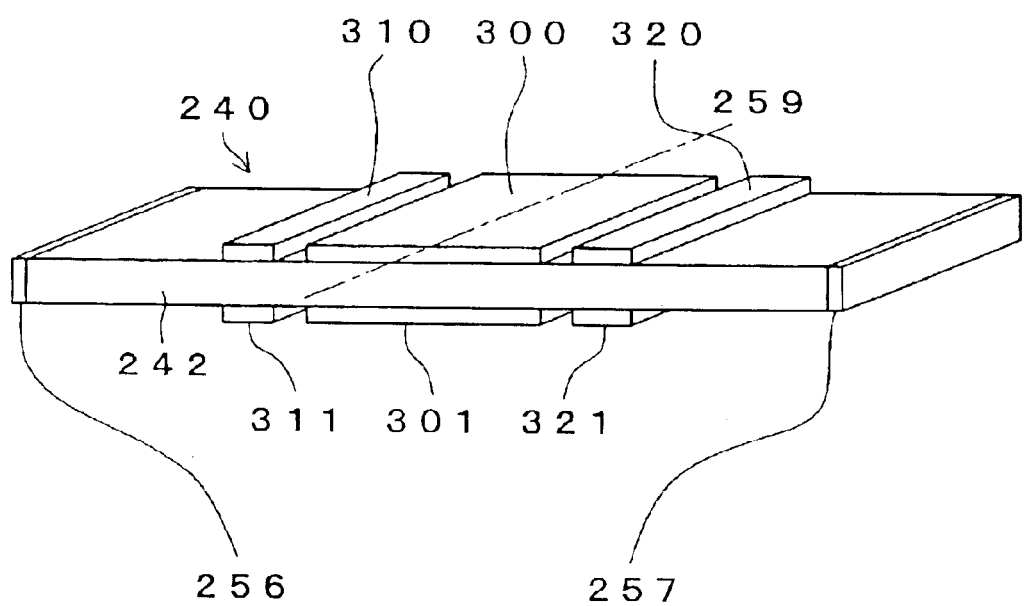
FIG. 8 is a perspective view of a piezoelectric transformer of the third embodiment according to the present invention.
Figure 9:
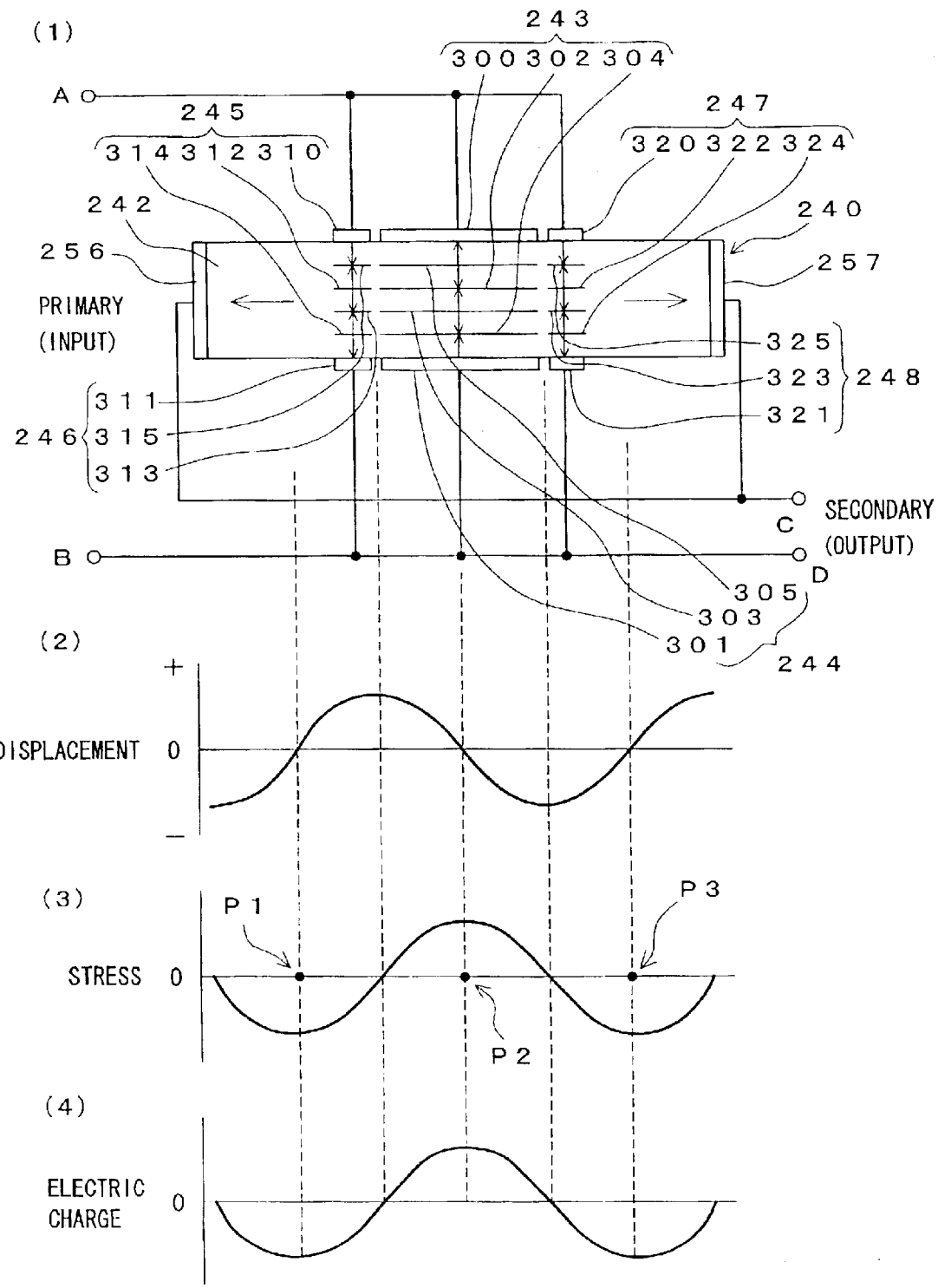
FIG. 9(1) is a side view of the piezoelectric transformer of FIG. 8, and FIGS. 9(2), 9(3) and 9(4) show a displacement distribution, a stress distribution and an electric charge distribution of the piezoelectric transformer of FIG. 8, respectively.

FIG. 8 is a perspective view of a piezoelectric transformer having the 3λ/2 longitudinal extensional vibration mode according to the third embodiment of the present invention. FIG. 9(1) is a side view of the piezoelectric transformer shown in FIG. 8. In FIGS. 8 and 9(1), the piezoelectric transformer 240 includes a rectangular plate 242 made of a piezoelectric material. Primary (input) electrodes consisting of a plurality of electrodes in the length and thickness directions of the rectangular plate 242 are formed near the central portion of the rectangular plate 242 in the longitudinal direction thereof. Primary electrodes have multilayer structures in which piezoelectric layers made of piezoelectric material such as piezoelectric ceramic and internal electrode layers made of metal material are alternately layered.

In FIG. 9(1), five piezoelectric layers and four electrode layers are present between two electrodes, which are components of the primary electrodes, opposed each other on two main surfaces of the rectangular plate 242 perpendicular to the thickness direction thereof. Electrodes 300, 310 and 320 are formed on one of the main surfaces of the rectangular plate 242 perpendicular to the thickness direction thereof. Electrodes 301, 311 and 321 are formed on the other main surface of the rectangular plate 242 perpendicular to the thickness direction thereof. Further, electrodes 302, 303, 304, 305, 312, 313, 314, 315, 322, 323, 324 and 325 are formed in the rectangular plate 242. The electrodes 300, 301, 302, 303, 304 and 305 are opposed one another in the thickness direction of the rectangular plate 242. The electrodes 310, 311, 312, 313, 314 and 315 are opposed one another in the thickness direction of the rectangular plate 242. The electrodes 320, 321, 322, 323, 324 and 325 are opposed one another in the thickness direction of the rectangular plate 242. The electrodes 300, 302 and 304 are electrically connected to one another to constitute an electrode 243, and the electrodes 301, 303 and 305 are electrically connected to one another to constitute an electrode 244. Likewise, the electrodes 310, 312 and 314 are electrically connected to one another to constitute an electrode 245, and the electrodes 311, 313 and 315 are electrically connected to one another to constitute an electrode 246. The electrodes 320, 322 and 324 are electrically connected to one another to constitute an electrode 247, and the electrodes 321, 323 and 325 are electrically connected to one another to constitute an electrode 248. Each center line of the respective electrodes constituting the electrodes 243 and 244 substantially coincides with the center line 259 of the rectangular plate 242. Each of electrodes 256 and 257 serving as secondary (output) electrodes are formed on each of two end faces of the rectangular plate 242 in the longitudinal direction thereof. The electrodes 300, 301, 310, 311, 320, 321, 256 and 257 are made of metal such as silver, nickel or gold and formed by a method such as evaporation, sputtering, printing or plating.

In FIG. 9(1), arrows indicated on the rectangular plate 242 show the polarization directions of the piezoelectric material, respectively. The polarization directions are in the thickness direction of the rectangular plate 242 in the portions of the piezoelectric layers interposed between the electrode 300 and the electrode 301, the portions of the piezoelectric layers interposed between the electrode 310 and the electrode 311, and the portions of the piezoelectric layers interposed between the electrode 320 and the electrode 321. Two portions of the piezoelectric layers, each of which is interposed between two electrodes, adjacent in the thickness direction of the rectangular plate 242 are opposite in the polarization direction. And two portions of any piezoelectric layer, each of which is interposed between two electrodes, adjacent in the longitudinal direction of the rectangular plate 242 are opposite in the polarization direction in the thickness direction of the rectangular plate 242. The region of the rectangular plate 242 between the electrodes 245 and 246 and the electrode 256, and that between the electrodes 247 and 248 and the electrode 257 are respectively polarized in the longitudinal direction of the rectangular plate 242. And the polarization directions of the regions are opposite each other. Polarization treatments are performed by applying appropriate high direct current voltages to the respective regions.

The operation of the piezoelectric transformer 240 will next be described. In FIG. 9(1), the electrodes 243, 245 and 247 serving as the primary electrodes are electrically connected to one another and connected to a terminal A. The electrodes 244, 246 and 248 serving as the other primary electrodes are electrically connected to one another and connected, as common electrodes, to terminals B and D. Further, the electrodes 256 and 257 serving as the secondary electrodes are electrically connected to each other and connected to a terminal C. If an alternating voltage having a frequency near a resonance frequency for generating mechanical vibrations to expand and contract the rectangular plate 242 in the longitudinal direction thereof is applied between the terminals A and B as an input voltage, the mechanical vibrations to expand and contract the rectangular plate 242 in the longitudinal direction thereof are excited on the piezoelectric transformer 240. The excited mechanical vibrations are converted to a voltage by the piezoelectric effect, and a high voltage can be thereby fetched between the terminals C and D as an output voltage in accordance with the impedance ratio between the primary and secondary electrodes.

FIG. 9(2) shows the displacement distribution of the piezoelectric transformer 240 in the longitudinal direction thereof at a certain point of time while extensional vibrations of the 3/2 wavelength are generated on the piezoelectric transformer 240 in the longitudinal direction thereof. In FIG. 9 (2), the horizontal axis indicates the position in the piezoelectric transformer 240 in the longitudinal direction thereof, and the vertical axis indicates the displacement of the piezoelectric transformer 240 in the longitudinal direction thereof caused by mechanical vibration thereof at a certain instance. On the vertical axis, +direction indicates the right displacement of the piezoelectric transformer 240 in the longitudinal direction thereof and −direction indicates the left displacement of the piezoelectric transformer 240 in the longitudinal direction thereof. Further, FIGS. 9(3) and 9(4) show the internal stress distribution of the rectangular plate 242 and the electric charge distribution induced by the vibration when the piezoelectric transformer 240 has the displacement distribution shown in FIG. 9(2), respectively. In FIG. 9(3), the horizontal axis indicates the position in the piezoelectric transformer 240 in the longitudinal direction thereof, and the vertical axis indicates the magnitude of the internal stress generated in the piezoelectric transformer 240 in compression/expansion direction along the length direction thereof. In FIG. 9(4), the horizontal axis indicates the position in the piezoelectric transformer 240 in the longitudinal direction thereof and the vertical axis indicates the positive/negative polarity and quantity of the electric charges induced by the vibration.

In the piezoelectric transformer 240 in this embodiment, the polarization directions in the portions of the piezoelectric layers, each of which is interposed between two electrodes of the primary electrodes, are in the thickness direction of the rectangular plate 242. The portions of the piezoelectric layers adjacent in the thickness direction of the rectangular plate 242 are opposite in the polarization direction. The portions of the piezoelectric layer adjacent in the longitudinal direction of the rectangular plate 242 are opposite in the polarization direction. Thus, compared with the piezoelectric transformers in the first and second embodiment, it is possible to increase the capacity of the primary electrodes in the piezoelectric transformer in this embodiment.

If it is supposed that the capacity of the primary electrodes is $C_{01}$, that of the secondary electrodes is $C_{02}$, a voltage applied to the primary electrodes is $V_{in}$ and that output from the secondary electrodes is $V_{out}$, then the primary power $W_{in}$ is given by expression (1) and the secondary power $W_{out}$ is given by expression (2). For brevity, it is supposed herein that no power loss occurs. If so, a step-up ratio γ which is a ratio of the output voltage $V_{out}$ to the input voltage $V_{in}$ is proportional to the square root of $C_{01}/C_{02}$ as shown in expression (3). Accordingly, the capacity $C_{01}$ of the primary electrodes of the piezoelectric transformer 240 in this embodiment can be set larger than that of the primary electrodes of the piezoelectric transformers in the first and second embodiments of the present invention, making it possible to obtain a high step-up ratio γ.

$$W_{in}=C_{01}(V_{in})^2/2 \quad (1),$$

$$W_{out}=C_{02}(V_{out})^2/2 \quad (2), \text{ and}$$

$$\gamma=V_{out}/V_{in}=(C_{01}/C_{02})^{1/2} \quad (3).$$

Further, because the piezoelectric transformer 240 according to this embodiment has the 3λ/2 longitudinal extensional vibration mode, the amplitudes of the mechanical vibrations can be decreased to hold down elastic strains, and the driving frequency can be increased. Thus, the power handled by the piezoelectric transformer 240 for one vibration can be decreased and the number of times of vibrations can be increased, which enables the piezoelectric transformer 240 to handle a high power.

Furthermore, in the piezoelectric transformer 240 in this embodiment, which has the 3λ/2 longitudinal extensional vibration mode shown in FIG. 9(2), parts in which high stresses are generated (points P1, P2 and P3) do not coincide with parts in which polarization directions are discontinuous (a part of the rectangular plate 242 between a region thereof interposed between the electrodes 243 and 244 and: a region thereof interposed between the electrodes 245 and 246, a part of the rectangular plate 242 between a region thereof interposed between the electrodes 243 and 244 and a region thereof interposed between the electrodes 247 and 248, a part of the rectangular plate 242 near an electrode 256-side end of the region thereof interposed between the electrodes 245 and 246, and a part of the rectangular plate 242 near an electrode 257-side end of the region thereof interposed between the electrodes 247 and 248). That is, as in the case of the first and second embodiments according to the present invention, in normal operation, high stresses or strains are not generated on the parts in which the polarization directions are discontinuous and mechanical strengths are low. Therefore, the piezoelectric transformer in this embodiment can handle a high power and can realize a piezoelectric transformer having high reliability.

Moreover, as shown in FIG. 9(1), in the piezoelectric transformer 240 in this embodiment, the two portions of any piezoelectric layer, each of which is interposed between two electrodes of the primary electrodes, which include the electrodes constituting the electrode 243, the electrodes constituting the electrode 244, the electrodes constituting the electrode 245, the electrodes constituting the electrode 246, the electrodes constituting the electrodes 247 and the electrodes constituting the electrode 248, adjacent in the longitudinal direction of the rectangular plate 242 are opposite in the polarization direction in the thickness direction thereof. Thus, as shown in FIG. 9(4), even if alternating voltages equal in phase are applied between the electrodes constituting the electrode 243 and the electrodes constituting the electrode 244, between the electrodes constituting the electrode 245 and the electrodes constituting the electrode 246, and between the electrodes constituting the electrode 247 and the electrodes constituting the electrode 248, the electric charges induced by the vibrations are equal in polarity and do not cancel one another. Besides, the length of the primary electrode can be regarded as a sum of lengths of the electrodes aligned in the longitudinal direction of the rectangular plate 242. Therefore, it is possible to set the length of the primary electrode relatively large in this embodiment. Accordingly, it is possible to set the effective electromechanical coupling factor $k_{eff}$ of the piezoelectric transformer 240 higher than that of the conventional piezoelectric transformer and to increase the power which the piezoelectric transformer can handle per unit volume.

It is noted that the polarization directions of the piezoelectric transformer 240 shown in FIG. 9(1) are not limited to those shown therein. It suffices that the two portions of the piezoelectric layers, each of which is interposed between two electrodes of the electrodes constituting the electrodes 243, 244, 245, 246, 247 and 248, adjacent in the thickness direction of the rectangular plate 242 are opposite in the polarization directions in the thickness direction of the rectangular plate 242 and that the two portions of any piezoelectric layer, each of which is interposed between two electrodes of the electrodes constituting the electrodes 243, 244, 245, 246, 247 and 248, adjacent in the longitudinal direction of the rectangular plate 242 are opposite in the polarization directions in the thickness direction of the rectangular plate 242. It also suffices that the polarization directions near the electrodes 256 and 257 serving as the secondary electrodes differ in the longitudinal direction of the rectangular plate 242. If so, the same advantages as those described above can be attained.

Further, in FIG. 9(1), a case where the electrodes 244, 246 and 248 serving as the primary electrodes are common electrodes has been described. However, even if the electrodes 243, 245 and 247 serving as the primary electrodes are common electrodes, the same advantages as those described above can be attained.

Moreover, in FIG. 9(1), the number of piezoelectric layers is five. However, they are not limited thereto. Even if the number of piezoelectric layers changes, only the capacity of the primary electrodes changes and the advantages attained are the same as those described in this embodiment.

Besides, in this embodiment, a case where the rectangular plate is made of a piezoelectric ceramic has been described. However, even if the rectangular plate is made of piezoelectric crystals such as lithium niobate, the same advantages as those if the rectangular plate is made of a piezoelectric ceramic can be attained by setting the polarization directions as c axis directions.

Fourth Embodiment

Figure 10:
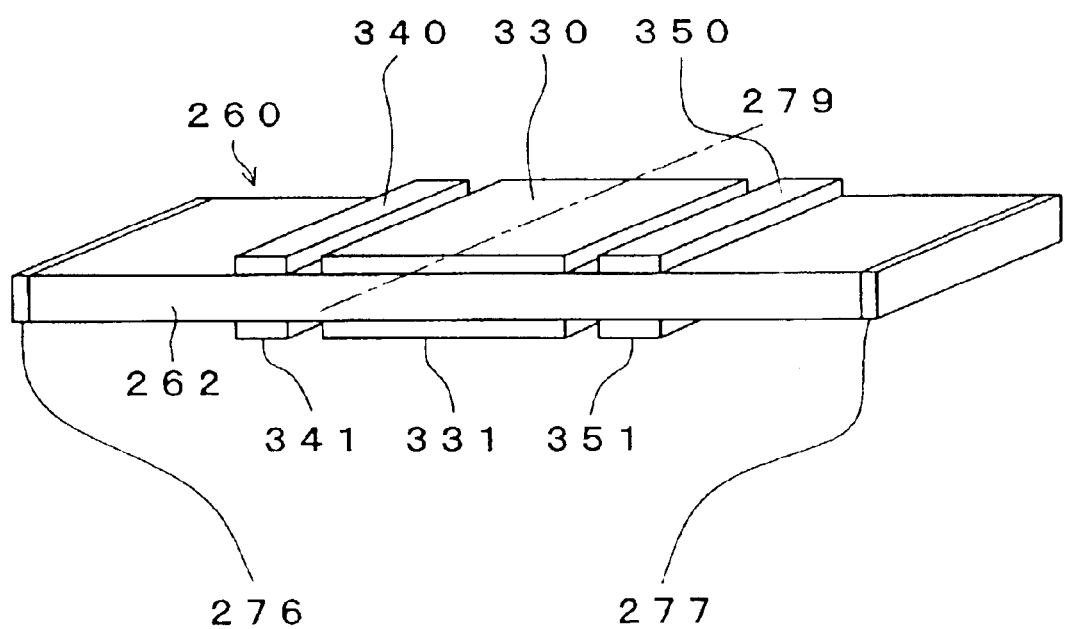
FIG. 10 is a perspective view of a piezoelectric transformer of the fourth embodiment according to the present invention.
Figure 11:
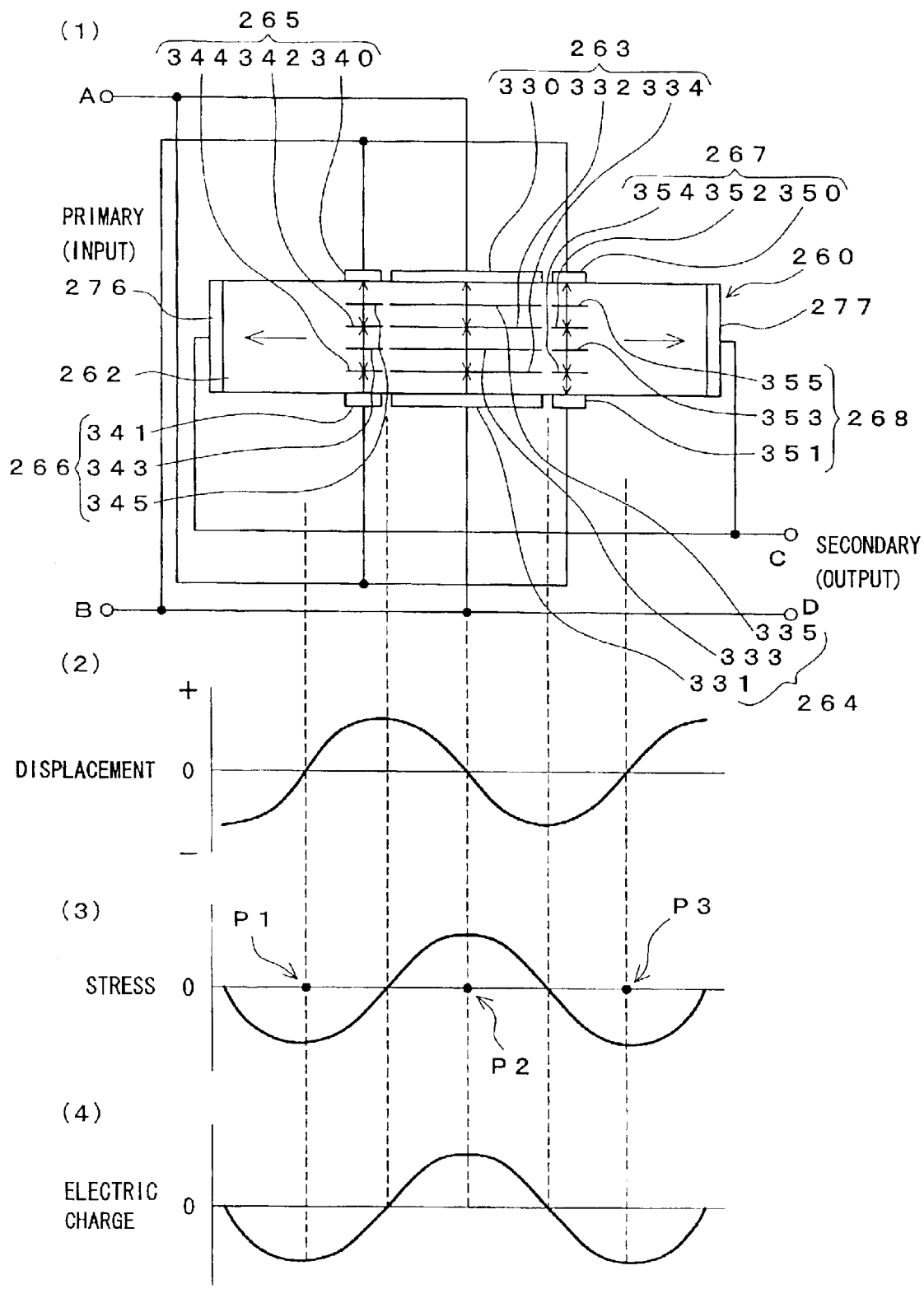
FIG. 11(1) is a side view of the piezoelectric transformer of FIG. 10, and FIGS. 11(2), 11(3) and 11(4) show a displacement distribution, a stress distribution and an electric charge distribution of the piezoelectric transformer of FIG. 10, respectively.

FIG. 10 is a perspective view of a piezoelectric transformer having the 3λ/2 longitudinal extensional vibration mode according to the fourth embodiment of the present invention. FIG. 11(1) is a side view of the piezoelectric transformer shown in FIG. 10. In FIGS. 10 and 11(1), the piezoelectric transformer 260 includes a rectangular plate 262 made of a piezoelectric material. Primary (input) electrodes consisting of a plurality of electrodes in the length and thickness directions of the rectangular plate 262 are formed near the central portion of the rectangular plate 262 in the longitudinal direction thereof. Primary electrodes have multilayer structures in which piezoelectric layers made of piezoelectric material such as piezoelectric ceramic and internal electrode layers made of metal material are alternately layered.

In FIG. 11(1), five piezoelectric layers and four electrodes layers are present between two electrodes, which are components of the primary electrodes, opposed each other on two main surfaces of the rectangular plate 262 perpendicular to the thickness direction thereof. Electrodes 330, 340 and 350 are formed on one of the main surfaces of the rectangular plate 262 perpendicular to the thickness direction thereof. Electrodes 331, 341 and 351 are formed on the other main surface of the rectangular plate 262 perpendicular to the thickness direction thereof. Further, electrodes 332, 333, 334, 335, 342, 343, 344, 345, 352, 353, 354 and 355 are formed in the rectangular plate 262. The electrodes 330, 331, 332, 333, 334 and 335 are opposed one another in the thickness direction of the rectangular plate 262. The electrodes 340, 341, 342, 343, 344 and 345 are opposed one another in the thickness direction of the rectangular plate 262. The electrodes 350, 351, 352, 353, 354 and 355 are opposed one another in the thickness direction of the rectangular plate 262. The electrodes 330, 332 and 334 are electrically connected to one another to constitute an electrode 263, and the electrodes 331, 333 and 335 are electrically connected to one another to constitute an electrode 264. Likewise, the electrodes 340, 342 and 344 are electrically connected to one another to constitute an electrode 265, and the electrodes 341, 343 and 345 are electrically connected to one another to constitute an electrode 266. The electrodes 350, 352 and 354 are electrically connected to one another to constitute an electrode 267, and the electrodes 351, 353 and 355 are electrically connected to one another to constitute an electrode 268. The each center line of the respective electrodes constituting the electrodes 263 and 264 substantially coincides with the center line 279 of the rectangular plate 262. Electrodes 276 and 277 serving as secondary (output) electrodes are formed on two end faces of the rectangular plate 262 in the longitudinal direction thereof, respectively. The electrodes 330, 331, 340, 341, 350, 351, 276 and 277 are made of metal such as silver, nickel or gold and formed by a method such as evaporation, sputtering, printing or plating.

In FIG. 11(1), arrows indicated on the rectangular plate 262 show the polarization direction of the piezoelectric material, respectively. The polarization directions are in the thickness direction of the rectangular plate 262 in the portions of the piezoelectric layers interposed between the electrode 330 and the electrode 331, the portions of the piezoelectric layers interposed between the electrode 340 and the electrode 341, and the portions of the piezoelectric layers interposed between the electrode 350 and the electrode 351. Any two portions of the piezoelectric layers, each of which is interposed between two electrodes, adjacent in the thickness direction of the rectangular plate 262 are opposite in the polarization direction.

The fourth embodiment further differs from the third embodiment in that any two portions of the piezoelectric layer, each of which is interposed between two electrodes, adjacent in the longitudinal direction of the rectangular plates 262 are the same in the polarization direction in the thickness direction of the rectangular plate 262. The region between the electrodes 265 and 266 and the electrode 276 and that between the electrodes 267 and 268 and the electrode 277 are respectively polarized in the longitudinal direction of the rectangular plate 262 and the polarization directions of the region are opposite each other. Polarization treatments are performed by applying appropriate high direct current voltages to the respective regions.

The operation of the piezoelectric transformer 260 will next be described. In FIG. 11(1), the electrodes 263, 266 and 268 serving as the primary electrodes are electrically connected to one another and connected to a terminal A. The electrodes 264, 265 and 267 serving as the other primary electrodes are electrically connected to one another and connected, as common electrodes, to terminals B and D. Further, the electrodes 276 and 277 serving as the secondary electrodes are electrically to each other and connected to a terminal C. If an alternating voltage having a frequency near a resonance frequency for generating mechanical vibrations to expand and contract the rectangular plate 262 in the longitudinal direction thereof is applied between the terminals A and B as an input voltage, the mechanical vibrations to expand and contract the rectangular plate 262 in the longitudinal direction thereof are excited on the piezoelectric transformer 260. The excited mechanical vibrations are converted to a voltage by the piezoelectric effect, and a high voltage can be thereby fetched between the terminals C and D as an output voltage in accordance with the impedance ratio between the primary and secondary electrodes.

FIG. 11(2) shows the displacement distribution of the piezoelectric transformer 260 in the longitudinal direction at a certain point of time while extensional vibrations of the 3/2 wavelength are generated on the piezoelectric transformer 260 in the longitudinal direction thereof. In FIG. 11(2), the horizontal axis indicates the position in the piezoelectric transformer 260 in the longitudinal direction, and the vertical axis indicates the displacement of the piezoelectric transformer 260 in the longitudinal direction thereof caused by the mechanical vibration thereof at a certain instance. On the vertical axis, +direction indicates the right displacement of the piezoelectric transformer 260 in the longitudinal direction thereof and −direction indicates the left displacement of the piezoelectric transformer 260 in the longitudinal direction thereof. Further, FIGS. 11(3) and 11(4) show the internal stress distribution of the rectangular plate 262 and the electric charge distribution induced by the vibration when the piezoelectric transformer 260 has the displacement distribution shown in FIG. 11(2), respectively. In FIG. 11(3), the horizontal axis indicates the position in the piezoelectric transformer 260 in the longitudinal direction thereof, and the vertical axis indicates the magnitude of the internal stress generated in the piezoelectric transformer 260 in compression/expansion direction alon the length direction thereof. In FIG. 11(4), the horizontal axis indicates the position in the piezoelectric transformer 260 in the longitudinal direction thereof and the vertical axis indicates the positive/negative polarity and quantity of the electric charges induced by the vibration.

In the piezoelectric transformer 260 in this embodiment, the portions of any piezoelectric layer, each of which is interposed between two electrodes of the primary electrodes, adjacent in the longitudinal direction of the rectangular plate 262 are same in the polarization direction in the thickness direction thereof. Thus, clacks can be prevented from generating in the rectangular plate 262. The clacks are caused by the internal strains which are generated at the gaps between the electrodes of the primary electrodes in the longitudinal direction of the rectangular plate 262 by applying opposite high electric fields in the thickness direction of the rectangular plate 262 to adjacent regions of the rectangular plate 262 interposed between the electrodes of the primary electrodes during the polarization treatment (The gaps are a part of rectangular plate 262 between a region thereof interposed between the electrodes 263 and 264 and a region thereof interposed between the electrodes 265 and 266, and a part thereof between a region thereof interposed between the electrodes 263 and 264 and a region thereof interposed between the electrodes 267 and 268). Besides, the residual strains after the polarization treatment are smaller in the gaps above described and there are fewer parts in which the polarization directions are discontinuous than in the piezoelectric transformer 240 in the third embodiment. Thus, it is possible to realize a piezoelectric transformer having high mechanical strength.

Moreover, as shown in FIG. 11(1), in the piezoelectric transformer 260 in this embodiment, the two portions of the piezoelectric layer, each of which is interposed between two electrodes of primary electrodes, adjacent in the longitudinal direction of the rectangular plate 262 are the same in the polarization directions in the thickness direction thereof. However, the primary electrodes is constituted of the electrodes 264, 265 and 267, the other primary electrodes are constituted of the electrodes 263, 266 and 268, and the phase of the alternating voltage applied between the electrodes 263 and 264 differs by 180 degrees from the phases of the alternating voltages applied between the electrodes 265 and 266, and between the electrodes 267 and 268. Thus, as shown in FIG. 11(4), the electric charges induced by the vibrations are equal in polarity and do not cancel one another. Besides, the length of the primary electrode can be regarded as almost a sum of lengths of the electrodes aligned in the longitudinal direction of the rectangular plate 262 Therefore, in this embodiment, it is possible to set the length of the primary electrode relatively longer. Accordingly, it is possible to set the effective electromechanical coupling factor $k_{eff}$ of the piezoelectric transformer in this embodiment higher than that of the conventional piezoelectric transformer and to increase the power which can be handled by the piezoelectric transformer per unit volume.

Further, because of the piezoelectric transformer 260 having the $3\lambda/2$ longitudinal extensional vibration mode, the amplitudes of the mechanical vibrations can be decreased to hold down elastic strains, and driving frequency can be increased. Thus, the power handled by the piezoelectric transformer 260 for one vibration can be decreased and the number of times of vibrations can be increased, which enables the piezoelectric transformer 260 to handle high power.

Furthermore, in the piezoelectric transformer 260 in this embodiment, in the $3\lambda/2$ longitudinal extensional vibration mode shown in FIG. 11(2), parts in which high stresses are generated (points P1, P2 and P3) do not coincide with parts in which polarization directions are discontinuous (a part of the rectangular plate 262 between a region thereof interposed between the electrodes 263 and 264 and a region thereof interposed between the electrodes 265 and 266, a part of the rectangular plate 262 between a region thereof interposed between the electrodes 263 and 264 and a region thereof interposed between the electrodes 267 and 268, a part of the rectangular plate 262 near an electrode 276-side end of the region thereof interposed between the electrodes 265 and 266, and a part of the rectangular plate 262 near an electrode 277-side end of the region thereof interposed between the electrodes 267 and 268). That is, as in the case of the first, second and third embodiments according to the present invention, in normal operation, high stresses or strains are not generated on the parts in which the polarization directions are discontinuous and mechanical strengths are low. Therefore, the piezoelectric transformer in this embodiment can handle a high power and can realize a piezoelectric transformer having high reliability.

In the piezoelectric transformer 260 in this embodiment, primary electrodes have the multilayer structures as described above. Thus, the capacitance of the primary electrodes of the piezoelectric transformer 260 can be set larger than that of the primary electrodes of the piezoelectric transformers according to the first and second embodiments of the present invention. Therefore, in the piezoelectric transformer 260 in this embodiment as well as the piezoelectric transformer 240 in the third embodiment, the capacity $C_{01}$ of the primary electrodes can be set larger, than in piezoelectric transformers in the first and second embodiments of the present invention, making it possible to obtain a high step-up ratio $\gamma$.

It is noted that the polarization directions of the piezoelectric transformer 260 shown in FIG. 11(1) are not limited to those shown therein. It suffices that the two portions of the piezoelectric layers, each of which is interposed between two electrodes of primary electrodes, adjacent in the thickness direction of the rectangular plate 262 are opposite in the polarization directions in the thickness direction of the rectangular plate 262 and that the two portions of any piezoelectric layer, each of which is interposed between two electrodes of primary electrodes, adjacent in the longitudinal direction of the rectangular plate 262 are the same in the polarization directions in the thickness direction of the rectangular plate 262. It also suffices that the polarization directions near the electrodes 276 and 277 serving as the secondary electrodes differ in the longitudinal direction of the rectangular plate 262. If so, the same advantages as those described above can be attained.

Further, in FIG. 11(1), a case where the electrodes 264, 265 and 267 serving as the primary electrodes are common electrodes has been described. However, even if the electrodes 263, 265 and 268 serving as the primary electrodes are common electrodes, the same advantages as those described above can be attained.

Moreover, in FIG. 11(1), the number of piezoelectric layers is five. However, they are not limited thereto. Even if the number of piezoelectric layers changes, only the capacity of the primary electrodes change and the advantages attained are the same as those described in this embodiment.

Besides, in this embodiment, a case where the rectangular plate is made of a piezoelectric ceramic has been described. However, even if the rectangular plate is made of piezoelectric crystals such as lithium niobate, the same advantages as those if the rectangular plate is made of a piezoelectric ceramic can be attained by setting the polarization directions as c axis directions.

Fifth Embodiment

Figure 13:
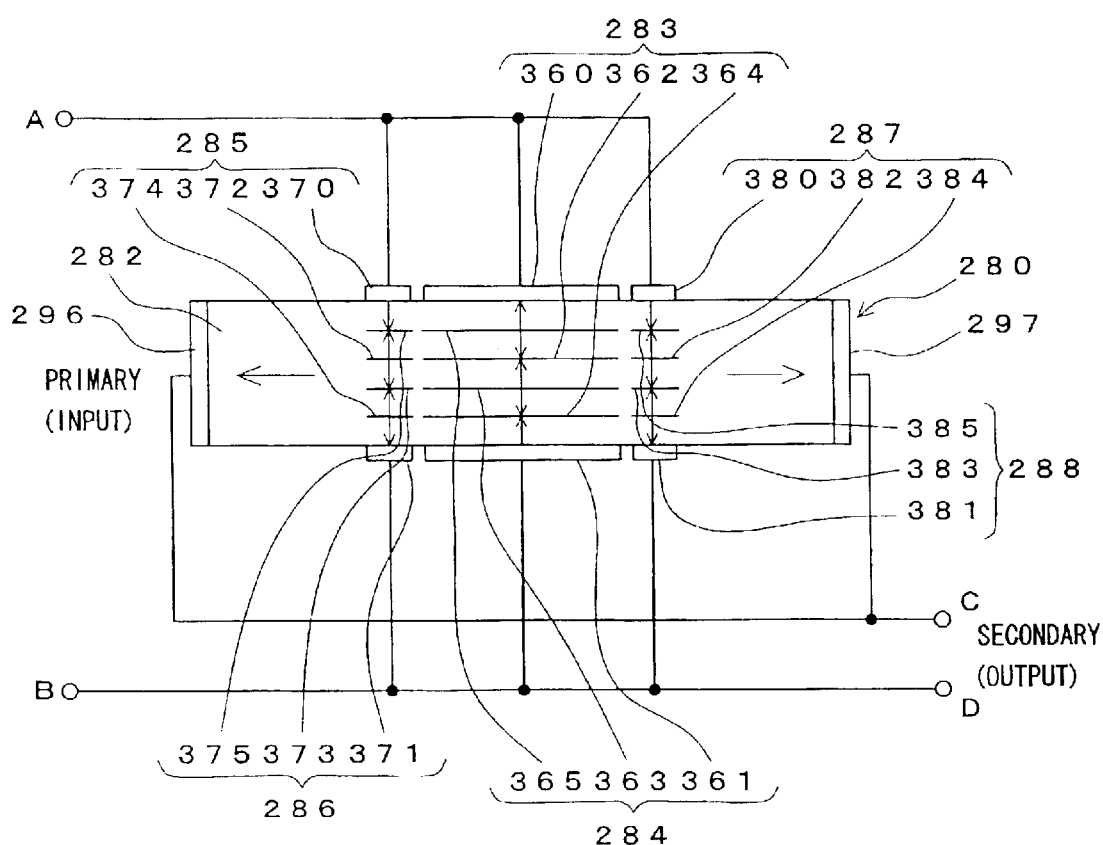
FIG. 13 is a side view of the piezoelectric transformer of FIG. 12(1)
Figure 14:
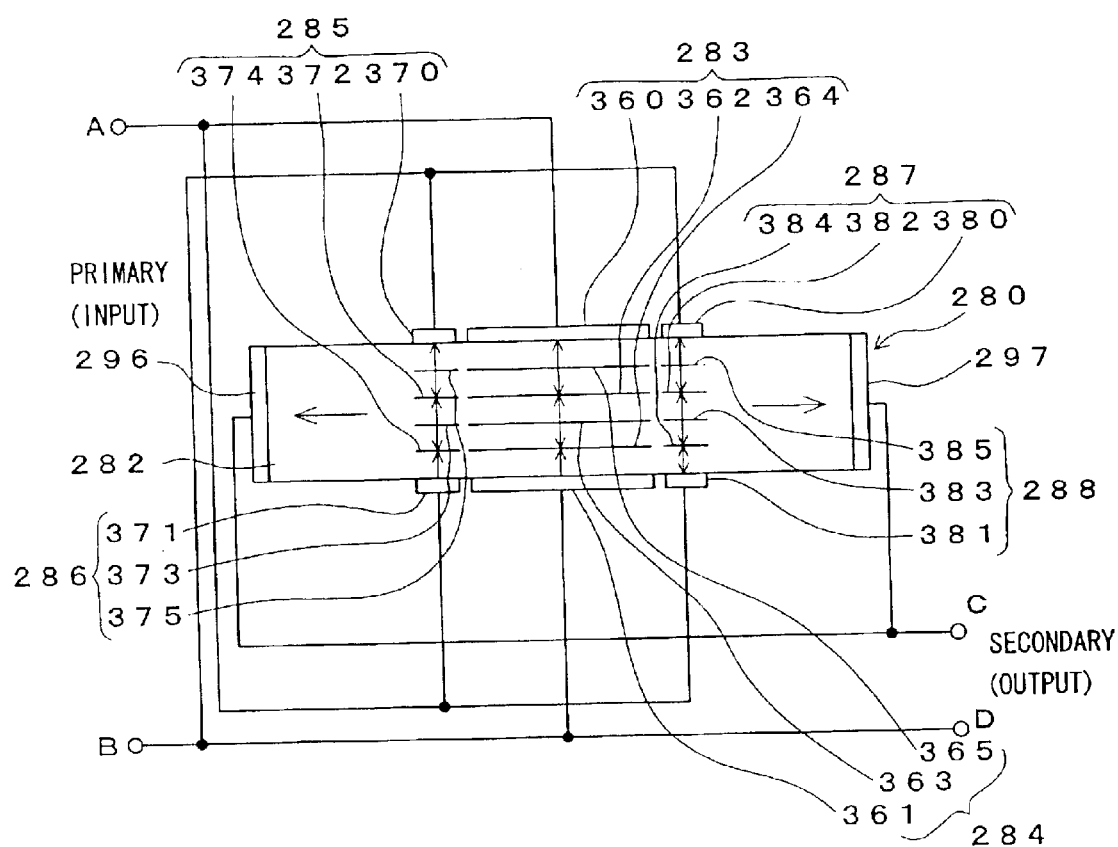
FIG. 14 is a side view of another example of the piezoelectric transformer of FIG. 12(1)

FIG. 12(1) is a perspective view of a piezoelectric transformer having the $3\lambda/2$ longitudinal extensional vibration mode according to the fifth embodiment of the present invention. FIG. 12(2) is a cross-sectional view of the piezoelectric transformer 280 shown in FIG. 12(1) taken along a center line 299. FIGS. 13 and 14 are side views of the piezoelectric transformer 280, respectively. FIG. 12(3) shows a modification of the piezoelectric transformer 280, which is a cross-sectional view of the piezoelectric transformer 280 taken along the center line 299 as in the case of FIG. 12(2).

In FIGS. 12(1), 13 and 14, the piezoelectric transformer 280 includes a rectangular plate 282 made of a piezoelectric material. Primary (input) electrodes consisting of a plurality of electrodes in the length and thickness directions of the rectangular plate 282 are formed near the central portion of the rectangular plate 282 in the longitudinal direction thereof. Primary electrodes have multilayer structures in which piezoelectric layers made of piezoelectric material such as piezoelectric ceramic and internal electrode layers made of metal material are alternately layered. In FIGS. 12(2), 13 and 14, five piezoelectric layers and four electrode layers are present between the electrodes of the primary electrodes opposed each other on two main surfaces of the rectangular plates 282 perpendicular to the thickness direction thereof.

In FIG. 12(1), electrodes 360, 370 and 380 are formed on one of the main surfaces of the rectangular plates 282 perpendicular to the thickness direction thereof, and electrodes 361, 371 and 381 are formed on the other main surface of the rectangular plates 282 perpendicular to the thickness direction thereof. Electrodes 362, 363, 364, 365, 372, 373, 374, 375, 382, 383, 384 and 385 are formed in the rectangular plate 282. The electrodes 360, 361, 362, 363, 364 and 365 are opposed to one another in the thickness direction of the rectangular plate 282. The electrodes 370, 371, 372, 373, 374 and 375 are opposed to one another in the thickness direction of the rectangular plate 282. The electrodes 380, 381, 382, 383, 384 and 385 are opposed to one another in the thickness direction of the rectangular plate 282. As shown in FIG. 12(2), the electrodes 360, 362 and 364 are electrically connected to one another to constitute an electrode 283, and the electrodes 361, 363 and 365 are electrically connected to one another to constitute an electrode 284. Likewise, the electrodes 370, 372 and 374 are electrically connected to one another to constitute an electrode 285, and the electrodes 371, 373 and 375 are electrically connected to one another to constitute an electrode 286. The electrodes 380, 382 and 384 are electrically connected to one another to constitute an electrode 287, and the electrodes 381, 383 and 385 are electrically connected to one another to constitute an electrode 288. Each center line of the respective electrodes constituting the electrodes 283 and 284 substantially coincides with the center line 299 of the rectangular plate 282. Electrodes 296 and 297 serving as secondary (output) electrodes are formed on two end faces of the rectangular plate 282 in the longitudinal direction thereof, respectively. The electrodes 360, 361, 370, 371, 380, 381, 296 and 297 are made of metal such as silver, nickel or gold and formed by a method such as evaporation, sputtering, printing or plating.

FIG. 12(2) shows the multilayer structure between, for example, the electrodes 360 and 361 of the piezoelectric transformer 280 in the thickness direction of the rectangular plate 282. The electrodes 362 and 364 which are internal electrodes in the rectangular plate 282 are exposed to one end face of the rectangular plate 282 in the width direction thereof, the electrodes 363 and 365 which are internal electrodes in the rectangular plate 282 are exposed to the other end face of the rectangular plate 282 in the width direction thereof. As shown in FIG. 12(2), the electrodes 360, 362 and 364 are connected to one another by forming the electrode 360 into L shape, and the electrodes 361, 363 and 365 are connected to one another by forming the electrode 361 into L shape.

In FIGS. 12(2), 13 and 14, arrows indicated on the rectangular plate 282 show the polarization directions of the piezoelectric material, respectively. The polarization directions are in the thickness direction of the rectangular plate 282 in the portions of the piezoelectric layers interposed between the electrode 360 and the electrode 361, the portions of the piezoelectric layers interposed between the electrode 370 and the electrode 371, and the portions of the piezoelectric layers interposed between the electrode 380 and the electrode 381. Any two portions of the piezoelectric layers, each of which is interposed between two electrodes, adjacent in the thickness direction of the rectangular plate 282 are opposite in the polarization direction. In FIG. 13, two portions of any piezoelectric layer, each of which is interposed between two electrodes, adjacent in the longitudinal direction of the rectangular plate 282 are opposite in the polarization direction in the thickness direction of the rectangular plate 242. In FIG. 14, two portions of any piezoelectric layer, each of which is interposed between two electrodes, adjacent in the longitudinal direction of the rectangular plate 282 are opposite in the polarization direction in the thickness direction of the rectangular plate 242. The region of the rectangular plate 242 between the electrodes 285 and 286 and the electrode 296, and that between the electrodes 287 and 288 and the electrode 297 are respectively polarized in the longitudinal direction of the rectangular plate 282 and the polarization directions of the regions are opposite each other. Polarization treatments are performed by applying appropriate high direct current voltages to the respective regions.

The operation of the piezoelectric transformer 280 will next be described. In FIG. 13, the electrodes 283, 285 and 287 serving as the primary electrodes are electrically connected to one another and connected to a terminal A. The electrodes 284, 286 and 288 serving as the other primary electrodes are electrically connected to one another and connected, as common electrodes, to terminals B and D. In FIG. 14, the electrodes 283, 286 and 288 serving as the primary electrodes are electrically connected to one another and connected to a terminal A. The electrodes 284, 285 and 287 serving as the other primary electrodes are electrically connected one another and connected, as common electrodes, to terminals B and D. Further, in FIGS. 13 and 14, the electrodes 296 and 297 serving as the secondary electrodes are electrically connected to each other and connected to a terminal C.

In FIGS. 13 and 14, if an alternating voltage having a frequency near a resonance frequency for generating mechanical vibrations to expand and contract the rectangular plate 282 in the longitudinal direction thereof is applied between the terminals A and B as an input voltage, the mechanical vibrations to expand and contract the rectangular plate 282 in the longitudinal direction thereof are exited on the piezoelectric transformer 280. The excited mechanical vibrations are converted to a voltage by the piezoelectric effect, and a high voltage can be thereby fetched between the terminals C and D as an output voltage in accordance with the impedance ratio between the primary and secondary electrodes. Although the piezoelectric transformer shown in FIG. 13 and that shown in FIG. 14 are differ in the combinations of the connection of the electrodes 283, 284,

285, 286, 287 and 288, they are the same in the behaviors when the alternating voltages are applied.

In the piezoelectric transformer 280 in this embodiment, the electrodes formed in the rectangular plate 282 are exposed to the end faces of the rectangular plate 282 in the width direction thereof. This can facilitate the electrically connection between the internal electrodes in the rectangular plate 282 and the electrodes formed on the main surfaces of the rectangular plate 282 perpendicular to the thickness direction thereof FIG. 12(3) is a cross-sectional view of the piezoelectric transformer 280 taken along the center line 299 if no electrode is formed on the main surfaces of the rectangular plate 282. In the piezoelectric transformer 280, the odd-numbered internal electrodes in the rectangular plate 282 (e.g., the electrodes 365 and 363) are exposed to one end face of the rectangular plate 282 in the width direction thereof and the even-numbered internal electrodes in the rectangular plate 282 (e.g., the electrodes 362 and 364) are exposed to the other end face of the rectangular plate 282 in the width direction thereof. Thus, it is possible to connect only the internal electrodes in the rectangular plate 282 with one another without forming electrodes on the main surfaces of the rectangular plate 282. In FIG. 12(3), the electrodes 360 and 361 are formed not into L shape but into flat plate shape, and provided only on the end faces of the piezoelectric transformer 280 in the width direction thereof. Further, no polarization exists on the outermost and lowermost piezoelectric layers of the multilayer structure. The same is true of the electrodes 370 and 371, and electrodes 380 and 381. As described above, by arranging the rectangular plate 282 on the main surfaces of which no electrode is provided, the main surfaces of the piezoelectric transformer can be electrically isolated. In this embodiment, primary electrodes have multilayer structures in each of which the piezoelectric layers and the electrode layers are alternately layered. As shown in FIGS. 12(2) and 12(3), the two adjacent piezoelectric layers are not completely separated by the electrode layer but connected to each other on the end portions thereof. That is, any two adjacent piezoelectric layers form a U-shaped structure. This is because the adjacent piezoelectric layers fuse together when piezoelectric layers and the electrode layers are layered and attached by pressure in piezoelectric transformer manufacturing steps.

In piezoelectric transformer 280 in this embodiment, primary electrodes have the layered structures as described above. Thus, as in the case of the piezoelectric transformers in the third and fourth embodiments, the capacity of the primary electrodes of the piezoelectric transformer. 280 can be set larger than that of the primary electrodes of the piezoelectric transformers in the first and second embodiments. Accordingly, the capacity $C_{o1}$ of the primary electrodes of the piezoelectric transformer 280 in this embodiment can be set larger than that of the primary electrodes of the piezoelectric transformers in the first and second embodiments of the present invention, making it possible to obtain a high step-up ratio $\gamma$.

Further, because the piezoelectric transformer 280 according to this embodiment has the $3\lambda/2$ longitudinal extensional vibration mode, the amplitudes of the mechanical vibrations can be decreased to hold down elastic strains, and the driving frequency can be increased. Thus, the power handled by the piezoelectric transformer 280 for one vibration cab be decreased and the number of times of vibrations can be increased, which enables the piezoelectric transformer 280 to handle a high power. In addition, parts in which high stresses are generated do not coincide with parts in which polarization directions are discontinuous as in the case of the piezoelectric transformers in the third and fourth embodiments. That is, in normal operation, high stresses or strains are not generated on the parts in which the polarization directions are discontinuous and mechanical strengths are low. Therefore, the piezoelectric transformer in this embodiment can handle a high power and can realize a piezoelectric transformer having high reliability.

Besides, in the piezoelectric transformer 280 in this embodiment, as in the case of those in the first, second, third and fourth embodiments, the length of the primary electrode can be set relatively large. And the electric charges induced by the vibrations are equal in polarity and do not cancel one another. Therefore, it is possible to set the effective electromechanical coupling factor $k_{eff}$ of the piezoelectric transformer 280 higher than that of the conventional piezoelectric transformer and to increase the power which the piezoelectric transformer can handle per unit volume.

It is noted that the polarization directions of the piezoelectric transformer 280 shown in FIGS. 13 and 14 are not limited to those shown therein. It suffices that the two portions of the piezoelectric layers, each of which is interposed between two electrodes of the primary electrodes, adjacent in the thickness direction of the rectangular plate 282 are opposite in the polarization directions in the thickness direction of the rectangular plate 282 and that the two portions of any piezoelectric layer, each of which is interposed between two electrodes of primary electrodes, adjacent in the longitudinal direction of the rectangular plate 282 are opposite in the polarization directions in the thickness direction of the rectangular plate 282 in the piezoelectric transformer in FIG. 13. It suffices that the two portions of the piezoelectric layers, each of which is interposed between two electrodes of the primary electrodes, adjacent in the thickness direction of the rectangular plate 282 are opposite in the polarization directions in the thickness direction of the rectangular plate 282 and that the two portions of the piezoelectric layer, each of which is interposed between two electrodes of primary electrodes, adjacent in the longitudinal direction of the rectangular plate 282 are the same in the polarization directions in the thickness direction of the rectangular plate 282 in the piezoelectric transformer in FIG. 14. It also suffices that the polarization directions near the electrodes 296 and 297 serving as the secondary electrodes differ in the longitudinal direction of the rectangular plate 282. If so, the same advantages as those described above can be attained.

Further, in FIG. 13, a case where the electrodes 284, 286 and 288 serving as the primary electrodes are common electrodes has been described. However, even if the electrodes 283, 285 and 287 serving as the primary electrodes are common electrodes, the same advantages as those described above can be attained.

Moreover, in FIGS. 13 and 14, the number of piezoelectric layers is five. However, they are not limited thereto. Even if the number of piezoelectric layers changes, only the capacity of the primary electrodes change and the advantages attained are the same as those described in this embodiment.

Besides, in this embodiment, a case where the rectangular plate is made of a piezoelectric ceramic has been described. However, even if the rectangular plate is made of piezoelectric crystals such as lithium niobate, the same advantages as those if the rectangular plate 282 is made of a piezoelectric ceramic can be attained by setting the polarization directions as c axis directions.

Sixth Embodiment

Figure 15:
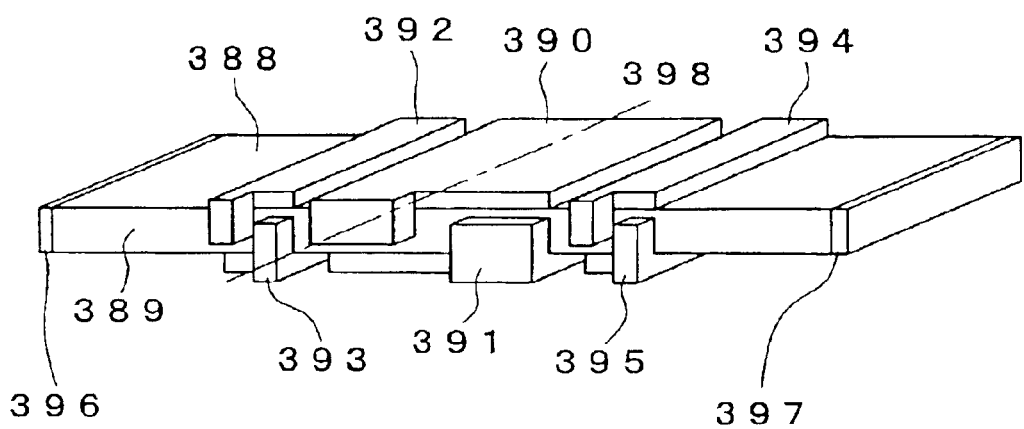
FIG. 15 is a perspective view of a piezoelectric transformer of the sixth embodiment according to the present invention.
Figure 16:
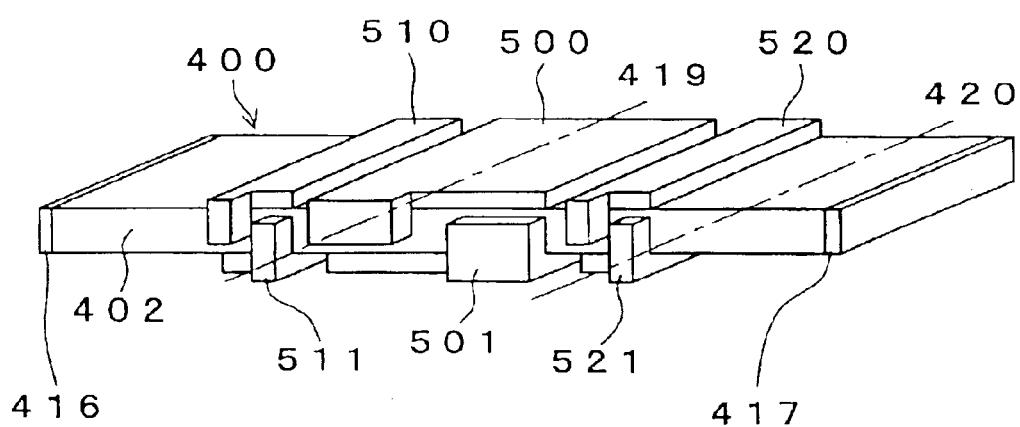
FIG. 16 is a perspective view of another example of the piezoelectric transformer of the sixth embodiment according to the present invention.
Figure 17:
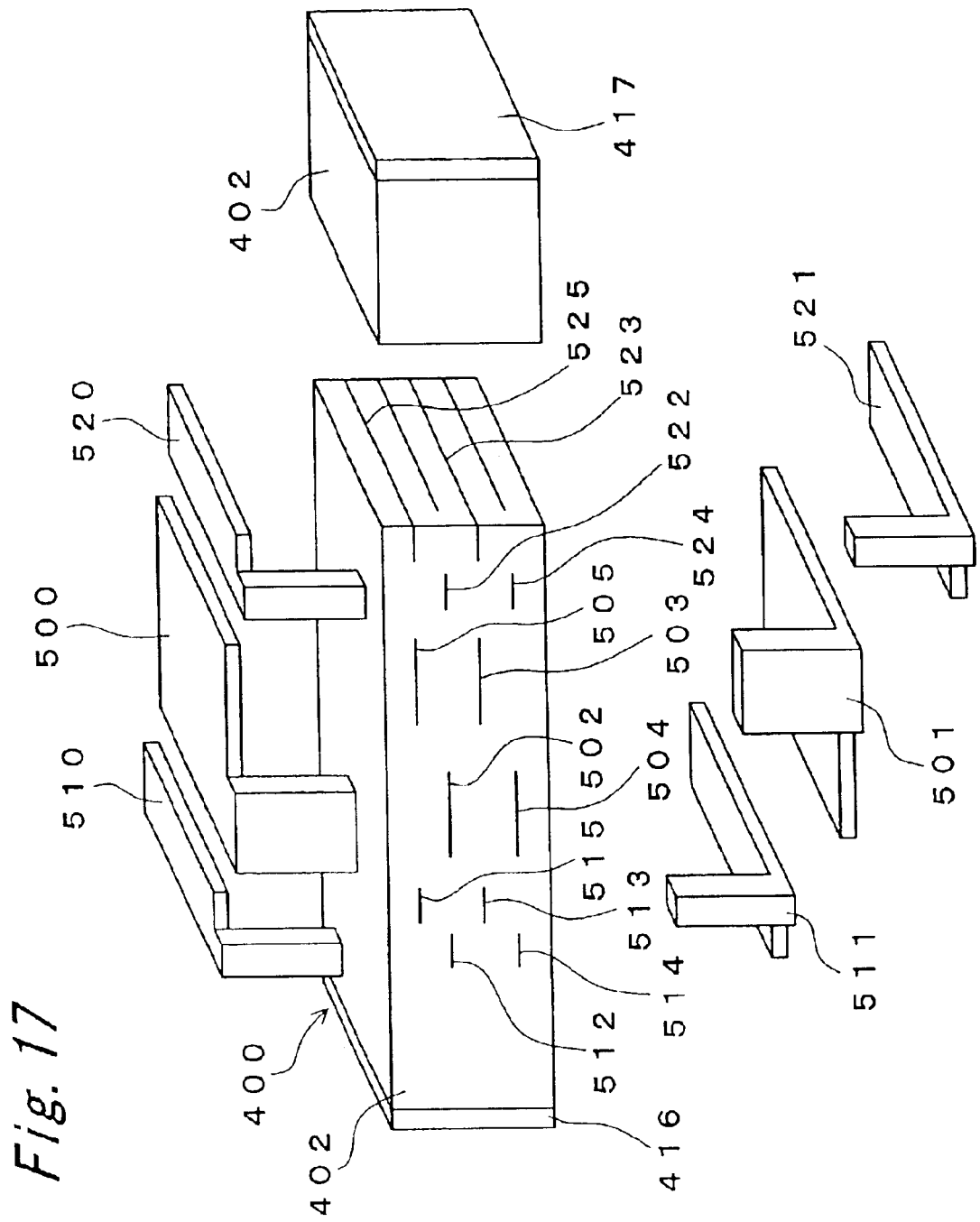
FIG. 17 is a perspective view of the piezoelectric transformer of FIG. 16, showing the connection between the electrodes of the piezoelectric transformer.

FIGS. 15 and 16 are perspective view of a piezoelectric transformer having the $3\lambda/2$ longitudinal extensional vibration mode according to the sixth embodiment of the present invention. FIG. 17 is an exploded view of the piezoelectric transformer 400 shown in FIG. 16. FIG. 17 also shows the cross-sectional structure of the piezoelectric transformer 400 along a line 420 shown in FIG. 16.

In FIG. 15, the piezoelectric transformer 388 includes a rectangular plate 389 made of a piezoelectric material. Primary (input) electrodes are formed on two main surfaces of the rectangular plate 389 perpendicular to the thickness direction thereof. The primary electrode consisting of electrodes 390, 392 and 394 is formed on one of the main surfaces of the rectangular plate 389, and the primary electrode consisting of electrodes 391, 393 and 395 is formed on the other main surface thereof. Each center line of the electrodes 390 and 391 substantially coincides with the center line 398 of the rectangular plate 389. The electrodes 390 and 391, the electrodes 392 and 393, and the electrodes 394 and 395 are formed to be opposed each other in the thickness direction of the rectangular plate 389, respectively. On the two end faces of the rectangular plate 389 in the longitudinal direction thereof, electrodes 396 and 397 are formed as secondary (output) electrodes, respectively. The electrodes 390, 391, 392, 393, 394, 395, 396 and 397 are made of metal such as silver, nickel or gold and formed by a method such as evaporation, sputtering, printing or plating.

In FIGS. 16 and 17, the piezoelectric transformer 400 includes a rectangular plate 402 made of a piezoelectric material. Primary (input) electrodes consisting of a plurality of electrodes in the length and thickness directions of the rectangular plate 402 are formed near the central portion of the rectangular plate 402 in the longitudinal direction thereof. Primary electrodes have multilayer structures in which piezoelectric layers made of piezoelectric material such as piezoelectric ceramic and internal electrode layers made of metal material are alternately layered. In FIG. 16, electrodes 500, 510 and 520 are formed on one of the main surfaces of the rectangular plate 402 perpendicular to the thickness direction thereof, and electrodes 501, 511 and 521 are formed on the other main surface of the rectangular plate 402 perpendicular to the thickness direction thereof. As shown in FIG. 17, five piezoelectric layers and four electrode layers are present between the electrodes of the primary electrodes opposed each other on the two main surfaces of the rectangular plate 402 perpendicular to the thickness direction thereof. Further, electrodes 502, 503, 504, 505, 512, 513, 514, 515, 522, 523, 524 and 525 are formed in the rectangular plate 402. The electrodes 500, 501, 502, 503, 504 and 505 are opposed to one another in the thickness direction of the rectangular plate 402. The electrodes 510, 511, 512, 513, 514 and 515 are opposed to one another in the thickness direction of the rectangular plate 402. The electrodes 520, 521, 522, 523, 524 and 525 are opposed to one another in the thickness direction of the rectangular plate 402. Each center line of the electrodes 500 and 501 substantially coincides with the center line 419 of the rectangular plate 402. Electrodes 416 and 417 serving as secondary (output) electrodes are formed on the two end faces of the rectangular plate 402 in the longitudinal direction thereof, respectively. The electrodes 500, 501, 510, 511, 520, 521, 416 and 417 are made of metal such as silver, nickel or gold and formed by a method such as evaporation, sputtering, printing or plating.

As shown in FIG. 17, a part of each of the internal electrodes in the rectangular plate 402 are exposed to one of the end faces of the rectangular plate 402 in the width direction thereof in the piezoelectric transformer 400 according to this embodiment. In addition, the part of the electrode 502 and that of the electrode 504, the part of the electrode 503 and that of the electrode 505, the part of the electrode 512 and that of the electrode 514, the part of the electrode 513 and that of the electrode 515, the part of the electrode 522 and that of the electrode 524, and the part of the electrode 523 and that of the electrode 525 are respectively exposed to different regions in the longitudinal direction of the rectangular plate 402 on the end face thereof in the width direction thereof. Accordingly, even if the electrodes 500, 501, 502, 503, 504 and 505 are formed to be opposed in the thickness direction of the rectangular plate 402, it is possible to connect electrically the electrode 500 formed on the surface of the rectangular plate 402 with the electrodes 502 and 504 which are the internal electrodes by forming the electrode 500 to extend to the end face of the rectangular plate 402 in the width direction thereof, and to connect electrically the electrode 501 formed on the surface of the rectangular plate 402 with the electrodes 503 and 504 which are the internal electrodes on the same end face, independently of the electrical connection between the electrodes 500, 502 and 504, by forming the electrode 501 to extend to the end face of the rectangular plate 402 in the width direction thereof as shown in FIG. 17. Likewise, the electrodes 510, 512, and 514 are electrically connected to one another and the electrodes 511, 513 and 515 are electrically connected to one another on the same end face. In addition, the electrodes 520, 522, and 524 are electrically connected to one another and the electrodes 521, 523 and 525 are electrically connected to one another on the same end face.

In the piezoelectric transformers 388 this embodiment, the positive and negative electrodes of the primary electrodes are formed only on one end face of the rectangular plate 389 in the width direction thereof. And in the piezoelectric transformer 400 in this embodiment, the positive and negative electrodes of the primary electrodes are formed only on one end face of the rectangular plates 402 in the width direction thereof. Thus, it is possible to facilitate the electrical connection of the primary electrodes of the piezoelectric transformer to exterior. If the electrodes as primary electrodes are taken out using leads in piezoelectric transformer manufacturing steps, for example, a step of rotating the piezoelectric transformer to do the connections on the two surfaces of the piezoelectric transformer becomes unnecessary, making it possible to reduce manufacturing time.

In the piezoelectric transformer 400 in this embodiment, the electrodes formed on the surface of the rectangular plate 402 can be electrically connected to the corresponding internal electrodes in the rectangular plate 402 only on one end face of the rectangular plate 402 in the width direction thereof. As shown in FIG. 17, if the primary electrodes have multilayer structures consisting of a plurality of piezoelectric layers and a plurality of electrode layers, it is possible to connect the electrode formed on the surface of the rectangular plate 402 to the electrodes inside of the rectangular plate 402 only on one surface by exposing the parts of the electrodes inside of the rectangular plate 402 to one end face of the rectangular plate 402 in the width direction thereof.

As already described in the fifth embodiment, in the piezoelectric transformer 388 in this embodiment, if the internal electrodes in the rectangular plate 389 are exposed to the end face of the rectangular plate 388 in the width direction thereof, it is possible to connect only the internal electrodes in the rectangular plates 389 to one another without forming electrodes on the main surfaces of the rectangular plate 388. In that case, it is possible to advantageously facilitate the electrical connection between exterior and the primary electrodes of the piezoelectric transformer.

Moreover, the shapes of the electrodes 390, 391, 392, 393, 394 and 395 formed on the surfaces of the piezoelectric transformer 388 in this embodiment may be applied to those of the primary electrodes of the piezoelectric transformers in the first and second embodiments according to the present invention. In that case, as in the case of this embodiment, the positive and negative electrodes of the primary electrodes are formed on one end face of the rectangular plate in the width direction thereof, making it possible to facilitate the electrical connection between exterior and the primary electrodes of the piezoelectric transformer. In that case, it is possible to attain the same advantages as those described in this embodiment while holding the advantages of the piezoelectric transformers in the respective embodiments.

The connection between the electrodes formed on the surfaces of the rectangular plate 402 and the internal electrodes in it as described in this embodiment can be applied to the piezoelectric transformers in the third and fourth embodiments, respectively, by changing the shapes of the electrodes formed on the surfaces of the rectangular plate and exposing the internal electrodes in the rectangular plate to one end face of the rectangular plate. In that case, it is possible to attain the same advantages as those described in this embodiment while holding the advantages of the piezoelectric transformers in the respective embodiments.

Seventh Embodiment

Figure 18:
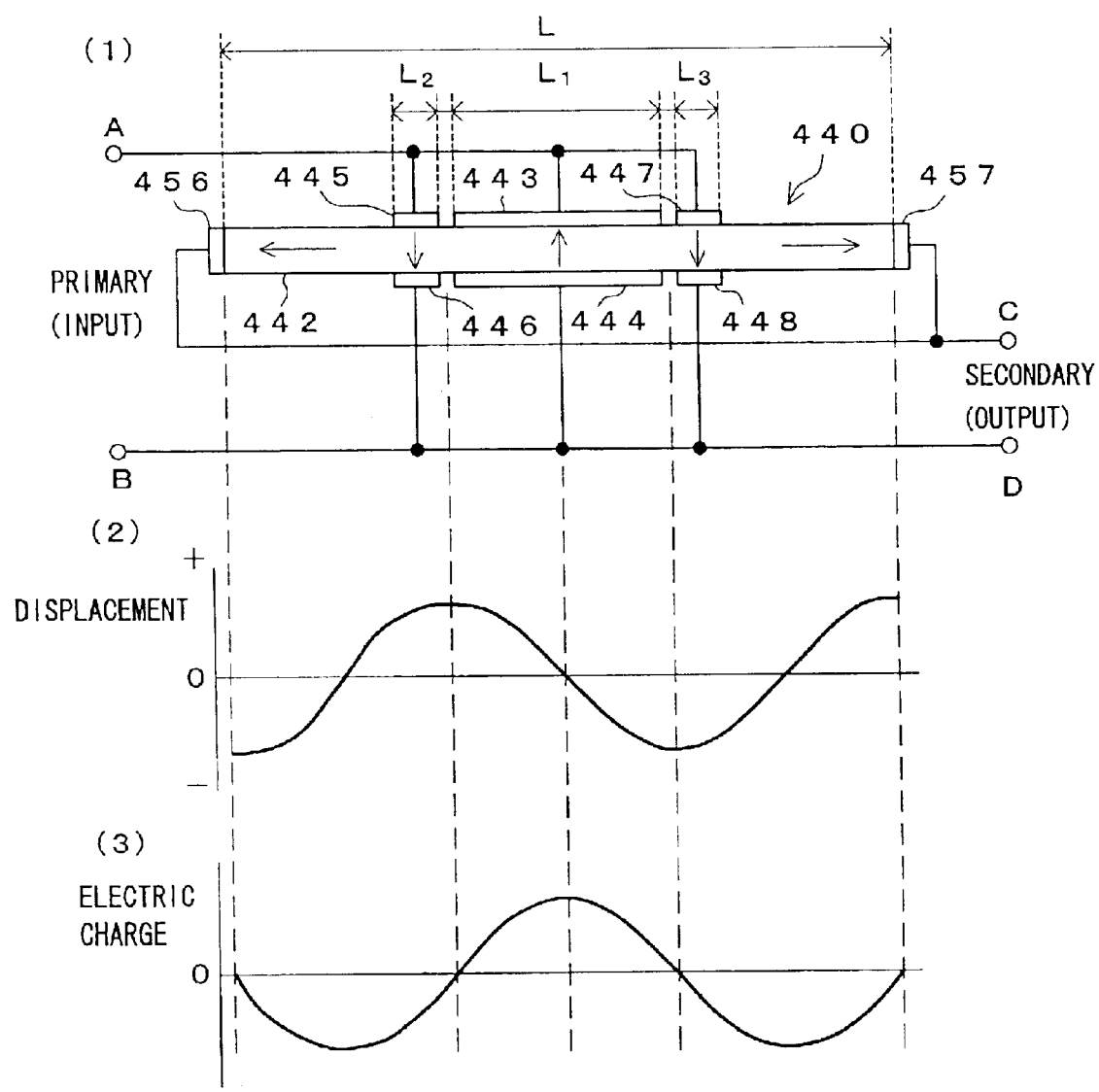
FIG. 18(1) is a side view of a piezoelectric transformer of the seventh embodiment according to the present invention, and FIGS. 18(2) and 18(3) show a displacement distribution and an electric charge distribution of a piezoelectric transformer of the seventh embodiment according to the present invention, respectively.

FIG. 18(1) is a side view of a piezoelectric transformer having the 3λ/2 longitudinal extensional vibration mode according to the seventh embodiment of the present invention. The piezoelectric transformer 440 includes a rectangular plate 442 made of a piezoelectric material. Primary (input) electrodes are formed on two main surfaces of the rectangular plate 442 perpendicular to the thickness direction thereof. The primary electrode consisting of electrodes 443, 445 and 447 is formed on one of the main surfaces and the primary electrode consisting of electrodes 444, 446 and 448 is formed on the other main surface. Each center line of the electrodes 443 and 444 substantially coincides with the center line of the rectangular plate 442. The electrodes 443 and 444, the electrodes 445 and 446, and the electrodes 447 and 448 are formed to be opposed each other in the thickness direction of the rectangular plate 442, respectively. On the two end faces of the rectangular plate 442 in the longitudinal direction thereof, electrodes 456 and 457 are formed as secondary (output) electrodes, respectively. The electrodes 443, 444, 445, 446, 447, 448, 456 and 457 are made of metal such as silver, nickel or gold and formed by a method such as evaporation, sputtering, printing or plating.

In this embodiment, as shown in FIG. 18(1), the length ($L_1$) of each of the electrodes 443 and 444 is a third of the length (L) of the rectangular plate 442 ($L_1$=L/3) in the longitudinal direction of the rectangular plate 442. In addition, the electrodes 445 and 446 and the electrodes 447 and 448 are formed symmetrically with respect to the center of the rectangular plate 442 in the longitudinal direction thereof, respectively. If the length of each of the electrodes 445 and 446 is $L_2$ and that of each of the electrodes 447 and 448 is $L_3$, the relationship of $L_2$=$L_3$ is satisfied.

Further, in FIG. 18(1), arrows indicated on the rectangular plate 442 show polarization directions, respectively if the rectangular plate 442 is made of a piezoelectric ceramic such as lead zirconate titanate (PZT), and show the directions of c axis orientations, respectively if the rectangular plate 442 is made of piezoelectric crystals. If the rectangular plate 442 is made of a piezoelectric ceramic, the region of the rectangular plate 442 between the electrodes 443 and 444, that between the electrodes 445 and 446 and that between the electrodes 447 and 448 are polarized in the thickness direction of the rectangular plate 442. The polarization directions are different between the region of the rectangular plate 442 between the electrodes 443 and 444, and the regions thereof between the electrodes 445 and 446 and between the electrodes 447 and 448 in the thickness direction thereof. Further, the region of the rectangular plate 442 between the electrodes 445 and 446 and the electrode 456, and that between the electrodes 447 and 448 and the electrode 457 are respectively polarized in the longitudinal direction of the rectangular plate 442, and the polarization directions of the regions differ in the length direction of the rectangular plate 442. Polarization treatments are performed by applying appropriate high direct current voltages to the respective regions.

The operation of the piezoelectric transformer 440 will next be described. In FIG. 18(1), the electrodes 443, 445 and 447 serving as the primary electrodes are electrically connected to one another and connected to a terminal A. The electrodes 444, 446 and 448 serving as the other primary electrodes are electrically connected to one another and connected, as common electrodes, to terminals B and D. Further, the electrodes 456 and 457 serving as the secondary electrodes are electrically to each other and connected to a terminal C. If an alternating voltage (input voltage) having a frequency near a resonance frequency for generating mechanical vibrations to expand and contract the rectangular plate 442 in the longitudinal direction thereof is applied between the terminals A and B, the mechanical vibrations to expand and contract the rectangular plate 442 in the longitudinal direction thereof are excited on the piezoelectric transformer 440. The excited mechanical vibrations are converted to a voltage by the piezoelectric effect, and a high voltage can be thereby fetched between the terminals C and D as an output voltage in accordance with the impedance ratio between the primary and secondary electrodes.

FIG. 18(2) shows the displacement distribution of the piezoelectric transformer 440 in the longitudinal direction thereof at a certain point of time while extensional vibrations of the 3/2 wavelength are generated on the piezoelectric transformer 440 in the longitudinal direction thereof. In FIG. 18(2), the horizontal axis indicates the position in the piezoelectric transformer 440 in the longitudinal direction thereof, and the vertical axis indicates the displacement of the piezoelectric transformer 440 caused by the mechanical vibration thereof at a certain instance. On the vertical axis, + direction indicates the right displacement of the piezoelectric transformer 440 in the longitudinal direction thereof and −direction indicates the left displacement of the piezoelectric transformer 440 in the longitudinal direction thereof. Further, FIG. 18(3) shows the electric charge distribution induced by vibration when the piezoelectric transformer 440 has the displacement distribution shown in FIG. 18(2). In FIG. 18(3), the horizontal axis indicates the position in the piezoelectric transformer 440 in the longitudinal direction thereof, and the vertical axis indicates the positive/negative polarity and quantity of the electric charges induced by the vibration.

Figure 19:
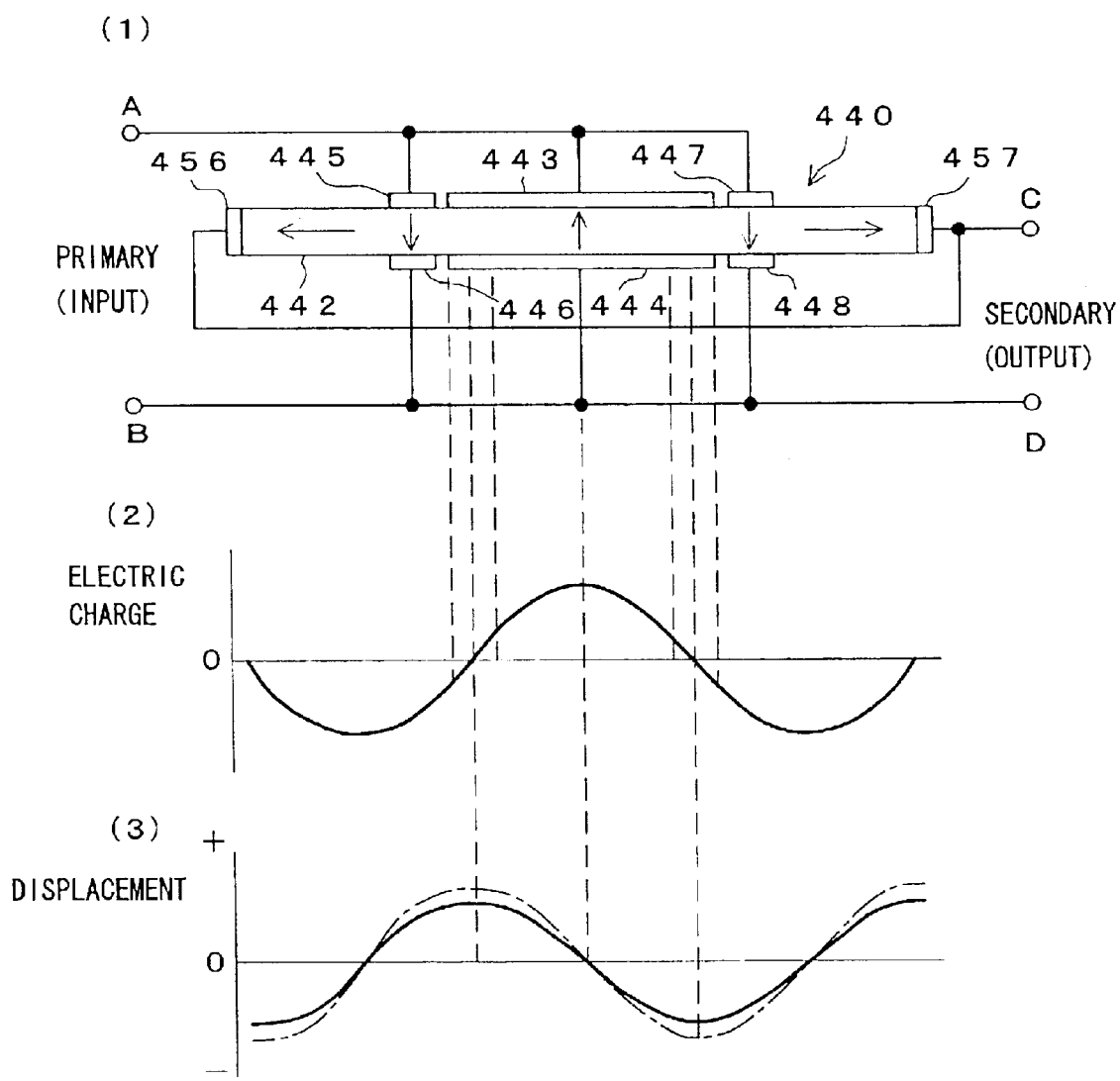
FIG. 19(1) is a side view of another example of the piezoelectric transformer of the seventh embodiment according to the present invention, and FIGS. 19(2) and 19(3) show an electric charge distribution and a displacement distribution of another example of the piezoelectric transformer in the seventh embodiment according to the present invention, respectively.

In the piezoelectric transformer 440, the vibrations of the 3/2 wavelength are excited in the longitudinal direction of the rectangular plate 442. Thus, if each length of the electrodes 443 and 444 serving as components of the primary electrodes in the central portion of the rectangular plate 442 is set too large, driving efficiency deteriorates. FIG. 19(1) is a side view of the piezoelectric transformer 440 if each length of the electrodes 443 and 444 is larger than a third of the length of the rectangular plate 442. FIG. 19(2) shows the electric charge distribution induced by the vibration. In FIG. 19(2), the horizontal axis indicates the position in the piezoelectric transformer 440 in the longitudinal direction thereof and the vertical axis indicates the positive/negative polarity and quantity of the electric charges induced by the vibration. FIG. 19(3) shows the displacement distribution of the piezoelectric transformer 440 in the longitudinal direction thereof caused by the mechanical vibration excited in the piezoelectric transformer 440 when the electric charge distribution shown in FIG. 19(2) is induced. In FIG. 19(3), the horizontal axis indicates the position in the piezoelectric transformer 440 in the longitudinal direction thereof, and the vertical axis indicates the displacement of the piezoelectric transformer 440 in the longitudinal direction thereof caused by the mechanical vibration. On the vertical axis, +direction indicates the right displacement of the piezoelectric transformer 440 in the longitudinal direction thereof and −direction indicates the left displacement of the piezoelectric transformer 440 in the longitudinal direction thereof. In this case, each length of the electrodes 443 and 444 exceed the point at which the polarity of induced electric charges change. Thus, as shown in FIG. 19(2), the electric charges occurred in the secondary electrode-side portions of region of the rectangular plate 442 interposed between the electrodes 443 and 444 are opposite in polarity to those occurred in the central portion of region of the rectangular plate 442, whereby the electric charges cancel one another. As shown in FIG. 19(3), the displacement of the piezoelectric transformer 440 caused by the vibration is decreased relative to the cancellation quantities of the electric charges induced by exciting the vibration.

On the other hand, as shown in FIG. 18(1), if each length of the electrodes 443 and 444 is set not more than a third of the length of the rectangular plate 442, only the electric charges equal in polarity are generated between the electrodes 443 and 444 as shown in FIG. 18(3). That is, the displacement of the piezoelectric transformer 440 with the primary electrodes as shown in FIG. 18(1) is not smaller than that of the piezoelectric transformer 440 with the primary electrodes as shown in FIG. 19(1) if the same power is input to the primary electrodes in two cases. As a result, the piezoelectric transformer 440 shown in FIG. 18(1) is higher in driving efficiency than that shown in FIG. 19(1).

Further, the electrodes 443 and 444 in the central portion of the primary electrodes are positioned so that the polarity of the electric charges induced in the region of the rectangular plate 442 between those electrodes is opposite to them of the electric charges induced in the regions between the electrodes 445 and 446 and between the electrodes 447 and 448 when the 3/2 wavelength extensional vibration mode is excited in: the longitudinal direction of the rectangular plate 442. In addition, the polarization direction of the rectangular plate 442 between the electrodes 443 and 444 differs from those between the electrodes 445 and 446 and between the electrodes 447 and 448 in the thickness direction of the rectangular plate 442. Therefore, the area of the primary electrodes can be equivalently set large. Consequently, it is possible to make the effective electromechanical coupling factor $k_{eff}$ of the piezoelectric transformer when an input voltage is applied to the primary electrodes higher that of the conventional piezoelectric transformer and to make the power which the piezoelectric transformer can handle per unit volume higher than the conventional piezoelectric transformer.

Furthermore, in the piezoelectric transformer 440 in this embodiment, by setting each length of electrodes 445, 446, 447 and 448 equal, it is possible to set the impedances of the primary electrodes symmetrically with respect to the center of the rectangular plate 442. Thus, it is possible to make the capacitances and impedances of the electrodes 456 and 457 serving as the secondary electrodes equal to each other. In this case, if loads such as cold cathode fluorescent lamps are connected to the terminals C and D, the loads are provided on the electrodes 456 and 457 serving as the two secondary electrodes at the same proportion, making it possible to stably drive the piezoelectric transformer and to suppress the deterioration of the driving efficiency of the piezoelectric transformer.

In FIG. 18, the case has been described where the polarization direction between the electrodes 443 and 444 serving as the components of the primary electrodes of the rectangular plate 442 differs from those between the electrodes 445 and 446 serving as the components of the primary electrodes and between the electrodes 447 and 448 serving as the components of the primary electrodes in the thickness direction of the rectangular plate 442. However, even if the polarization directions between the electrodes 443 and 444, between the electrodes 445 and 446 and between the electrodes 447 and 448 are equal, the same advantages as those described in this embodiment can be attained by electrically connecting the electrodes 443, 446 and 448 to one another and electrically connecting the electrodes 444, 445 and 447 to one another to thereby constitute the primary electrodes. In addition, the polarization directions near the secondary electrodes are not limited to those shown in FIG. 18. As long as those polarization directions differ in the longitudinal direction of the rectangular plate 440, the same advantages as those described above can be attained.

Moreover, in FIG. 18(1), a case where the electrodes 444, 446 and 448 serving as the primary electrodes are common electrodes has been described. However, even if the electrodes 443, 445 and 447 serving as the other primary electrodes are common electrodes, the same advantages as those described above can be attained.

The structure of the piezoelectric transformer in this embodiment can be applied to the piezoelectric transformer wherein primary electrodes have the multilayer structures consisting of piezoelectric layers and electrode layers by setting the lengths of the electrodes formed in the central portions of the two main surfaces of the rectangular plate perpendicular to the thickness direction thereof for the primary electrodes and the internal electrodes interposed between the two electrodes of the electrodes in the thickness direction of the rectangular plate not more than a third of the length of the rectangular plate, and setting the electrodes adjacent to the electrodes formed in the central portions in the longitudinal direction of the rectangular plate symmetrically with respect to the center of the rectangular plate in the longitudinal direction thereof. Consequently, even if the structure of the piezoelectric transformer in this embodiment is applied to the piezoelectric transformers in the third and fourth embodiments according to the present invention, it is possible to attain the same advantages as those in this embodiment while holding the advantages of the piezoelectric transformers in the respective embodiments.

Additionally, the electrodes of the primary electrodes on and in the rectangular plate suffers if each length of the electrodes in the central portion of the rectangular plate is not more than a third of length of the rectangular plate and if the electrodes adjacent the electrodes in the central portions in the longitudinal direction of the rectangular plate are symmetric with respect to the center of the rectangular plate in the longitudinal direction thereof. Thus, the shapes of the primary electrodes are not limited to specific ones. Consequently, even if the structure of the piezoelectric transformer in this embodiment is applied to the piezoelectric transformers in the fifth and sixth embodiments according to the present invention, it is possible to attain the same advantages as those in this embodiment while holding the advantages of the piezoelectric transformers in the respective embodiments.

Eighth Embodiment

Figure 20:
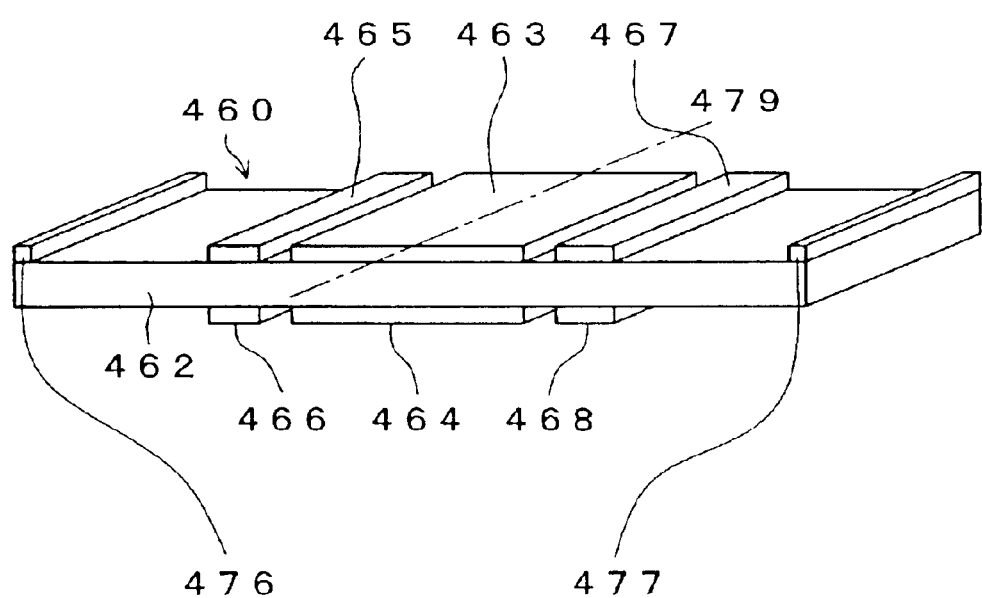
FIG. 20 is a perspective view of a piezoelectric transformer of the eighth embodiment according to the present invention.

FIG. 20 is a perspective view of a piezoelectric transformer having the $3\lambda/2$ longitudinal extensional vibration mode according to the eighth embodiment of the present invention. In FIG. 20, the piezoelectric transformer 460 includes a rectangular plate 462 made of a piezoelectric material. Primary (input) electrodes are formed on two main surfaces of the rectangular plate 462 perpendicular to the thickness direction thereof. The primary electrodes consisting of electrodes 463, 465 and 467 are formed on one of the main surfaces, and the primary electrodes consisting of electrodes 464, 466 and 468 are formed on the other main surface. Each center line of the electrodes 463 and 464 substantially coincides with the center line 479 of the rectangular plate 462. The electrodes 463 and 464, the electrodes 465 and 466, and the electrodes 467 and 468 are formed to be opposed to each other in the thickness direction of the rectangular plate 462, respectively.

In this embodiment, secondary (output) electrodes are formed, as electrodes 476 and 477, on one of the two main surfaces of the rectangular plate 462 perpendicular to the thickness direction thereof near the two end faces of the rectangular plate 462 in the longitudinal direction thereof. The electrodes 463, 464, 465, 466, 467, 468, 476 and 477 are made of metal such as silver, nickel or gold and formed by a method such as evaporation, sputtering, printing or plating.

In the piezoelectric transformer 480 in this embodiment, the secondary electrodes are formed on the same plane as one of planes where the primary electrodes are formed. Thus, it is possible to form the primary electrodes and the secondary electrodes in two steps when manufacturing the piezoelectric transformer. That is, by forming the secondary electrodes and the primary electrode on the same plane, it is possible to decrease the number of manufacturing steps and to reduce manufacturing time.

In FIG. 20, the secondary electrodes are formed on the same surface as that on which the primary electrodes including the electrode 463 are formed. However, even if the secondary electrodes are formed on the same surface as that on which the primary electrodes including the electrode 464 are formed, the same advantages as those described above can be attained.

The structure of the secondary electrodes in this embodiment can be applied to the piezoelectric transformers in the preceding embodiments by forming the secondary electrodes on the same plane as one of planes where the primary electrodes are formed. In that case, it is possible to attain the same advantages as those in this embodiment while holding the advantages of the piezoelectric transformers in the respective embodiments.

Ninth Embodiment

Figure 21:
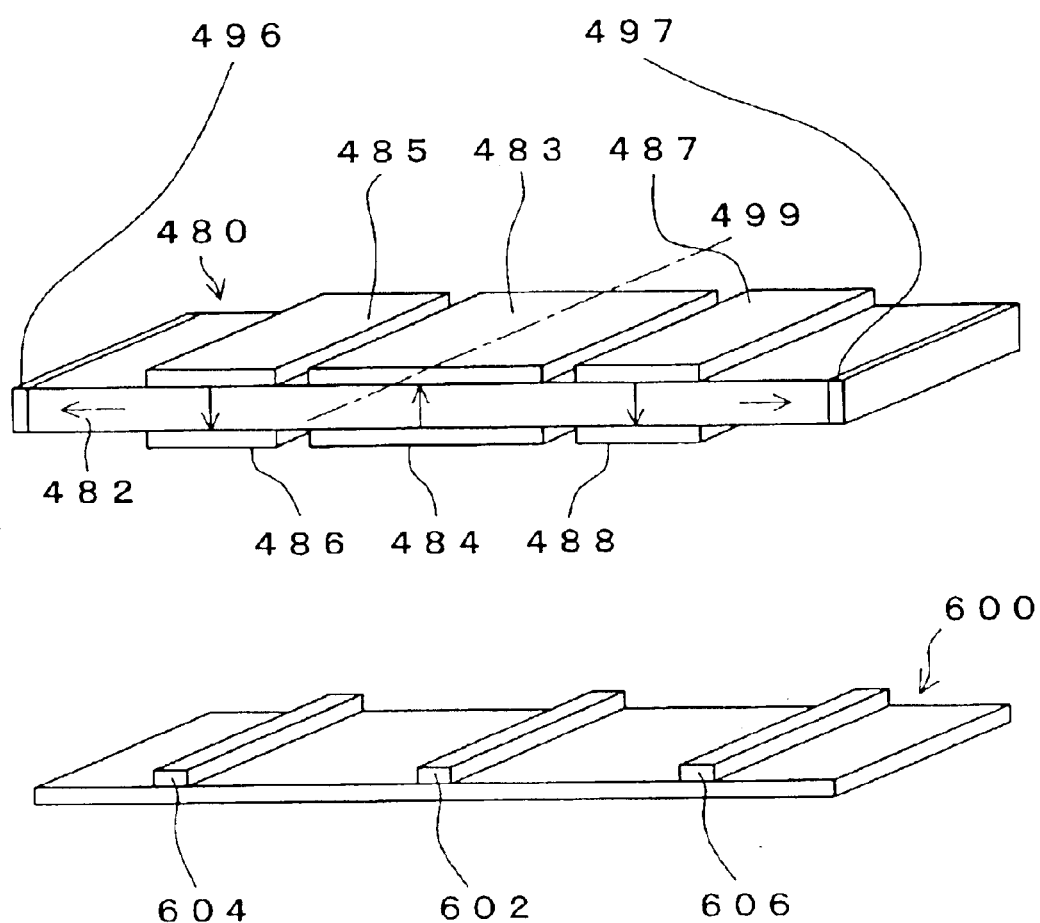
FIG. 21 is a perspective view of a piezoelectric transformer of the ninth embodiment according to the present invention.

FIG. 21 is a perspective view of a piezoelectric transformer having the $3\lambda/2$ longitudinal extensional vibration mode according to the ninth embodiment of the present invention. In FIG. 21, the piezoelectric transformer 480 includes a rectangular plate 482 made of a piezoelectric material. Primary (input) electrodes are formed on two main surfaces of the rectangular plate 482 perpendicular to the thickness direction thereof. The primary electrodes consisting of electrodes 483, 485 and 487 are formed on one of the main surfaces, and the primary electrodes consisting of electrodes 484, 486 and 488 are formed on the other main surface. Each center line of the electrodes 483 and 484 substantially coincides with the center line 499 of the rectangular plate 482. The electrodes 483 and 484, the electrodes 485 and 486, and the electrodes 487 and 488 are formed to be opposed each other in the thickness direction of the rectangular plate 482, respectively. Electrodes 496 and 497 are formed, as secondary (output) electrodes, on the two end faces of the rectangular plate 482 in the longitudinal direction thereof. The electrodes 483, 484, 485, 486, 487, 488, 496 and 497 are made of metal such as silver, nickel or gold and formed by a method such as evaporation, sputtering, printing or plating.

Further, in this embodiment, a supporter 600 which supports the piezoelectric transformer 480 is provided. This supporter 600 has support sections 602, 604 and 606 on one main surface thereof.

Figure 22:
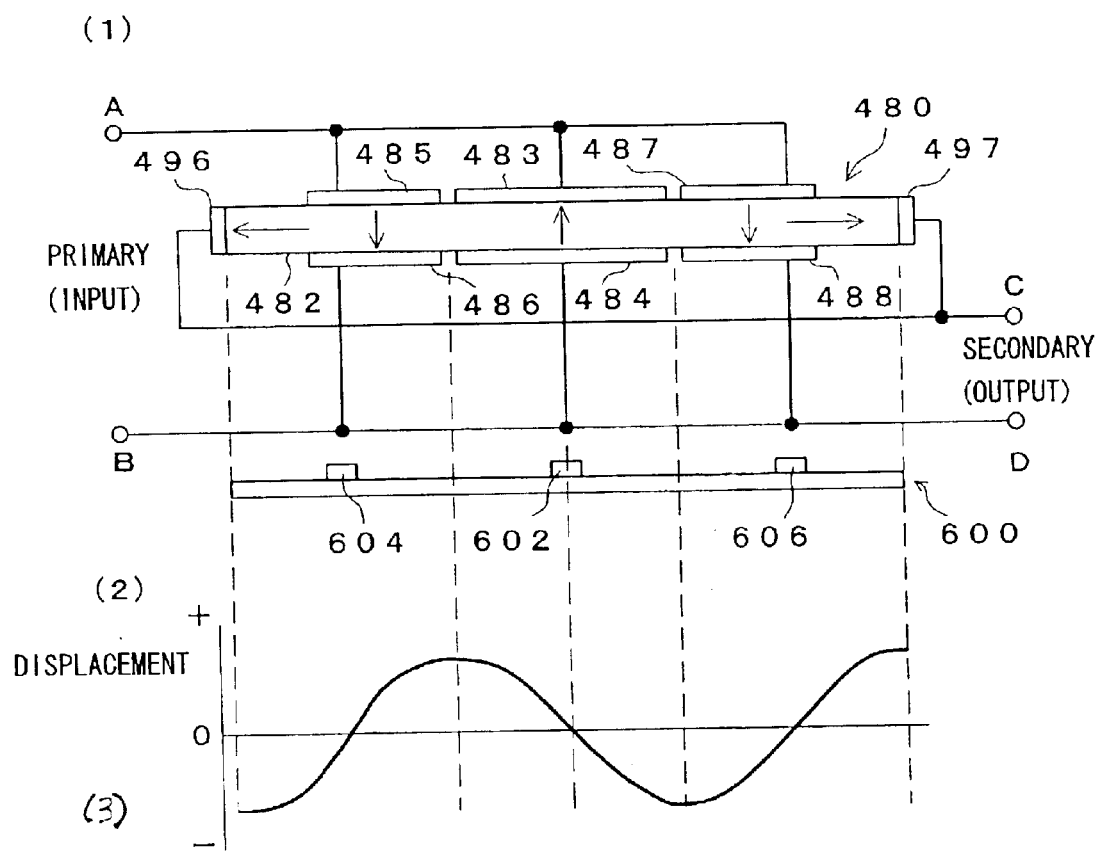
FIG. 22(1) is a side view of of the piezoelectric transformer of FIG. 21, and FIGS. 22(2) and 22(3) show a displacement distribution and an electric charge distribution of the piezoelectric transformer of FIG. 21, respectively.

FIG. 22(1) is a side view of the piezoelectric transformer 480 and the support 600 in this embodiment. In FIG. 22(1), for example, the rectangular plate 482 is polarized in directions indicated by arrows, the electrodes 483, 485 and 487 serving as the primary electrodes are electrically connected to one another and connected to a terminal A, and the electrodes 484, 486 and 488 serving as the other primary electrodes are electrically connected to one another and connected, as common electrodes, to terminals B and D. Further, the electrodes 496 and 497 serving as the secondary electrodes are electrically connected to each other and connected to a terminal C. If an alternating voltage (input voltage) having a frequency near a resonance frequency for generating mechanical vibrations to expand and contract the rectangular plate 482 in the longitudinal direction thereof is applied between the terminals A and B, the mechanical vibrations to expand and contract the rectangular plate 482 in the longitudinal direction thereof are excited on the piezoelectric transformer 480.

FIG. 22(2) shows the displacement distribution of the piezoelectric transformer 480 in the longitudinal direction thereof at a certain point of time while extensional vibrations of the 3/2 wavelength are generated in the piezoelectric transformer 480 in the longitudinal direction thereof. In FIG. 22(2), the horizontal axis indicates the position in the piezoelectric transformer 480 in the longitudinal direction thereof, and the vertical axis indicates the displacement of the piezoelectric transformer 480 in the longitudinal direction thereof caused by the mechanical vibration thereof at a certain instance. On the vertical axis, +direction indicates the right displacement of the piezoelectric transformer 480 in the longitudinal direction thereof and −direction indicates the left displacement of the piezoelectric transformer 480 in the longitudinal direction thereof.

In this embodiment, the three support sections established on the supporter 600 support the piezoelectric transformer 480 on the nodes of the $3\lambda/2$ longitudinal extensional vibration mode excited in the rectangular plate 480, respectively, as shown in FIG. 22 (1). Thus, the supporter 600 can support and fix the piezoelectric transformer without obstructing the vibrations. In addition, if the three support sections are set to be electrically conductive to one another, it is possible to connect the support sections to the primary electrodes of the piezoelectric transformer and to supply power to the primary electrodes.

The advantages of this embodiment cannot be necessarily attained only when the polarization directions are as shown in FIG. 22(1). The polarization directions of the rectangular plate 482 in the thickness direction may be equal. In that case, if the electrodes 483, 486 and 488 are electrically connected to one another to constitute the primary electrodes, the electrodes 484, 485 and 487 are electrically connected to one another to constitute the other primary electrodes, the same advantages as those in this embodiment can be attained.

The structure as described in this embodiment can be applied to the piezoelectric transformers in all the preceding embodiments as long as the piezoelectric transformer can be supported on the vibration nodes and the support sections can be contacted with the primary electrodes. In that case, it is possible to attain the same advantages as those in this embodiment while holding the advantages of the piezoelectric transformers in the respective embodiments.

Tenth Embodiment

Figure 23:
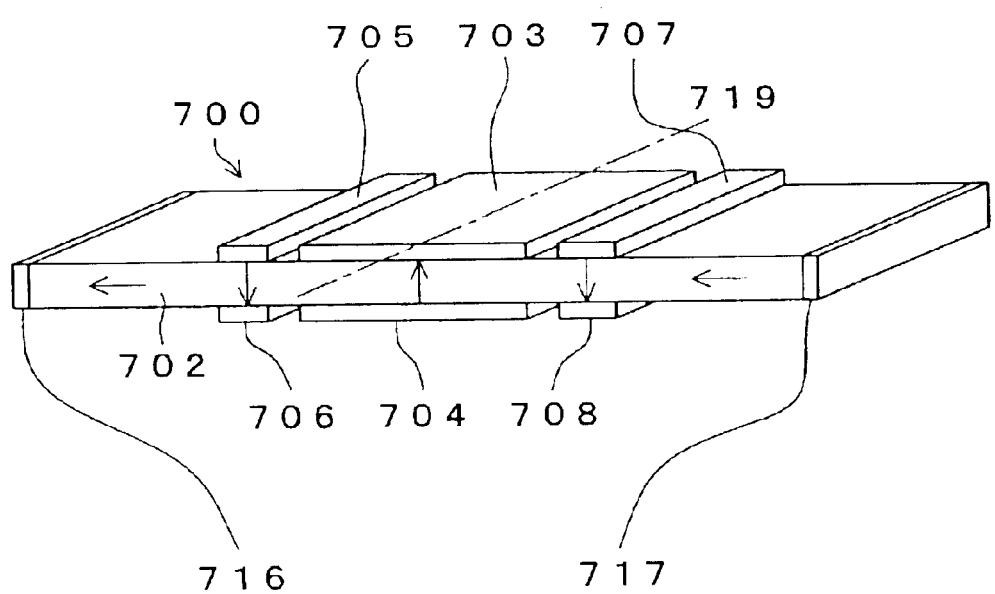
FIG. 23 is a perspective view of a piezoelectric transformer of the tenth embodiment according to the present invention.
Figure 24:
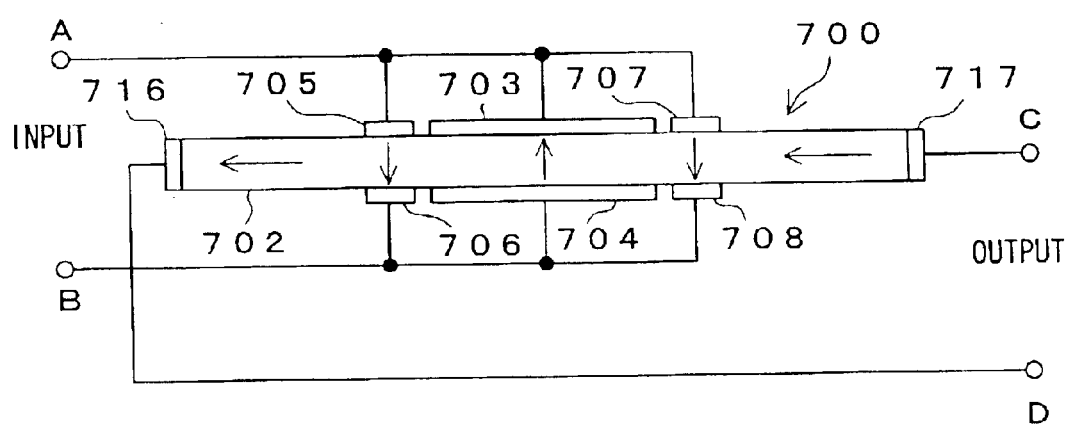
FIG. 24 is a side view of the piezoelectric transformer of FIG. 23.
Figure 25:
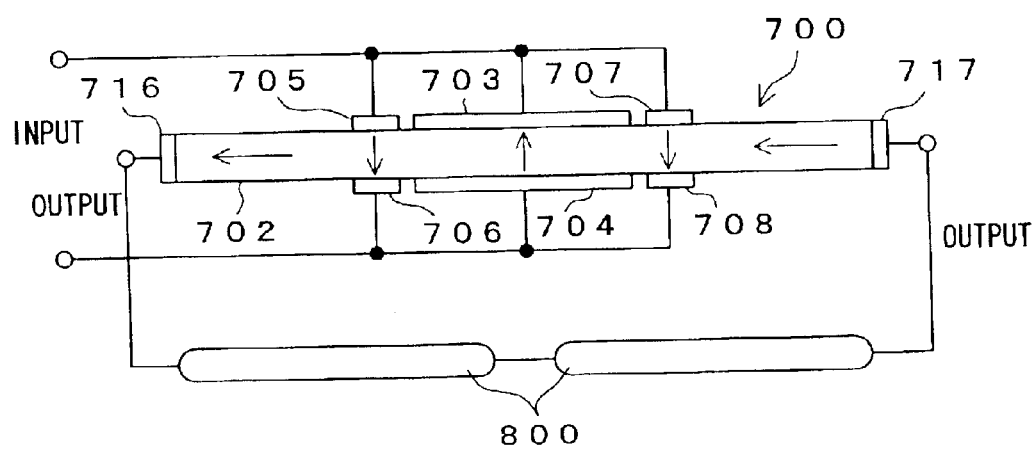
FIG. 25 is a side view of the piezoelectric transformer of the tenth embodiment according to the present invention, which is connected to a cold cathode fluorescent lamp.
Figure 26:
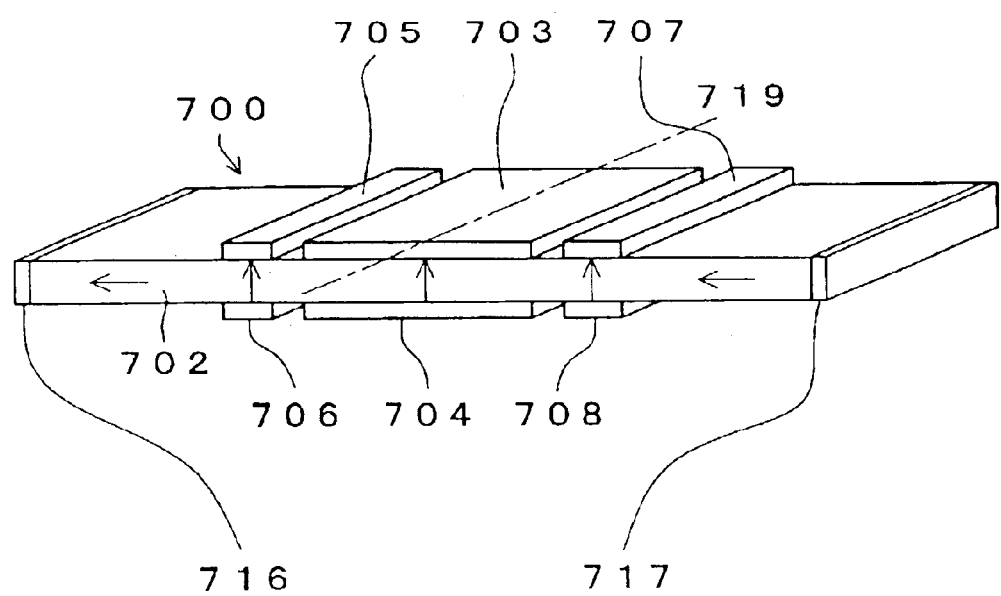
FIG. 26 is a perspective view of another example of the piezoelectric transformer of the tenth embodiment according to the present invention.
Figure 27:
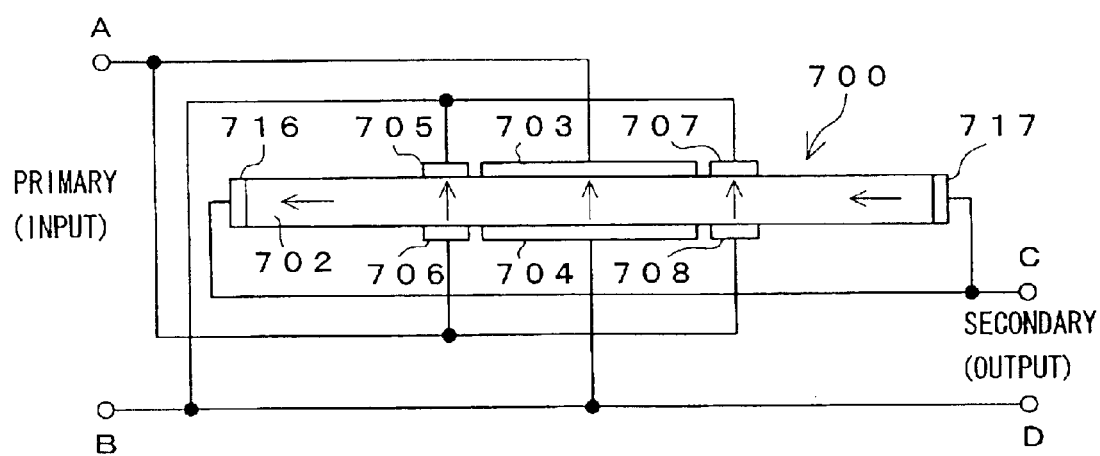
FIG. 27 is a side view of the piezoelectric transformer of FIG. 26.

FIG. 23 is a perspective view of a piezoelectric transformer having the 3λ/2 longitudinal extensional vibration mode according to the tenth embodiment of the present invention. FIG. 24 is a side view of the piezoelectric transformer shown in FIG. 23. FIG. 25 shows the piezoelectric transformer shown in FIG. 23 if cold cathode fluorescent lamps are connected to the secondary electrodes of the piezoelectric transformer. FIG. 26 is a perspective view of another example of the piezoelectric transformer according to the tenth embodiment of the present invention. FIG. 27 is a side view of the piezoelectric transformer shown in FIG. 26.

In FIGS. 23 to 27, the piezoelectric transformer 700 includes a rectangular plate 702 made of a piezoelectric material. Primary (input) electrodes are formed on two main surfaces of the rectangular plate 702 perpendicular to the thickness direction thereof. The primary electrodes consisting of electrodes 703, 705 and 707 is formed on one of the main surfaces, and the primary electrodes consisting of electrodes 704, 706 and 708 is formed on the other main surface. Each center line of the electrodes 703 and 704 substantially coincides with the center line 719 of the rectangular plate 702. The electrodes 703 and 704, the electrodes 705 and 706, and the electrodes 707 and 708 are formed to be opposed each other in the thickness direction of the rectangular plate 702, respectively. Electrodes 716 and 717 are formed, as secondary (output) electrodes, on the two end faces of the rectangular plate 702 in the longitudinal direction thereof. The electrodes 703, 704, 705, 706, 707, 708, 716 and 717 are made of metal such as silver, nickel or gold and formed by a method such as evaporation, sputtering, printing or plating.

Further, in FIGS. 23 to 27, arrows indicated on the rectangular plate 702 show the directions polarized in advance, respectively if the rectangular plate 702 is made of a piezoelectric ceramic such as lead zirconate titanate (PZT), and show the directions of c axis orientations, respectively if the rectangular plate 702 is made of piezoelectric crystals. In FIGS. 23 to 27, if the rectangular plate 702 is made of a piezoelectric ceramic, the region of rectangular plate 702 between the electrodes 703 and 704, that between the electrodes 705 and 706 and that between the electrodes 707 and 708 are polarized in the thickness direction of the rectangular plate 702. In FIGS. 23 to 25, as for the electrodes constituting primary electrodes, the polarization direction between the electrodes 703 and 704 differs from those between the electrodes 705 and 706 and between the electrodes 707 and 708 in the thickness direction of the rectangular plate 702. By contrast, in FIGS. 26 and 27, the polarization directions between the electrodes 703 and 704, between the electrodes 705 and 706 and between the electrodes 707 and 708 are equal in the thickness direction of the rectangular plate 702.

In the piezoelectric transformer 700 in this embodiment, the region of the rectangular plate 702 between the electrodes 705 and 706 and the electrode 716, that between the electrodes 707 and 708 and the electrode 717 are polarized in the longitudinal direction thereof, and the polarization directions of the regions are equal in the longitudinal direction of the rectangular plate 702.

The operation of the piezoelectric transformer 700 will next be described. FIG. 24 is a side view of the piezoelectric transformer shown in FIG. 23. In FIG. 24, the electrodes 703, 705 and 707 serving as the primary electrodes are electrically connected to one another and connected to a terminal A. The electrodes 704, 706 and 708 serving as the other primary electrodes are electrically connected to one another and connected, as common electrodes, to terminals B. Further, the electrode 716 serving as the secondary electrode is: electrically connected to a terminal D. And the electrode 717 serving as the secondary electrode is electrically connected to a terminal C. If an alternating voltage (input voltage) having a frequency near a resonance frequency for generating mechanical vibrations to expand and contract the rectangular plate 702 in the longitudinal direction thereof is applied between the terminals A and B, the mechanical vibrations to expand and contract the rectangular plate 702 in the longitudinal direction thereof are excited on the piezoelectric transformer 700. Thus, the excited mechanical vibrations are converted to a voltage by the piezoelectric effect, and a high voltage can be thereby fetched between the terminals C and D as an output voltage in accordance with the impedance ratio between the primary and secondary electrodes.

In the piezoelectric transformer 700 in this embodiment, the polarization directions near the secondary electrodes are set equal in the longitudinal direction of the rectangular plate 702. Therefore, if the polarization rates in portions of the rectangular plate 702 near the secondary electrodes are equal, and impedance of the one secondary electrode is equal to that of the other, output voltages from the electrodes 716 and 717 serving as the secondary electrodes are equal in amplitude and different by 180 degrees in phase.

Accordingly, if a load is connected between the terminals C and D, which are the output terminals of the piezoelectric transformer 700, the mechanical burden exerted on the piezoelectric transformer 700 is the same as that on the piezoelectric transformer such as the piezoelectric transformer 200 according to the first embodiment of the present invention, in which the polarization directions of the rectangular plate near the secondary electrodes are set different in the longitudinal thereof and the secondary electrodes are electrically connected to each other, while power supplied to the connected load is equal in two embodiments. The amplitude of the output voltage from each of the two secondary electrodes of the piezoelectric transformer 700 is reduced by half and that of the output current from each of them is doubled, compared with the amplitude of output voltage and output current from each of them of the piezoelectric transformer 200.

As shown in FIG. 25, for example, if two cold cathode fluorescent lamps 800 are connected in series to the secondary electrodes, the phases of the output voltages of the electrodes 716 and 717 differ by 180 degrees and the amplitudes of the output voltages are respectively $V_{out}/2$ if the potential difference between the end of one cold cathode fluorescent lamp and the end of the other cold cathode fluorescent lamp, which are connected to the secondary electrodes, is $V_{out}$. Thus, it is possible to set the withstand voltage levels of, for example, wiring, terminals involved the connection between the secondary electrodes of the piezoelectric transformer 700 and the cold cathode fluorescent lamps to be low. It is also possible to arrange high voltage wiring more proximate to the other parts relative to the reduction of the amplitudes of the output voltages of the secondary electrodes, because the dielectric breakdown is prevented which occurs according to the distance between the high voltage wiring and the other parts.

In FIGS. 23 to 25, a case where the polarization direction in the region of the rectangular plate 702 interposed between the electrodes 703 and 704, which are components of the primary electrodes of the piezoelectric transformer 700, differs from those in regions thereof interposed between the electrodes which are the other components of the primary electrodes in the thickness direction of the rectangular plate 702, has been described. However, even if the polarization directions between the electrodes constituting the primary electrodes of the piezoelectric transformer 700 are all equal in the thickness direction of the rectangular plate 702 as shown in FIGS. 26 and 27, the same advantages as those described above can be attained by electrically connecting the electrodes 703, 706 and 708 to one another and electrically connecting the electrodes 704, 705 and 707 to one another. Further, the polarization directions near the secondary electrodes of the piezoelectric transformer 700 are not limited to those shown in FIGS. 23 to 27. As long as the polarization directions near the secondary electrodes are equal in the longitudinal direction of the rectangular plate, the same advantages as those in this embodiment can be attained even if the polarization directions are opposite to those in the piezoelectric transformer 700.

By setting the polarization directions near the secondary electrodes equal in the longitudinal direction of the rectangular plate, the piezoelectric transformer in this embodiment can output voltages equal in amplitude and different by 180 degrees in phase from the two secondary electrodes. In that case, it is possible to attain the same advantages as those in this embodiment while holing the advantages of the piezoelectric transformers in the respective embodiments.

Eleventh Embodiment

Figure 28:
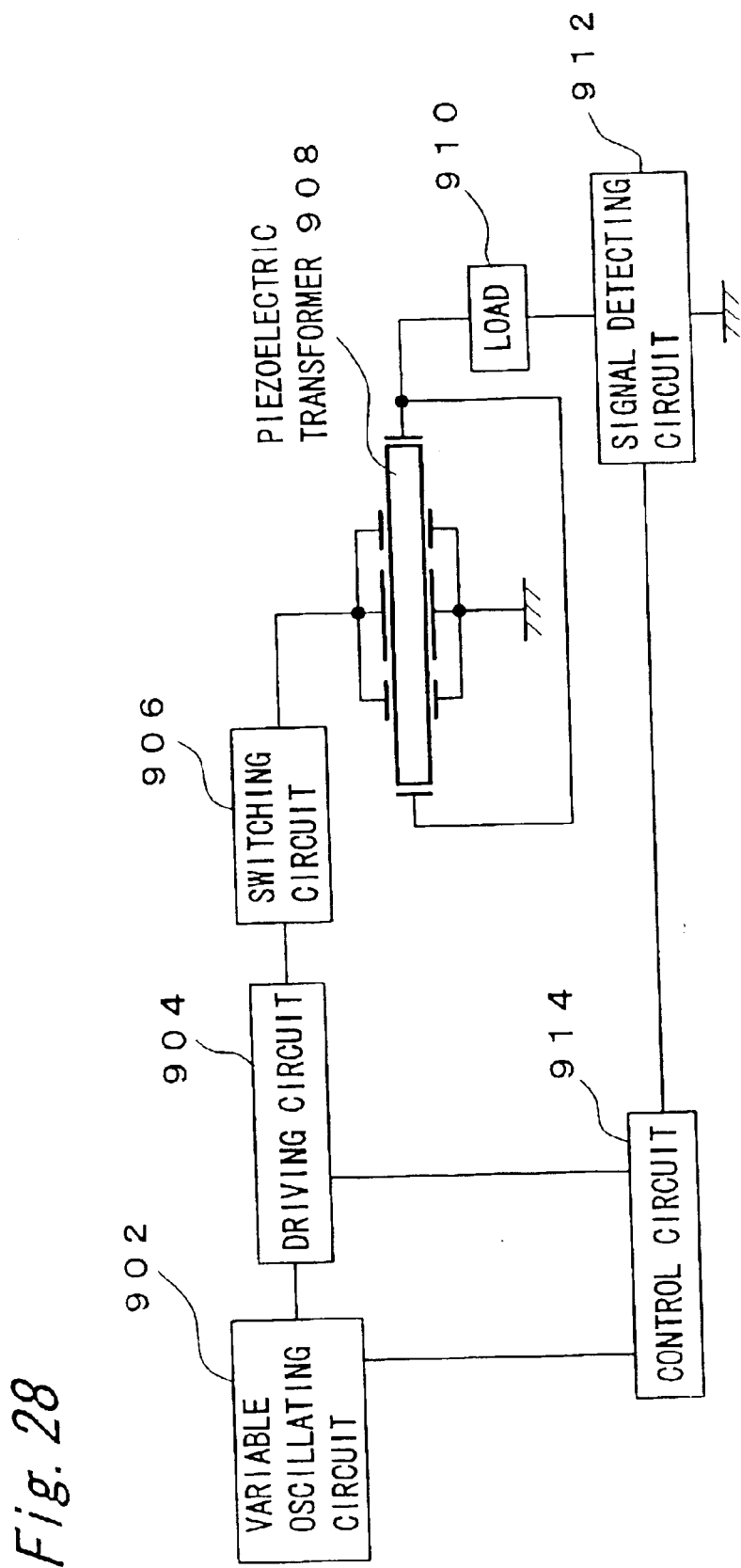
FIG. 28 is a block diagram showing the configuration of a step-up circuit which employs the piezoelectric transformer according to the present invention.

FIG. 28 is a block diagram showing one example of the configuration of a step-up circuit which employs the piezoelectric transformer according to the present invention. The step-up circuit consists of a variable oscillating circuit 902, a driving circuit 904, a switching circuit 906, a piezoelectric transformer 908, a load 910, a signal detecting circuit 912, and a control circuit 914. The variable oscillating circuit 902 generates a frequency signal, and the driving circuit 904 and the switching circuit 906 generate a driving signal for driving the piezoelectric transformer 908. The control circuit 914 controls the piezoelectric transformer 908 through the variable oscillating circuit 902 and the driving circuit 904 in accordance with the signal detected by the signal detecting circuit 912 so that the piezoelectric transformer 908 can be stably driven in accordance with the change of voltages applied to load 910 connected to the secondary (output) electrodes of the piezoelectric transformer 908.

If the piezoelectric transformer is used in a step-up inverter circuit, it is possible to realize a step-up circuit higher in circuit efficiency than the step-up circuit which employs a conventional electromagnetic transformer. This is because the piezoelectric transformer is higher in driving efficiency than the conventional electromagnetic transformer. In addition, the volume of the piezoelectric transformer can be made smaller because the piezoelectric transformer can handle a larger amount of electrical energy per unit volume than the conventional electromagnetic transformer. Further, the shape of the piezoelectric transformer is advantageous to making the liquid crystal display panel thin because the piezoelectric transformer uses vibrations in the longitudinal direction of the rectangular plate. Besides, the maximum value of the internal stresses or strains of the piezoelectric transformer according to the present invention is smaller than that of the conventional piezoelectric transformer of the same shape using the $\lambda/2$ longitudinal extensional vibration mode or $\lambda$ longitudinal extensional vibration mode, because the piezoelectric transformer according to the present invention uses the $3\lambda/2$ longitudinal extensional vibration mode. Thus, the piezoelectric transformer according to the present invention can handle higher power.

Twelfth Embodiment

Figure 29:
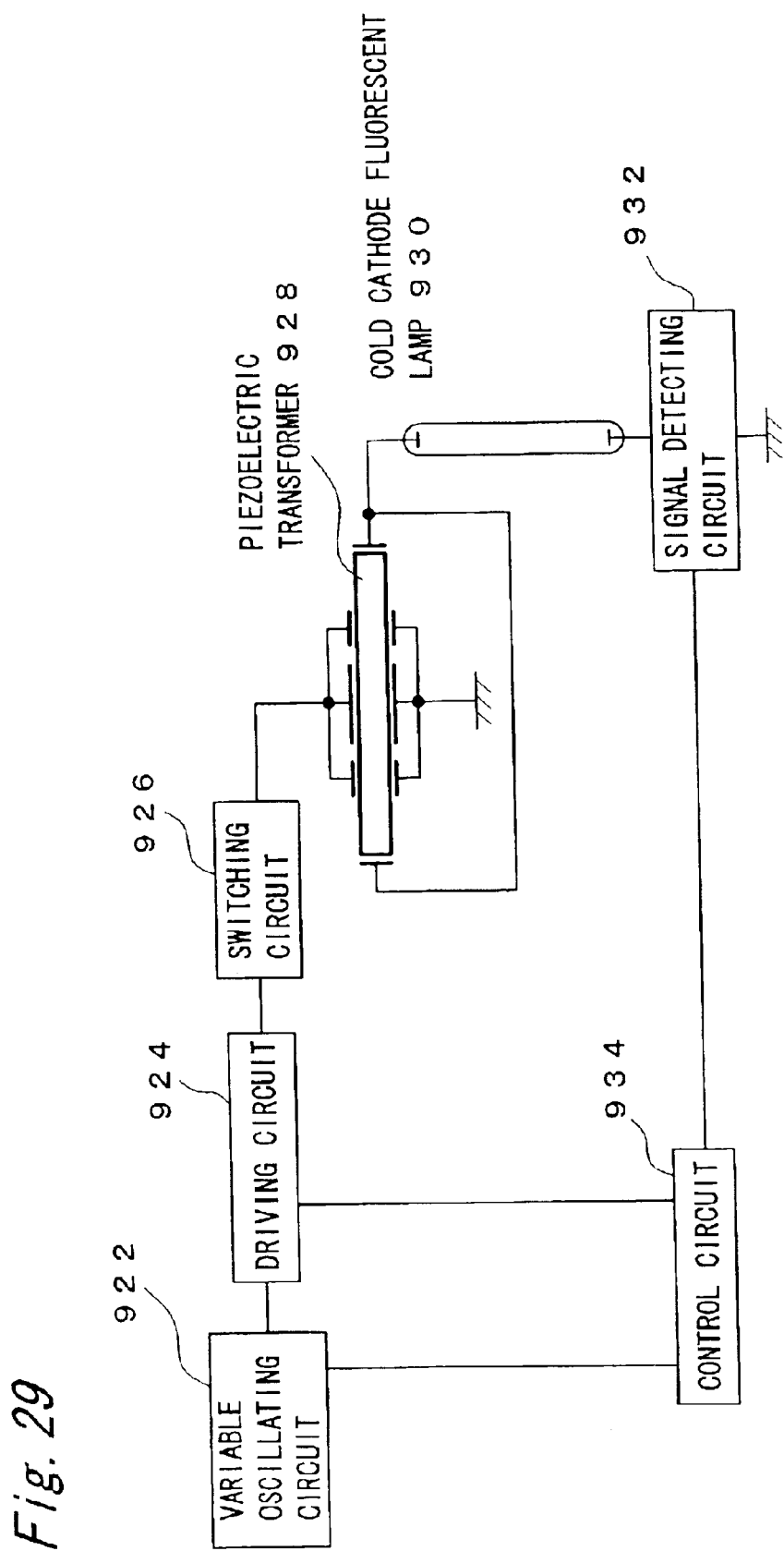
FIG. 29 is a block diagram showing the configuration of a light emitting apparatus using a cold cathode fluorescent lamp which employs the piezoelectric transformer according to the present invention.

FIG. 29 is a block diagram showing one example of the configuration of a light emitting apparatus using a cold cathode fluorescent lamp which employs the piezoelectric transformer according to the present invention. The light emitting apparatus using the cold cathode fluorescent lamp consists of a variable oscillating circuit 922, a driving circuit 924, a switching circuit 926, a piezoelectric transformer 928, a cold cathode fluorescent lamp 930, a signal detecting circuit 932, and a control circuit 934. The variable oscillating circuit 922 generates a frequency signal, and the driving circuit 924 and the switching circuit 926 generate a driving signal for driving the piezoelectric transformer 928. The control circuit 934 controls the piezoelectric transformer 928 through the variable oscillating circuit 922 and the driving circuit 924 in accordance with the signal detected by the signal detecting circuit 932 so that the piezoelectric transformer 928 can be stably driven in accordance with a change in current flowing in the cold cathode fluorescent lamp 930 connected to the secondary (output) electrodes of the piezoelectric transformer 928.

Thirteenth Embodiment

Figure 30:
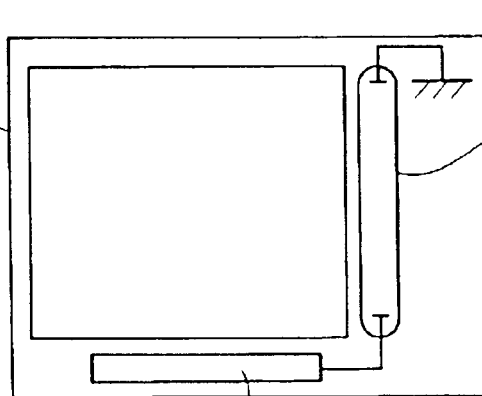
FIG. 30 is a view of a liquid crystal display panel which employs the light emitting apparatus using the cold cathode fluorescent lamp of FIG. 29.
Figure 31:
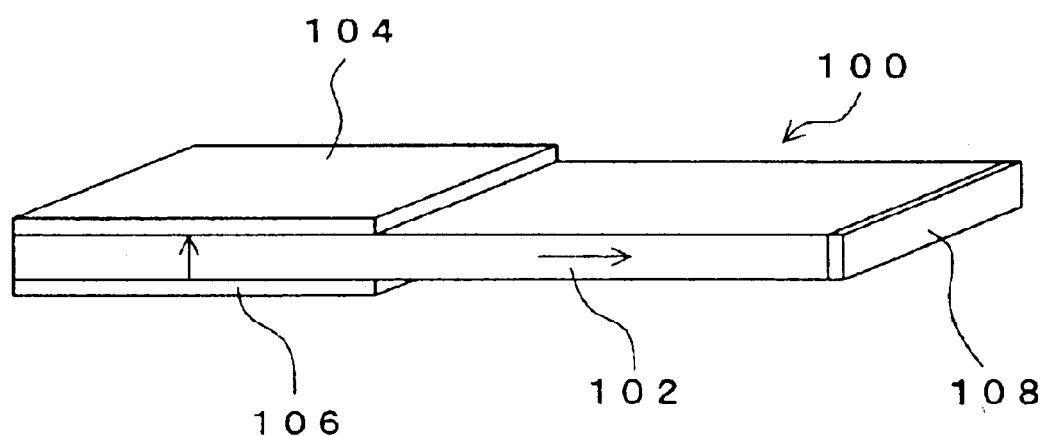
FIG. 31 is a perspective view of a conventional piezoelectric transformer having a λ/2 longitudinal extensional vibration mode with one output electrode.

FIG. 30 is a typical view of a liquid crystal display panel into which the light emitting apparatus using the cold cathode fluorescent lamp shown in FIG. 29 is installed. The liquid crystal display panel 940 can employ a light emitting apparatus using the cold cathode fluorescent lamp, which is consisted of an inverter circuit 942 using the piezoelectric transformer and a cold cathode fluorescent lamp 944, as a light emitting apparatus for a liquid crystal display panel.

The conventional electromagnetic transformer is required to constantly output a high voltage at the start of lightening the cold cathode fluorescent lamp. However, the output voltages of the piezoelectric transformer according to the present invention changes in accordance with the load change at the time of start of lightening the cold cathode fluorescent lamp and during lightening the lamp. Thus, by using the piezoelectric transformer according to the present invention, other circuit systems included in the liquid crystal display or a liquid crystal monitor are less adversely influenced. Further, the output voltage from the piezoelectric transformer to the cold cathode fluorescent lamp has fewer unnecessary frequency components which do not contribute to the lightening of the cold cathode fluorescent lamp because the output voltage is almost in the form of a sine wave.

Furthermore, the volume of the piezoelectric transformer can be made smaller because the piezoelectric transformer can handle a larger amount of electrical energy per unit volume than the electromagnetic transformer. In addition, the shape of the piezoelectric transformer is advantageous to making the liquid crystal display panel thin because the piezoelectric transformer uses vibrations in the longitudinal direction of the rectangular plate. Therefore, the light emitting apparatus using the cold cathode fluorescent lamp light can be installed in a narrow location such as the edge of the liquid crystal display or the liquid crystal monitor. Besides, the maximum value of the internal stresses or strains of the piezoelectric transformer according to the present invention is smaller than that of the conventional piezoelectric transformer of the same shape using the $\lambda/2$ longitudinal extensional vibration mode or $\lambda$ longitudinal extensional vibration mode, because the piezoelectric transformer according to the present invention uses the $3\lambda/2$ longitudinal extensional vibration mode. Thus, the piezoelectric transformer according to the present invention can handle higher power.

The present invention has been described in detail so far while referring to the preferred embodiments. However, it will be obvious to those skilled in the art that the present invention is not limited to the embodiments but many preferred modifications and changes can be made within the technical scope of the present invention defined by the claims which follow.

What is claimed is:

1. A piezoelectric transformer comprising:

a rectangular plate made of a piezoelectric material; and primary electrodes and secondary electrodes each formed on said rectangular plate;

wherein said rectangular plate comprises a plurality of piezoelectric layers layered successively in a thickness direction of said rectangular plate;

said primary electrodes are provided by layering said plurality of piezoelectric layers and a plurality of electrode layers in the thickness direction of said rectangular plate, said plurality of electrode layers comprising electrodes to provide a plurality of groups of electrodes in the longitudinal direction of said rectangular plate;

said plurality of groups of electrodes comprise a first group of electrodes formed in a central portion in the longitudinal direction of said rectangular plate, and a second group of electrodes and a third group of electrodes formed adjacent to said first group of electrodes and on one side and on the other side of said first group of electrodes in the longitudinal direction of said rectangular plate, respectively;

said first, second and third groups of electrodes are formed symmetrically with respect to a center line perpendicular to the longitudinal direction of said rectangular plate and dividing said rectangular plate in half in the longitudinal direction of said rectangular plate; and said secondary electrodes are formed near the two ends of the rectangular plate in the longitudinal direction of said rectangular plate;

whereby a voltage is output from said secondary electrodes when an alternating voltage is applied to said primary electrodes to excite mechanical vibrations of a 3/2 wavelength to expand and contract said rectangular plate in a longitudinal direction thereof in said rectangular plate.

2. A piezoelectric transformer comprising:

a rectangular plate made of a piezoelectric material; and primary electrodes and secondary electrodes each formed on said rectangular plate;

wherein said rectangular plate comprises a plurality of piezoelectric layers layered successively in a thickness direction of said rectangular plate;

said primary electrodes are provided by layering said plurality of piezoelectric layers and a plurality of electrode layers in the thickness direction of said rectangular plate, said plurality of electrode layers comprising electrodes to provide a plurality of groups of electrodes in the longitudinal direction of said rectangular plate;

said plurality of groups of electrodes comprise a first group of electrodes formed in a central portion in the longitudinal direction of said rectangular plate, and a second group of electrodes and a third group of electrodes formed adjacent to said first group of electrodes and on one side and on the other side of said first group of electrodes in the longitudinal direction of said rectangular plate, respectively;

said first, second and third groups of electrodes are formed symmetrically with respect to a center line perpendicular to the longitudinal direction of said rectangular plate and dividing said rectangular plate in half in the longitudinal direction of said rectangular plate;

an area of each electrode of said second and third groups of electrodes is smaller than an area of each electrode of said first group of electrodes; and said secondary electrodes are formed near the two ends of the rectangular plate in the longitudinal direction of said rectangular plate;

whereby a voltage is output from said secondary electrodes when an alternating voltage is applied to said primary electrodes to excite mechanical vibrations of a 3/2 wavelength to expand and contract said rectangular plate in a longitudinal direction thereof in said rectangular plate.

3. A piezoelectric transformer comprising:

a rectangular plate made of a piezoelectric material; and primary electrodes and secondary electrodes each formed on said rectangular plate;

wherein said rectangular plate comprises a plurality of piezoelectric layers layered successively in a thickness direction of said rectangular plate;

said primary electrodes are provided by layering said plurality of piezoelectric layers and a plurality of electrode layers in the thickness direction of said rectangular plate, said plurality of electrode layers comprising electrodes to provide a plurality of groups of electrodes in the longitudinal direction of said rectangular plate;

said plurality of groups of electrodes comprise a first group of electrodes formed in a central portion in the longitudinal direction of said rectangular plate, and a second group of electrodes and a third group of electrodes formed adjacent to said first group of electrodes and on one side and on the other side of said first group of electrodes in the longitudinal direction of said rectangular plate, respectively;

said first, second and third groups of electrodes are formed symmetrically with respect to a center line perpendicular to the longitudinal direction of said rectangular plate and dividing said rectangular plate in half in the longitudinal direction of said rectangular plate;

a length of each electrode of said second and third groups of electrodes is equal to that of each electrode of said first group of electrodes in the width direction of said rectangular plate;

a length of each electrode of said second and third groups of electrodes is not less than 10% and shorter than 100% of the length of each electrode of said first group of electrodes in the longitudinal direction of said rectangular plate; and said secondary electrodes are formed near the two ends of the rectangular plate in the longitudinal direction of said rectangular plate;

whereby a voltage is output from said secondary electrodes when an alternating voltage is applied to said primary electrodes to excite mechanical vibrations of a 3/2 wavelength to expand and contract said rectangular plate in a longitudinal direction thereof in said rectangular plate.

4. A device comprising;

a piezoelectric transformer including
  a rectangular plate made of a piezoelectric material; and
  primary electrodes and secondary electrodes each formed on said rectangular plate; and a supporter to fix said piezoelectric transformer at mechanical vibration nodes of said piezoelectric transformer and to be made of an electrically conductive material contacting with said primary electrodes;

wherein said rectangular plate comprises a plurality of piezoelectric layers layered successively in a thickness direction of said rectangular plate;

said primary electrodes are provided by layering said plurality of piezoelectric layers and a plurality of electrode layers in the thickness direction of said rectangular plate, said plurality of electrode layers comprising electrodes to provide a plurality of groups of electrodes in the longitudinal direction of said rectangular plate; and said secondary electrodes are formed near the two ends of the rectangular plate in the longitudinal direction of said rectangular plate;

whereby a voltage is output from said secondary electrodes when an alternating voltage is applied to said primary electrodes to excite mechanical vibrations of a 3/2 wavelength to expand and contract said rectangular plate in a longitudinal direction thereof in said rectangular plate.

5. A step-up circuit comprising:

a piezoelectric transformer; and an input circuit supplying an alternating voltage to said piezoelectric transformer;

wherein said piezoelectric transformer comprises:
  a rectangular plate made of a piezoelectric material; and
  primary electrodes to which said alternating voltage is applied and secondary electrodes each formed on said rectangular plate;

wherein said rectangular plate comprises a plurality of piezoelectric layers layered successively in a thickness direction of said rectangular plate;
  said primary electrodes are provided by layering said plurality of piezoelectric layers and a plurality of electrode layers in the thickness direction of said rectangular plate, said plurality of electrode layers comprising electrodes to provide a plurality of groups of electrodes in the longitudinal direction of said rectangular plate;
  said plurality of groups of electrodes comprise a first group of electrodes formed in a central portion in the longitudinal direction of said rectangular plate, and a second group of electrodes and a third group of electrodes formed adjacent to said first group of electrodes and on one side and on the other side of said first group of electrodes in the longitudinal direction of said rectangular plate, respectively; and
  said secondary electrodes are formed near the two ends of the rectangular plate in the longitudinal direction of said rectangular plate;
  wherein a voltage is output from said secondary electrodes when said alternating voltage is applied to said primary electrodes to excite mechanical vibrations of a 3/2 wavelength to expand and contract said rectangular plate in a longitudinal direction thereof in said rectangular plate; and a phase of said alternating voltage applied to said first group of electrodes differs by 180 degrees from those of said alternating voltages applied to said second and third groups of electrodes.

6. A light emitting apparatus including a cold cathode fluorescent lamp comprising;

a piezoelectric transformer;

an input circuit supplying an alternating voltage to said piezoelectric transformer; and a cold cathode fluorescent lamp driven by an output voltage of piezoelectric transformer;

wherein said piezoelectric transformer comprises:
  a rectangular plate made of a piezoelectric material; and
  primary electrodes to which said alternating voltage is applied and secondary electrodes each formed on said rectangular plate;

wherein said rectangular plate comprises a plurality of piezoelectric layers layered successively in a thickness direction of said rectangular plate;
  said primary electrodes are provided by layering said plurality of piezoelectric layers and a plurality of electrode layers in the thickness direction of said rectangular plate, said plurality of electrode layers comprising electrodes to provide a plurality of groups of electrodes in the longitudinal direction of said rectangular plate;
  said plurality of groups of electrodes comprise a first group of electrodes formed in a central portion in the longitudinal direction of said rectangular plate, and a second group of electrodes and a third group of electrodes formed adjacent to said first group of electrodes and on one side and on the other side of said first group of electrodes in the longitudinal direction of said rectangular plate, respectively; and
  said secondary electrodes are formed near the two ends of the rectangular plate in the longitudinal direction of said rectangular plate;

wherein said output voltage is output from said secondary electrodes when said alternating voltage is applied to said primary electrodes to excite mechanical vibrations of a 3/2 wavelength to expand and contract said rectangular plate in a longitudinal direction thereof in said rectangular plate; and a phase of said alternating voltage applied to said first group of electrodes differs by 180 degrees from those of said alternating voltages applied to said second and third groups of electrodes.

* * * * *